US012652845B2

(12) United States Patent
     Chen et al.

(10) Patent No.:    US 12,652,845 B2
(45) Date of Patent:        Jun. 9, 2026

(54) SEMICONDUCTOR STRUCTURES WITH REDUCED PARASITIC CAPACITANCE AND METHODS FOR FORMING THE SAME

(71) Applicant: Taiwan Semiconductor Manufacturing Company, Ltd., Hsin-Chu (TW)

(72) Inventors: Szu-Hua Chen, Tainan City (TW); Cheng-Ming Lin, Kaohsuing City (TW); Wei-Xiang You, Kaohsuing City (TW); Wei-De Ho, Hsinchu City (TW); Wei-Yen Woon, Taoyuan City (TW); Szuya Liao, Zhubei Hsinchu (TW)

(73) Assignee: TAIWAN SEMICONDUCTOR MANUFACTURING COMPANY, LTD., Hsinchu (TW)

( * ) Notice:   Subject to any disclaimer, the term of this patent is extended or adjusted under 35 U.S.C. 154(b) by 435 days.

(21) Appl. No.: 18/177,409

(22) Filed:      Mar. 2, 2023

(65)            Prior Publication Data

US 2023/0402528 A1      Dec. 14, 2023

Related U.S. Application Data

(60) Provisional application No. 63/420,389, filed on Oct. 28, 2022, provisional application No. 63/390,530, (Continued)

(51) Int. Cl.
     *H10D 64/01*       (2025.01)
     *H10D 30/01*       (2025.01)
     (Continued)

(52) U.S. Cl.
     CPC ......... *H10D 64/017* (2025.01); *H10D 30/014* (2025.01); *H10D 30/024* (2025.01); (Continued)

(58) Field of Classification Search
     None
     See application file for complete search history.

(56)                References Cited

U.S. PATENT DOCUMENTS

2019/0006485 A1*   1/2019   Kim ..................... H10D 64/015
2020/0321253 A1    10/2020  Kao
                    (Continued)

FOREIGN PATENT DOCUMENTS

TW       201926686 A     7/2019
TW       202025310 A     7/2020
                    (Continued)

OTHER PUBLICATIONS

Raj, R et al 2001, 'Oxidation Kinetics of an Amorphous Silicon Carbonitride Ceramic', Journal of American Ceramic Society, 84 [8], pp. 1803-1810.*

*Primary Examiner* — Feifei Yeung Lopez
(74) *Attorney, Agent, or Firm* — HAYNES AND BOONE, LLP

(57)            ABSTRACT

Semiconductor structures and methods of forming the same are provided. In an embodiment, an exemplary method includes forming a dummy gate stack engaging a semiconductor fin over a substrate, conformally depositing a first dielectric layer over the substrate, conformally depositing a second dielectric layer over the first dielectric layer, etching back the first dielectric layer and the second dielectric layer to form a gate spacer extending along a sidewall surface of the dummy gate stack, the gate spacer comprising the first dielectric layer and the second dielectric layer, forming source/drain features in and over the semiconductor fin and adjacent the dummy gate stack, and replacing the dummy gate stack with a gate structure, where a dielectric constant of the first dielectric layer is less than a dielectric constant (Continued)

200 of silicon oxide, and the second dielectric layer is less easily to be oxidized than the first dielectric layer.

20 Claims, 44 Drawing Sheets

Related U.S. Application Data filed on Jul. 19, 2022, provisional application No. 63/351,239, filed on Jun. 10, 2022.

(51) Int. Cl.

| | | |
|---|---|---|
| *H10D 30/43* | (2025.01) | |
| *H10D 30/62* | (2025.01) | |
| *H10D 30/67* | (2025.01) | |
| *H10D 62/10* | (2025.01) | |
| *H10D 84/01* | (2025.01) | |
| *H10D 84/03* | (2025.01) | |
| *H10D 84/85* | (2025.01) | |

(52) U.S. Cl.

CPC ......... *H10D 30/43* (2025.01); *H10D 30/6211* (2025.01); *H10D 30/6735* (2025.01); *H10D 30/6757* (2025.01); *H10D 62/121* (2025.01); *H10D 64/021* (2025.01); *H10D 84/0167* (2025.01); *H10D 84/017* (2025.01); *H10D 84/0188* (2025.01); *H10D 84/0193* (2025.01); *H10D 84/038* (2025.01); *H10D 84/853* (2025.01)

(56) References Cited

U.S. PATENT DOCUMENTS

| | | |
|---|---|---|
| 2021/0057546 A1 | 2/2021 | Lin |
| 2021/0111265 A1 | 4/2021 | Yen-Ting |
| 2021/0366907 A1 | 11/2021 | Liao et al. |
| 2022/0037528 A1 | 2/2022 | Chuang et al. |
| 2022/0052185 A1 | 2/2022 | Zhou |
| 2022/0122971 A1 | 4/2022 | Peng et al. |
| 2022/0165730 A1 | 5/2022 | Chen et al. |
| 2022/0216340 A1 | 7/2022 | Lin et al. |
| 2022/0285510 A1 | 9/2022 | Chen et al. |

FOREIGN PATENT DOCUMENTS

| | | |
|---|---|---|
| TW | 202115794 A | 4/2021 |
| TW | 202145348 A | 12/2021 |
| TW | 202205519 A | 2/2022 |
| TW | 202217976 A | 5/2022 |

* cited by examiner

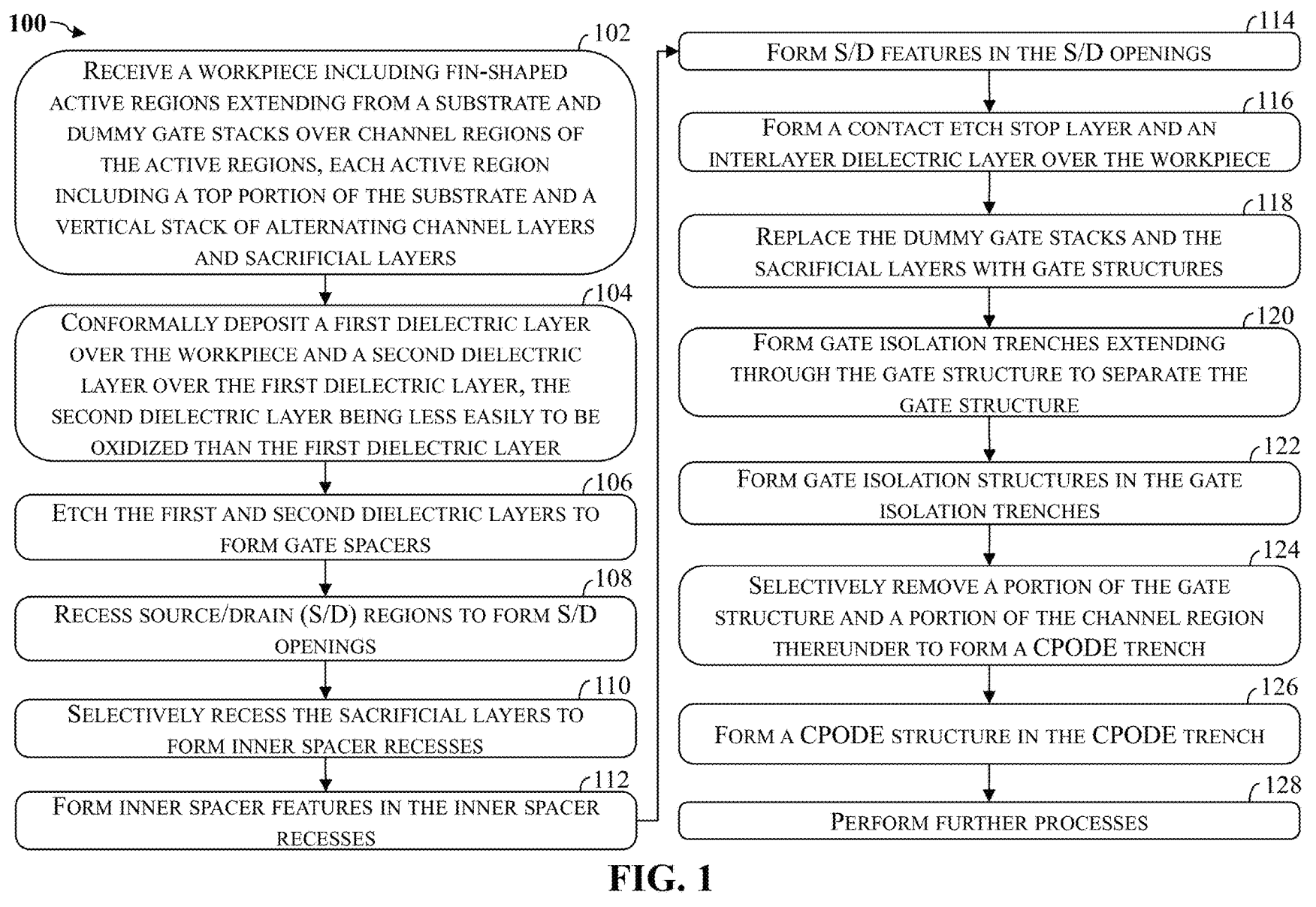

100

102 — RECEIVE A WORKPIECE INCLUDING FIN-SHAPED ACTIVE REGIONS EXTENDING FROM A SUBSTRATE AND DUMMY GATE STACKS OVER CHANNEL REGIONS OF THE ACTIVE REGIONS, EACH ACTIVE REGION INCLUDING A TOP PORTION OF THE SUBSTRATE AND A VERTICAL STACK OF ALTERNATING CHANNEL LAYERS AND SACRIFICIAL LAYERS

104 — CONFORMALLY DEPOSIT A FIRST DIELECTRIC LAYER OVER THE WORKPIECE AND A SECOND DIELECTRIC LAYER OVER THE FIRST DIELECTRIC LAYER, THE SECOND DIELECTRIC LAYER BEING LESS EASILY TO BE OXIDIZED THAN THE FIRST DIELECTRIC LAYER

106 — ETCH THE FIRST AND SECOND DIELECTRIC LAYERS TO FORM GATE SPACERS

108 — RECESS SOURCE/DRAIN (S/D) REGIONS TO FORM S/D OPENINGS

110 — SELECTIVELY RECESS THE SACRIFICIAL LAYERS TO FORM INNER SPACER RECESSES

112 — FORM INNER SPACER FEATURES IN THE INNER SPACER RECESSES

114 — FORM S/D FEATURES IN THE S/D OPENINGS

116 — FORM A CONTACT ETCH STOP LAYER AND AN INTERLAYER DIELECTRIC LAYER OVER THE WORKPIECE

118 — REPLACE THE DUMMY GATE STACKS AND THE SACRIFICIAL LAYERS WITH GATE STRUCTURES

120 — FORM GATE ISOLATION TRENCHES EXTENDING THROUGH THE GATE STRUCTURE TO SEPARATE THE GATE STRUCTURE

122 — FORM GATE ISOLATION STRUCTURES IN THE GATE ISOLATION TRENCHES

124 — SELECTIVELY REMOVE A PORTION OF THE GATE STRUCTURE AND A PORTION OF THE CHANNEL REGION THEREUNDER TO FORM A CPODE TRENCH

126 — FORM A CPODE STRUCTURE IN THE CPODE TRENCH

128 — PERFORM FURTHER PROCESSES

FIG. 1

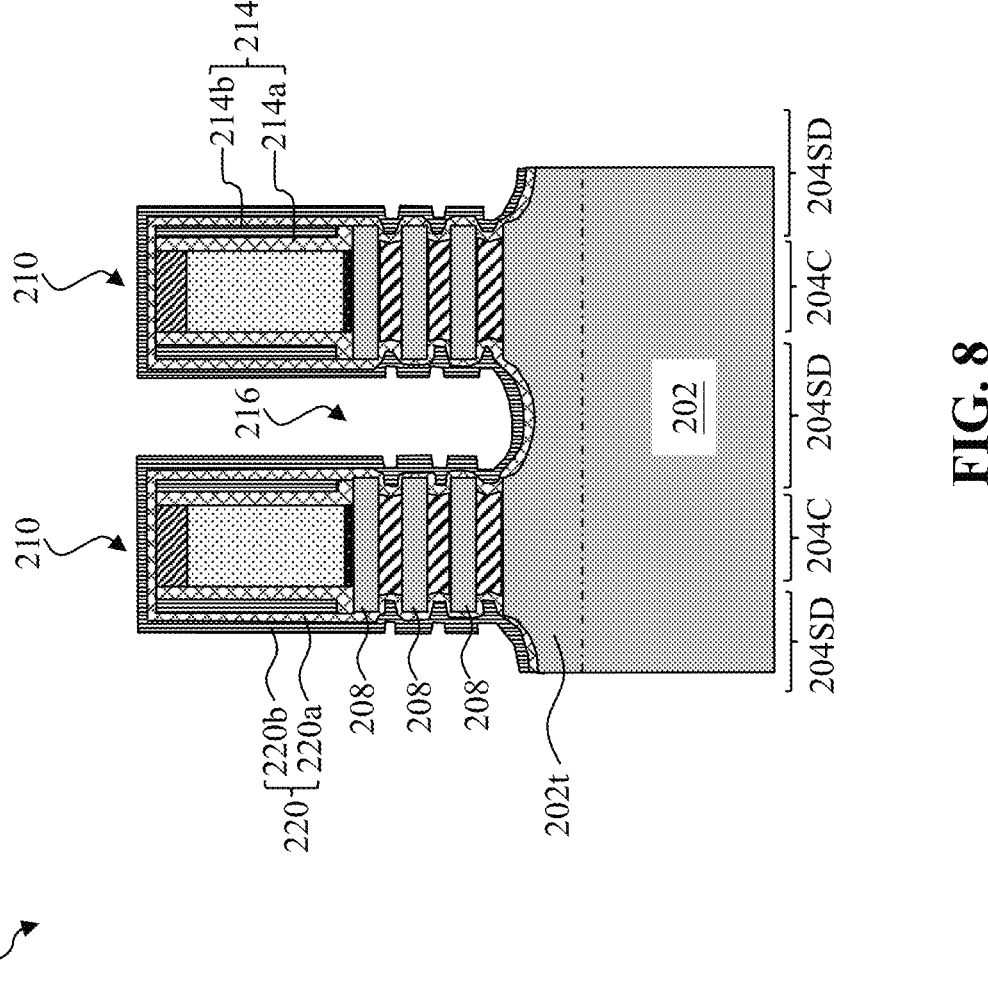
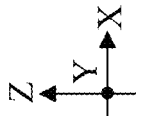
FIG. 8

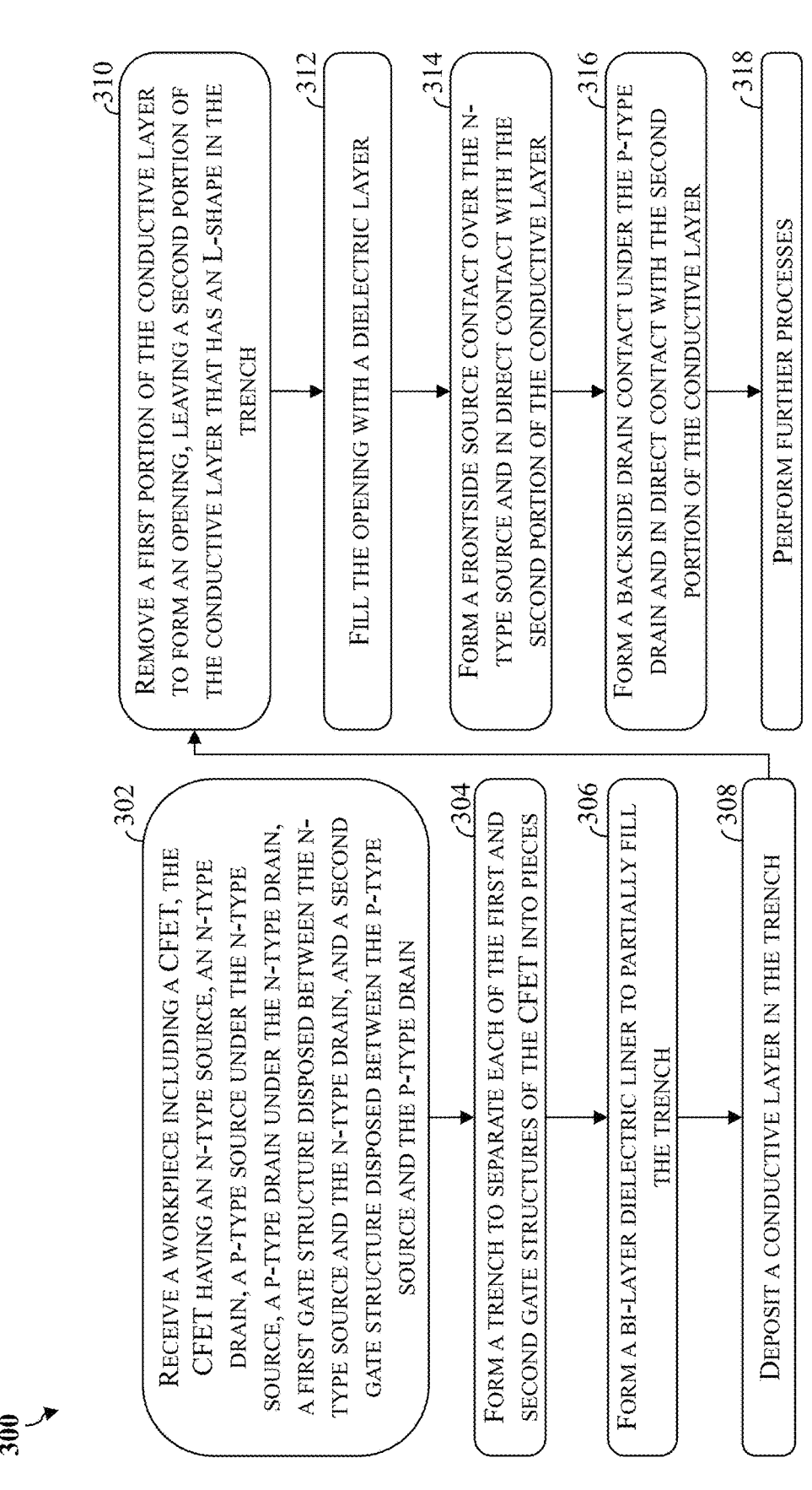

300

310 REMOVE A FIRST PORTION OF THE CONDUCTIVE LAYER TO FORM AN OPENING, LEAVING A SECOND PORTION OF THE CONDUCTIVE LAYER THAT HAS AN L-SHAPE IN THE TRENCH

312 FILL THE OPENING WITH A DIELECTRIC LAYER

314 FORM A FRONTSIDE SOURCE CONTACT OVER THE N-TYPE SOURCE AND IN DIRECT CONTACT WITH THE SECOND PORTION OF THE CONDUCTIVE LAYER

316 FORM A BACKSIDE DRAIN CONTACT UNDER THE P-TYPE DRAIN AND IN DIRECT CONTACT WITH THE SECOND PORTION OF THE CONDUCTIVE LAYER

318 PERFORM FURTHER PROCESSES

302 RECEIVE A WORKPIECE INCLUDING A CFET, THE CFET HAVING AN N-TYPE SOURCE, AN N-TYPE DRAIN, A P-TYPE SOURCE UNDER THE N-TYPE SOURCE, A P-TYPE DRAIN UNDER THE N-TYPE DRAIN, A FIRST GATE STRUCTURE DISPOSED BETWEEN THE N-TYPE SOURCE AND THE N-TYPE DRAIN, AND A SECOND GATE STRUCTURE DISPOSED BETWEEN THE P-TYPE SOURCE AND THE P-TYPE DRAIN

304 FORM A TRENCH TO SEPARATE EACH OF THE FIRST AND SECOND GATE STRUCTURES OF THE CFET INTO PIECES

306 FORM A BI-LAYER DIELECTRIC LINER TO PARTIALLY FILL THE TRENCH

308 DEPOSIT A CONDUCTIVE LAYER IN THE TRENCH

FIG. 23

SEMICONDUCTOR STRUCTURES WITH REDUCED PARASITIC CAPACITANCE AND METHODS FOR FORMING THE SAME

PRIORITY DATA

This application claims priority to U.S. Provisional Patent Application No. 63/351,239, filed on Jun. 10, 2022, U.S. Provisional Patent Application No. 63/390,530, filed on Jul. 19, 2022, and U.S. Provisional Patent Application No. 63/420,389 filed on Oct. 28, 2022, the entire disclosures of which are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As integrated circuit (IC) technologies progress towards smaller technology nodes, parasitic capacitance of dielectric components in semiconductor structure may have serious bearings on the overall performance of an IC device. In some examples, high parasitic capacitance may lead to lower device speed (e.g., RC delays) when separation distances between the active device regions reduces to meet design requirements of smaller technology nodes. While methods of reducing parasitic capacitance in semiconductor structure have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a semiconductor structure, according to one or more aspects of the present disclosure.

FIGS. 4, 5, 6, 7, 8, 9, 10, 11, 12 and 13 (FIGS. 4-13) illustrate fragmentary cross-sectional views of the workpiece taken along line A-A' as shown in FIG. 2 during various fabrication stages in the method of FIG. 1, according to one or more aspects of the present disclosure.

FIG. 4A depicts a simplified atomic structure of a first dielectric layer implemented in the semiconductor structure that is fabricated according to the method of FIG. 1, according to one or more aspects of the present disclosure.

FIG. 23 illustrates a flow chart of an exemplary method for forming another semiconductor structure, according to one or more aspects of the present disclosure.

DETAILED DESCRIPTION

Figure 2:
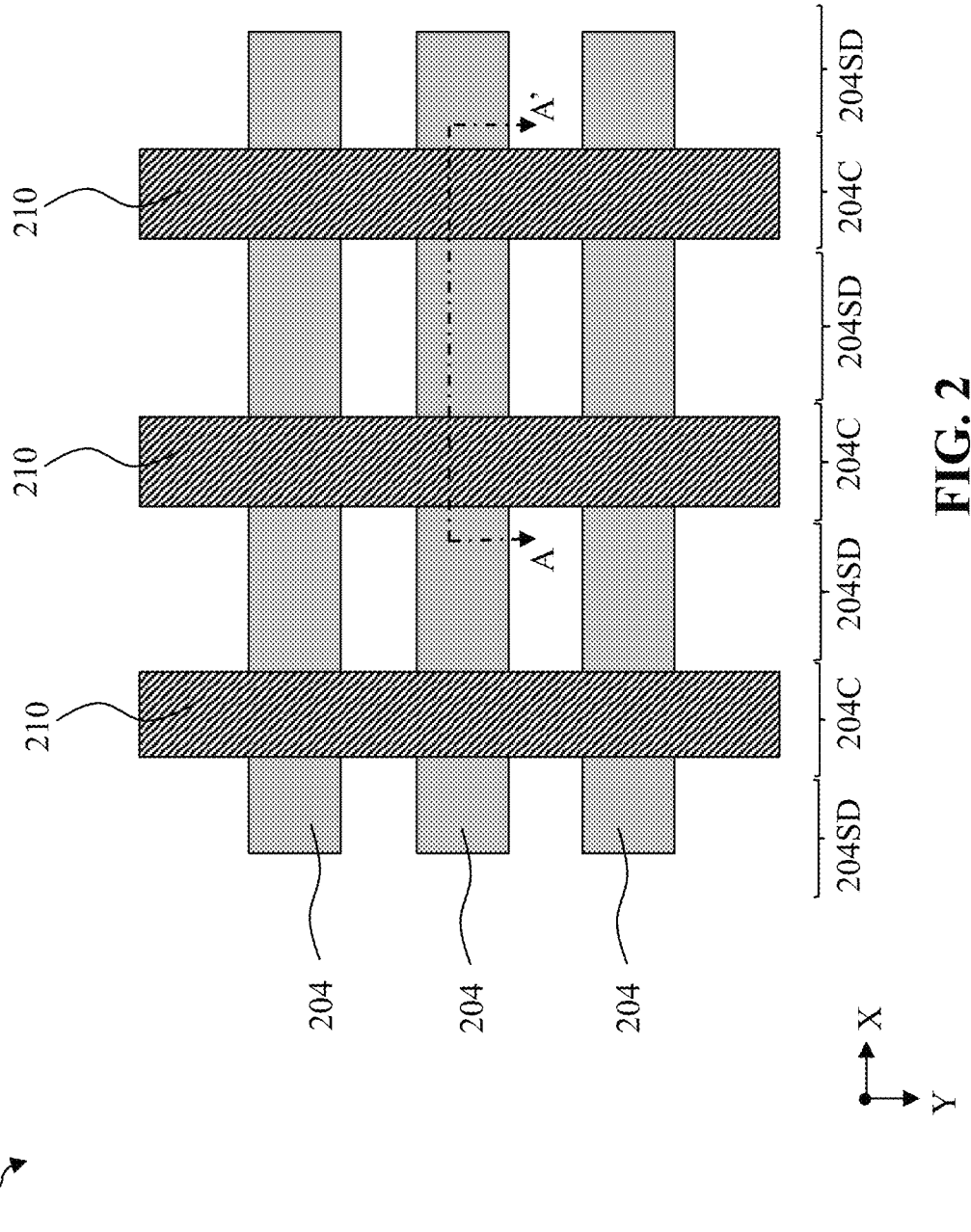
FIG. 2 illustrates a fragmentary top view of an exemplary workpiece to undergo various stages of operations in the method of FIG. 1, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

As integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Complementary metal-oxide-semiconductor field effect transistors (CMOSFETs or CFETs) have dominated the semiconductor industry due to their high noise immunity and low static power consumption. A CFET includes an n-type FET (NFET) and a p-type FET (PFET) disposed side-by-side on the same substrate and the NFET and PFET share the same structure. In some embodiments, NFET and the PFET are both planar devices, both FinFETs, or both MBC transistors.

During the formation of semiconductor structures, dielectric materials are widely used to fulfill different functions. In some situations, components formed by those dielectric materials may lead to high parasitic capacitance. The present disclosure provides semiconductor structures with reduced parasitic capacitance and methods thereof. In an exemplary embodiment, a bi-layer dielectric structure is provided to reduce the parasitic capacitance. The formation of the bi-layer dielectric structure includes forming a first dielectric layer and forming an in-situ second dielectric layer on the first dielectric layer. The first dielectric layer is formed of boron nitride having a low-k dielectric constant and a high density. The second dielectric layer is free of oxygen and is less easily to be oxidized than the first dielectric layer to prevent the first dielectric layer from being substantially oxidized. Deposition processes for forming the first dielectric layer and the second dielectric layer are performed in a same process chamber. The bi-layer dielectric structure may be implemented to form gate spacers, inner spacer features, etch stop layers, various isolation structures (e.g., gate isolation structures) and/or dielectric liners to reduce parasitic capacitance of the semiconductor structures while enabling the semiconductor structures to sustain potential damages. As such, device performance of the semiconductor structures may be advantageously improved.

The various aspects of the present disclosure will now be described in more detail with reference to the figures. In that regard, FIG. 1 is a flowchart illustrating method 100 of forming a first semiconductor structure according to embodiments of the present disclosure. Method 100 is described below in conjunction with FIGS. 2-18, 19A-22A, 19B-22B and 21C, which are fragmentary top and/or cross-sectional views of a workpiece 200 at different stages of fabrication according to embodiments of method 100. FIG. 23 is a flowchart illustrating method 300 of forming a second semiconductor structure according to embodiments of the present disclosure. Method 300 is described below in conjunction with FIGS. 24, 25, 26A-33A, 26B-33B, 26C-33C, 26D-33D and 33E, which are fragmentary top, perspective, and/or cross-sectional views of a workpiece 400 at different stages of fabrication according to embodiments of method 300. Method 100 and method 300 are merely examples and are not intended to limit the present disclosure to what is explicitly illustrated therein. Additional steps may be provided before, during and after the method 100/300, and some steps described can be replaced, eliminated, or moved around for additional embodiments of the method. Not all steps are described herein in detail for reasons of simplicity. Because the workpiece 200/400 will be fabricated into a semiconductor structure upon conclusion of the fabrication processes, the workpiece 200/400 may be referred to as the semiconductor structure 200/400 as the context requires. For avoidance of doubts, the X, Y and Z directions in the figures are perpendicular to one another and are used consistently throughout the present disclosure. Throughout the present disclosure, like reference numerals denote like features unless otherwise excepted.

Figure 3:
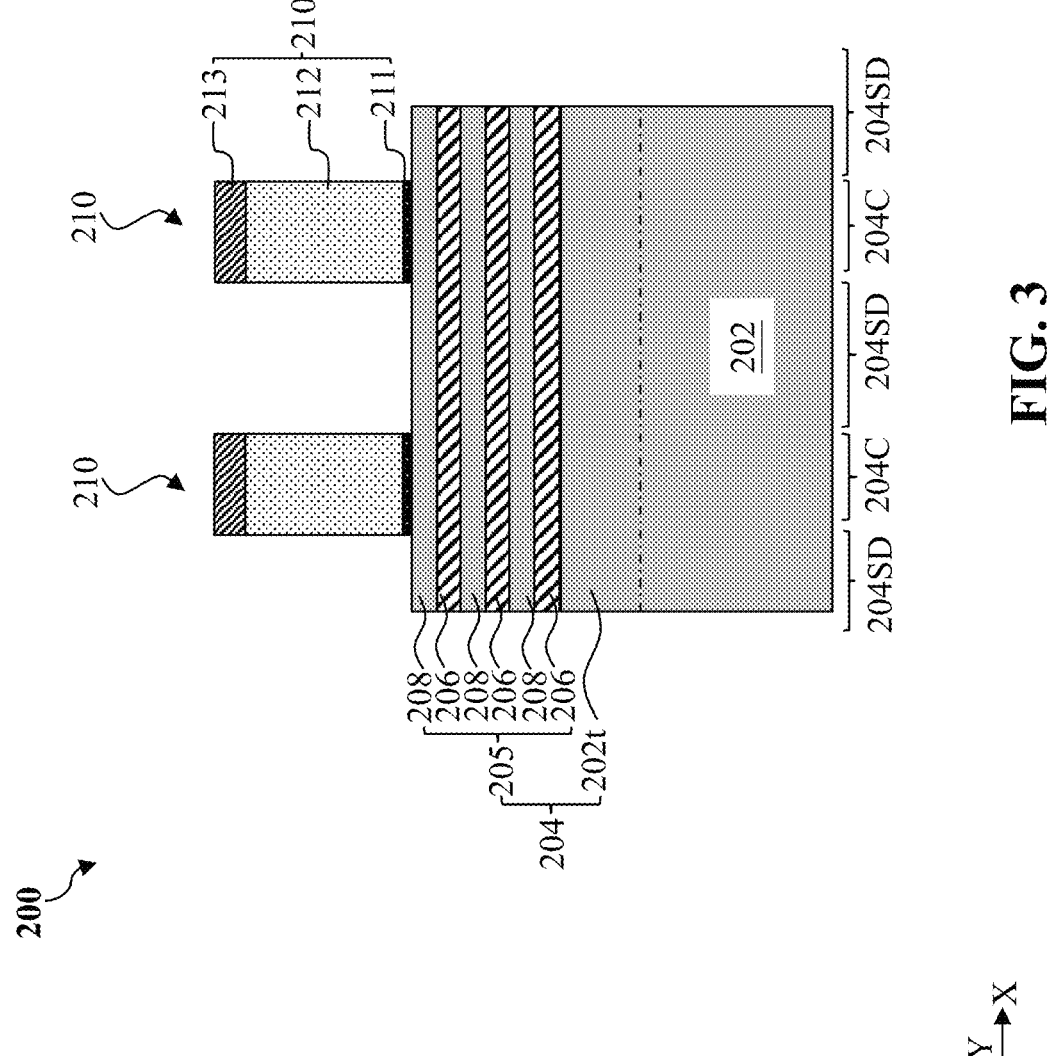
FIG. 3 illustrates a fragmentary cross-sectional view of the workpiece taken along line A-A' as shown in FIG. 2, according to one or more aspects of the present disclosure.

Referring to FIGS. 1, 2, and 3, method 100 includes a block 102 where a workpiece 200 is received. FIG. 2 depicts a fragmentary top view of a workpiece 200 to undergo various stages of operations in the method of FIG. 1, according to various aspects of the present disclosure. FIG. 3 illustrates a fragmentary cross-sectional view of the workpiece 200 taken along line A-A' as shown in FIG. 2. As illustrated in FIG. 3, the workpiece 200 includes a substrate 202. In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator substrate, or a germanium-on-insulator substrate. The substrate 202 may include n-type doped region(s) and p-type doped region(s).

The workpiece 200 includes a number of fin-shaped active regions 204 disposed over the substrate 202. As depicted in FIG. 2, the fin-shaped active region 204 extends lengthwise along the X direction and is divided into channel regions 204C overlapped by dummy gate stacks 210 (to be described below) and source/drain regions 204SD not overlapped by the dummy gate stacks 210. Source/drain region(s) may refer to a source region or a drain region, individually or collectively dependent upon the context. The numbers of fin-shaped active regions 204, channel regions 204C, and source/drain regions 204SD shown in FIGS. 2 and 3 are for illustration purpose only and should not be construed as limiting the scope of the present disclosure. The fin-shaped active region 204 is formed from a top portion 202t of the substrate 202 and a vertical stack 205 of alternating semiconductor layers 206 and 208 using a combination of lithography and etch steps. That is, the fin-shaped active region 204 includes a patterned vertical stack 205 and a patterned top portion 202t of the substrate 202 thereunder. An exemplary lithography process includes spin-on coating a photoresist layer, soft baking of the photoresist layer, mask aligning, exposing, post-exposure baking, developing the photoresist layer, rinsing, and drying (e.g., hard baking). In some instances, the patterning of the fin-shaped active region 204 may be performed using double-patterning or multi-patterning processes to create patterns having pitches smaller than what is otherwise obtainable using a single, direct photolithography process. The etching process can include dry etching, wet etching, and/or other suitable processes. In the depicted embodiment, the vertical stack 205 of alternating semiconductor layers 206 and 208 may include a number of channel layers 208 interleaved by a number of sacrificial layers 206. Each of the channel layers 208 may be formed of silicon (Si) and each of the sacrificial layers 206 may be formed of silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In embodiments where the workpiece 200 includes FinFETs, the fin-shaped active region 204 may be formed of a single semiconductor element (e.g., Si).

The workpiece 200 also includes an isolation feature 209 (shown in FIG. 15) formed around each fin-shaped active region 204 to isolate the fin-shaped active region 204 from an adjacent fin-shaped active region. The isolation feature 209 may also be referred to as a shallow trench isolation (STI) feature and may include silicon oxide, silicon oxynitride, fluorine-doped silicate glass (FSG), a low-k dielectric, combinations thereof, and/or other suitable materials.

Still referring to FIGS. 2 and 3, the workpiece 200 also includes dummy gate stacks 210 disposed over channel regions 204C of the fin-shaped active region 204. The channel regions 204C and the dummy gate stacks 210 also define source/drain regions 204SD that are not vertically overlapped by the dummy gate stacks 210. Each of the channel regions 204C is disposed between two source/drain regions 204SD along the X direction. Three dummy gate stacks 210 are shown in FIG. 2 but the workpiece 200 may include any suitable number of dummy gate stacks 210. In this embodiment, a gate replacement process (or gate-last process) is adopted where the dummy gate stacks 210 serve as placeholders for functional gate structures (e.g., gate structures 240 shown in FIG. 13). Other processes and configurations are possible. The dummy gate stack 210 includes a dummy dielectric layer 211, a dummy gate electrode layer 212 over the dummy dielectric layer 211, and a gate-top hard mask layer 213 over the dummy gate electrode layer 212. The dummy dielectric layer 211 may include silicon oxide. The dummy gate electrode layer 212 may include polysilicon. The gate-top hard mask layer 213 may include silicon oxide layer, silicon nitride, and/or other suitable materials. Suitable deposition process, photolithography and etching process may be employed to form the dummy gate stack 210.

Figures 4, 4A:
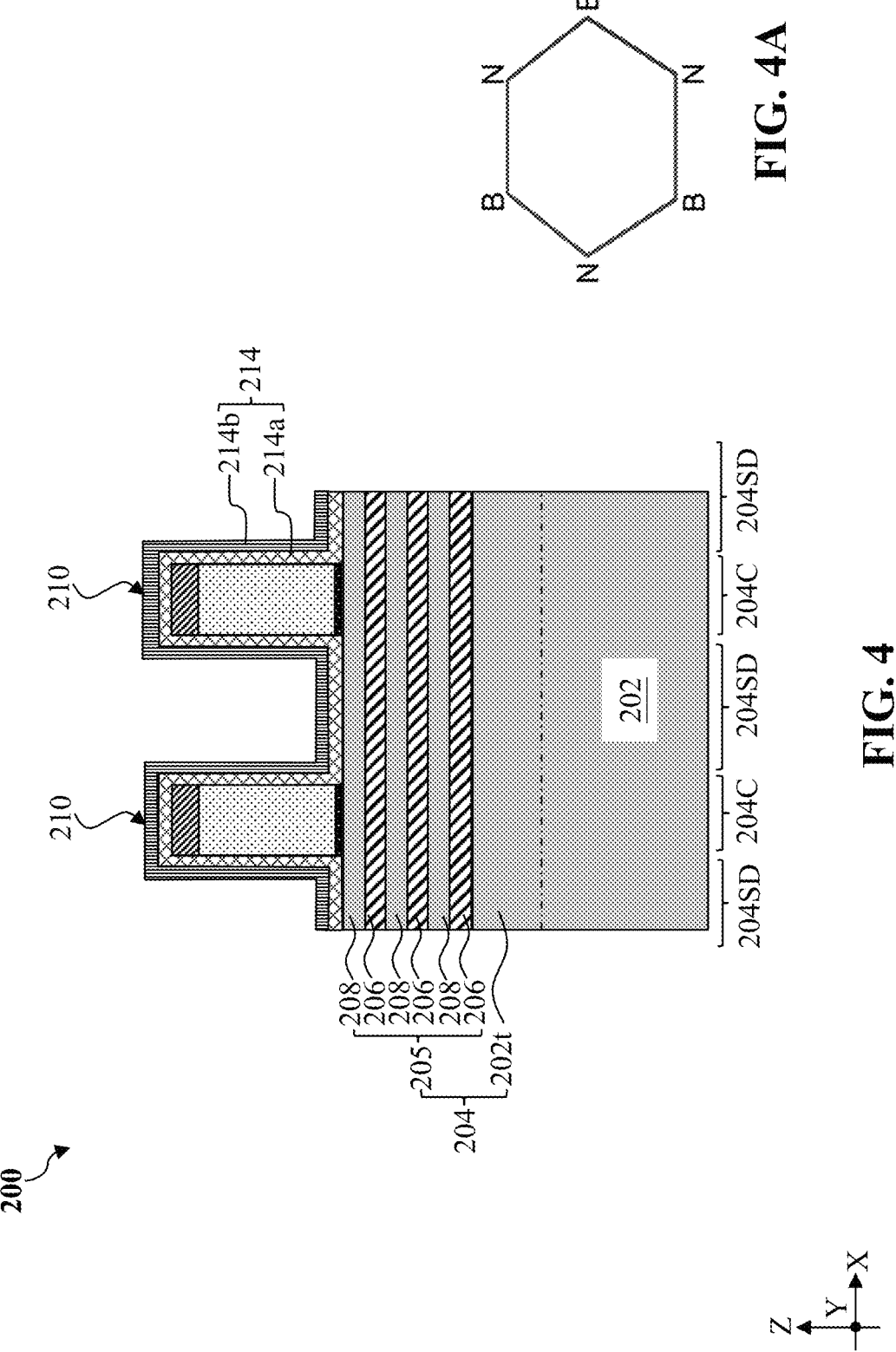

Referring to FIGS. 1 and 4, method 100 includes a block 104 where a first dielectric layer 214a is conformally deposited over the workpiece 200. In the present embodiments, the first dielectric layer 214a is conformally deposited over the workpiece 200 by atomic layer deposition (ALD), chemical vapor deposition (CVD), or any other suitable deposition process. The term "conformally" may be used herein for ease of description of a layer having substantially uniform thickness over various regions of the workpiece 200. To provide a reduced parasitic capacitance while ensuring that the final structure of the workpiece 200 is able to sustain potential damages, in the present embodiment, the first dielectric layer 214a is configured to have a low dielectric constant and a high density. In an embodiment, the density of the first dielectric layer is greater than 1.7 g/cm³ such that the first dielectric layer 214a is able to sustain subsequent fabrication processes (e.g., etching, polishing), and the dielectric constant of the first dielectric layer 214a is less than 3 so as to significantly reduce a parasitic capacitance of the workpiece 200. In some embodiments, the first dielectric layer 214a is a non-silicon based dielectric material. In an embodiment, the first dielectric layer 214a includes boron nitride (BN) having a dielectric constant that is about 2 and a density that is about 2 g/cm³. In an embodiment, the boron nitride (BN)-based first dielectric layer 214a is formed to have a hexagonal ring structure (shown in FIG. 4A), thereby providing the desired low dielectric constant. It is noted that, the dielectric constant of the boron nitride with hexagonal ring structure is less than the dielectric constant of silicon oxide. In an example process, precursor(s) for forming the low-k and high-density boron nitride may include a hexagonal ring structure, and a deposition temperature may be between about 300° C. and about 450° C. Besides providing the low-k dielectric constant and high density, the introducing of the boron nitride-based dielectric material also increases the diversity of dielectric materials suitable for fabricating semiconductor structures and thus increases flexibility of fabricating semiconductor structures in terms of etching processes and etching selectivity.

After forming the first dielectric layer 214a, block 104 proceeds to the formation of a second dielectric layer 214b. Still referring to FIG. 4, after forming the first dielectric layer 214a, the second dielectric layer 214b is conformally deposited over the first dielectric layer 214a. The second dielectric layer 214b may be deposited by ALD, CVD, or any other suitable deposition process. In an example process, to significantly reduce the oxidation of the first dielectric layer 214a and thus substantially maintain the desired dielectric constant of the first dielectric layer 214a, deposition processes of the first dielectric layer 214a and the second dielectric layer 214b are performed in a same process chamber. For example, in an embodiment, the first dielectric layer 214a is formed by a first CVD process, the second dielectric layer 214b is formed by a second CVD process, both the first and second CVD processes are performed in a same process chamber of a same CVD tool. The temperature in the process chamber may be between about 200° C. and about 550° C. In the present embodiments, to reduce the oxidation of the first dielectric layer 214a, the composition of the second dielectric layer 214b is selected such that the second dielectric layer 214b is free of oxygen and is less easily to be oxidized than the first dielectric layer 214a. In some embodiments, a dielectric constant of the second dielectric layer 214b is greater than the dielectric constant of the first dielectric layer 214a. In an embodiment, the second dielectric layer 214b includes a nitride-based material, such as silicon nitride (SiN), silicon carbonitride (SiCN). In an embodiment, the second dielectric layer 214b includes silicon nitride. The first dielectric layer 214a and the second dielectric layer 214b may be collectively referred to as a bilayer dielectric structure 214. In an embodiment, the bilayer dielectric structure 214 includes a boron nitride layer capped with an in-situ formed silicon nitride layer. In some embodiments, a ratio of a thickness of the first dielectric layer 214a to a thickness of the second dielectric layer 214b may be between about 1 and about 2 such that the bilayer dielectric structure 214 would sustain potential damage while providing the workpiece 200 a reduced parasitic capacitance. In an embodiment, a thickness of the first dielectric layer 214a may be between about 3 nm and about 8 nm. In an embodiment, a thickness of the second dielectric layer 214b may be between about 3 nm and about 4 nm.

Figure 5:
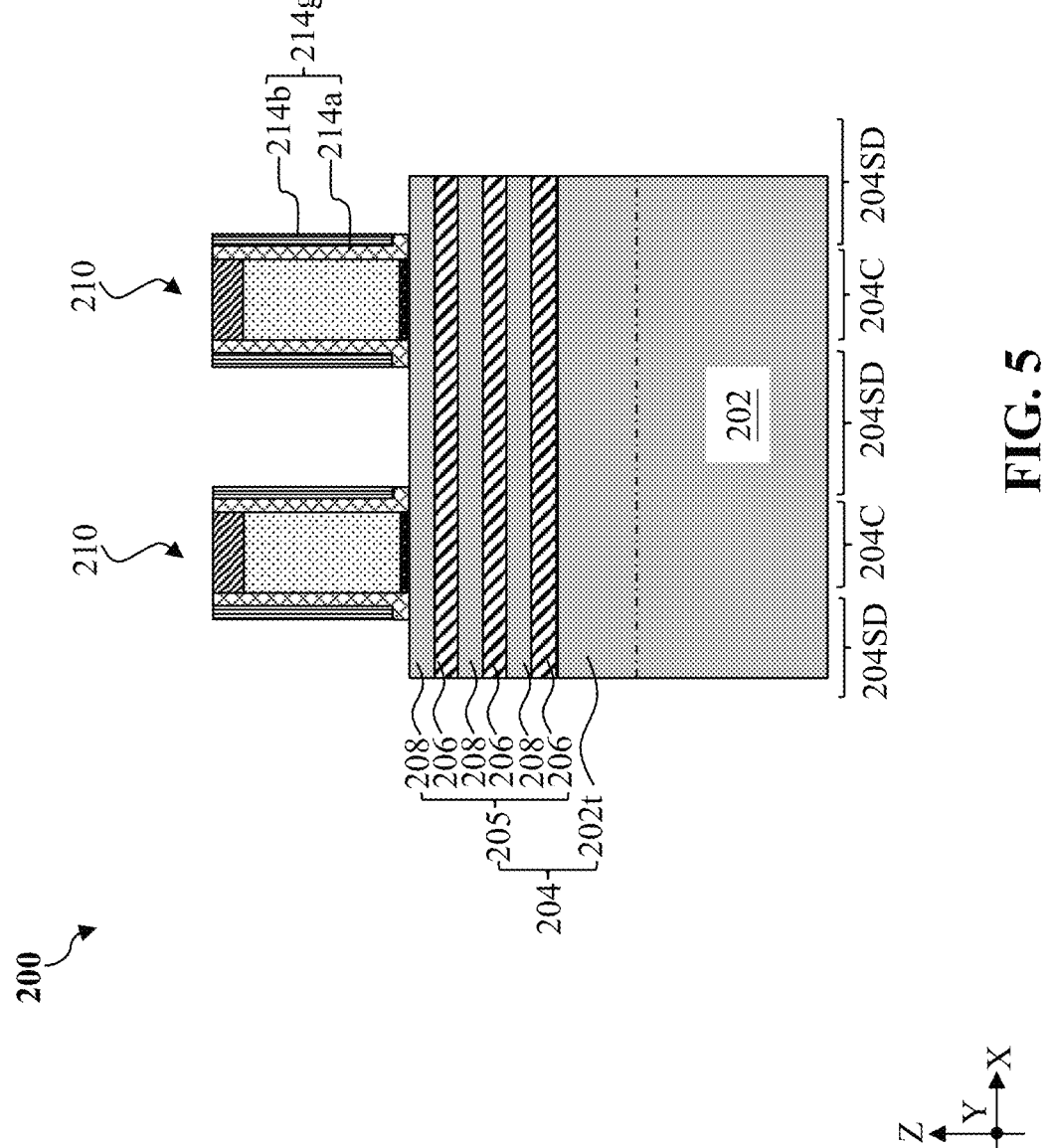

Referring to FIGS. 1 and 5, method 100 includes a block 106 where the first dielectric layer 214a and the second dielectric layer 214b are etched back to form gate spacers 214g. An anisotropic etching process may be implemented to remove portions of the first dielectric layer 214a and the second dielectric layer 214b over top-facing surfaces of the workpiece 200 to form gate spacers 214g extending along sidewalls of the dummy gate stacks 210. By providing the gate spacers 214g formed from the bilayer dielectric structure 214, parasitic capacitance of the final structure of the workpiece 200 may be advantageously reduced.

Figure 6:
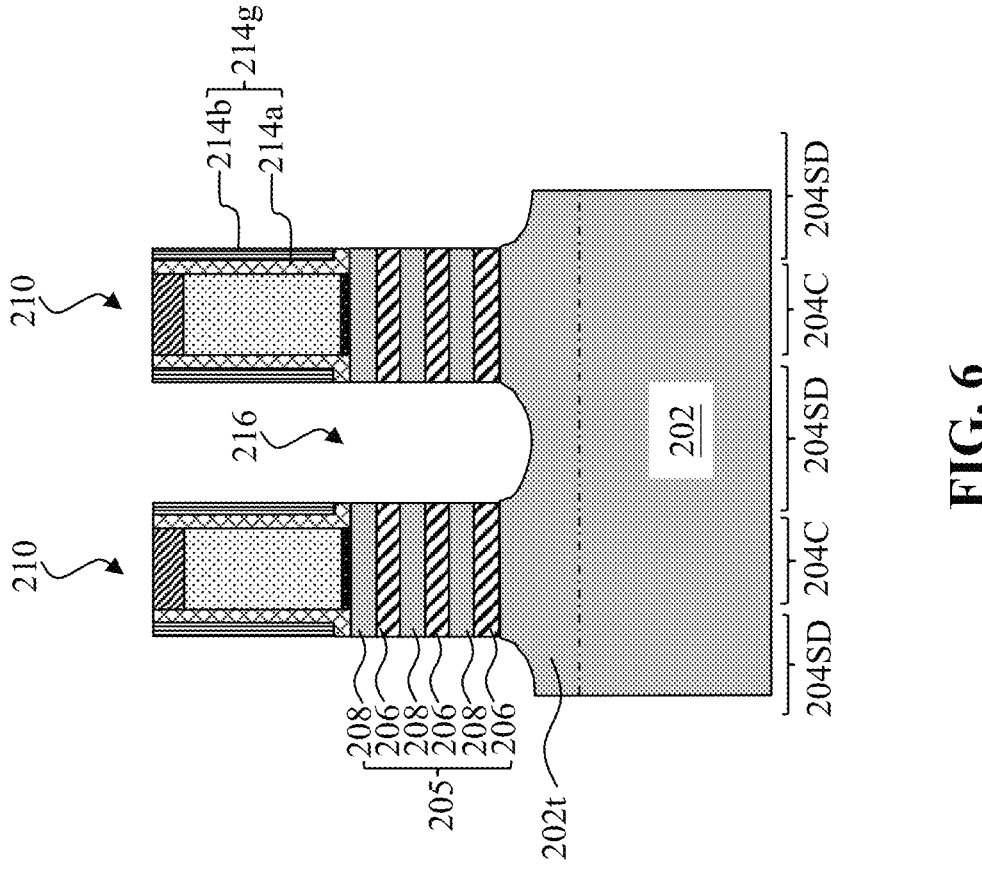

Referring to FIGS. 1 and 6, method 100 includes a block 108 where source/drain regions 204SD of the fin-shaped active regions 204 are recessed to form source/drain openings 216. In some embodiments, the source/drain regions 204SD are anisotropically etched by a plasma etch with a suitable etchant, such as fluorine-containing etchant, oxygen-containing etchant, hydrogen-containing etchant, a fluorine-containing etchant (e.g., $CF_4$, $SF_6$, $CH_2F_2$, $CHF_3$, and/or $C_2F_6$), a chlorine-containing etchant (e.g., $Cl_2$, $CHCl_3$, $CCl_4$, and/or $BCl_3$), a bromine-containing etchant (e.g., HBr and/or $CHBr_3$), an iodine-containing etchant, other suitable etchants, and/or combinations thereof. In embodiments represented in FIG. 6, the source/drain openings 216 extend through the vertical stack 205 and extend into the top portion 202t of the substrate 202. As illustrated in FIG. 6, sidewalls of the channel layers 208 and the sacrificial layers 206 and top surfaces of parts of the top portion 202t are exposed in the source/drain openings 216.

Figure 7:
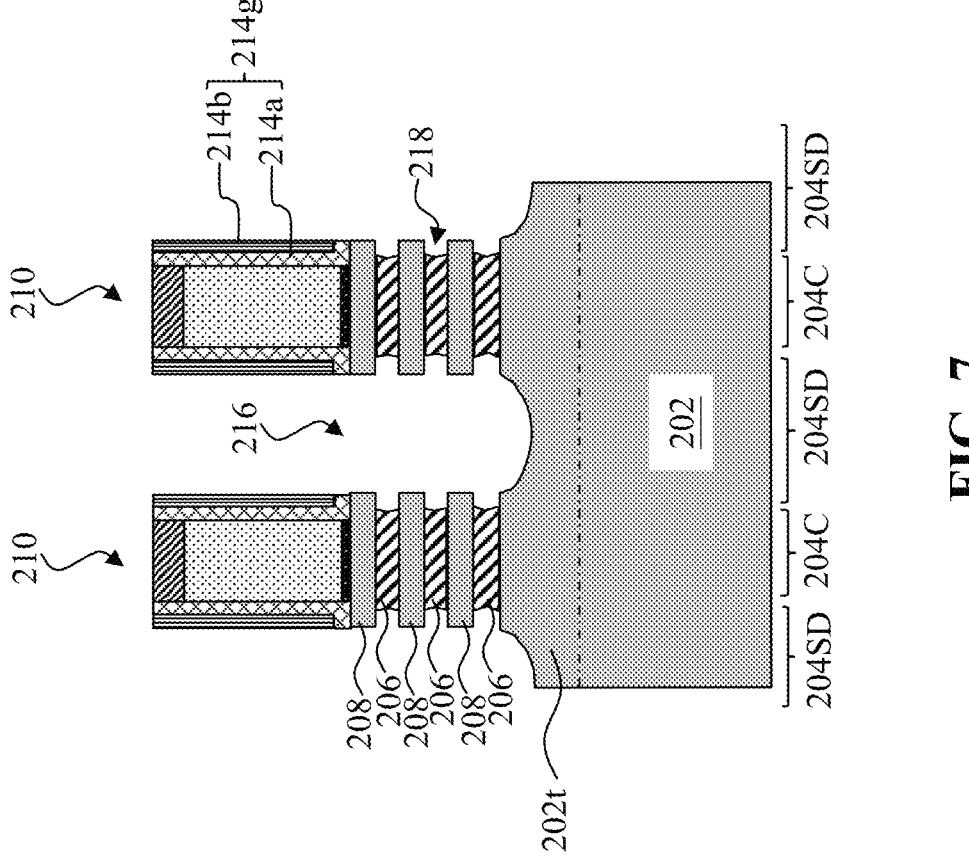

Referring to FIGS. 1 and 7, method 100 includes a block 110 where the sacrificial layers 206 are selectively recessed to form inner spacer recesses 218. After the formation of the source/drain openings 216, the sacrificial layers 206 are exposed in the source/drain openings 216. As shown in FIG. 7, the sacrificial layers 206 are selectively and partially recessed to form inner spacer recesses 218, while the exposed channel layers 208 are substantially unetched. In embodiments where the channel layers 208 consist essentially of silicon (Si) and sacrificial layers 206 consist essentially of silicon germanium (SiGe), the selective and partial recess of the sacrificial layers 206 may include use of a selective isotropic etching process (e.g., a selective dry etching process or a selective wet etching process), and the extent at which the sacrificial layers 206 are recessed is controlled by duration of the etching process.

Figure 9:
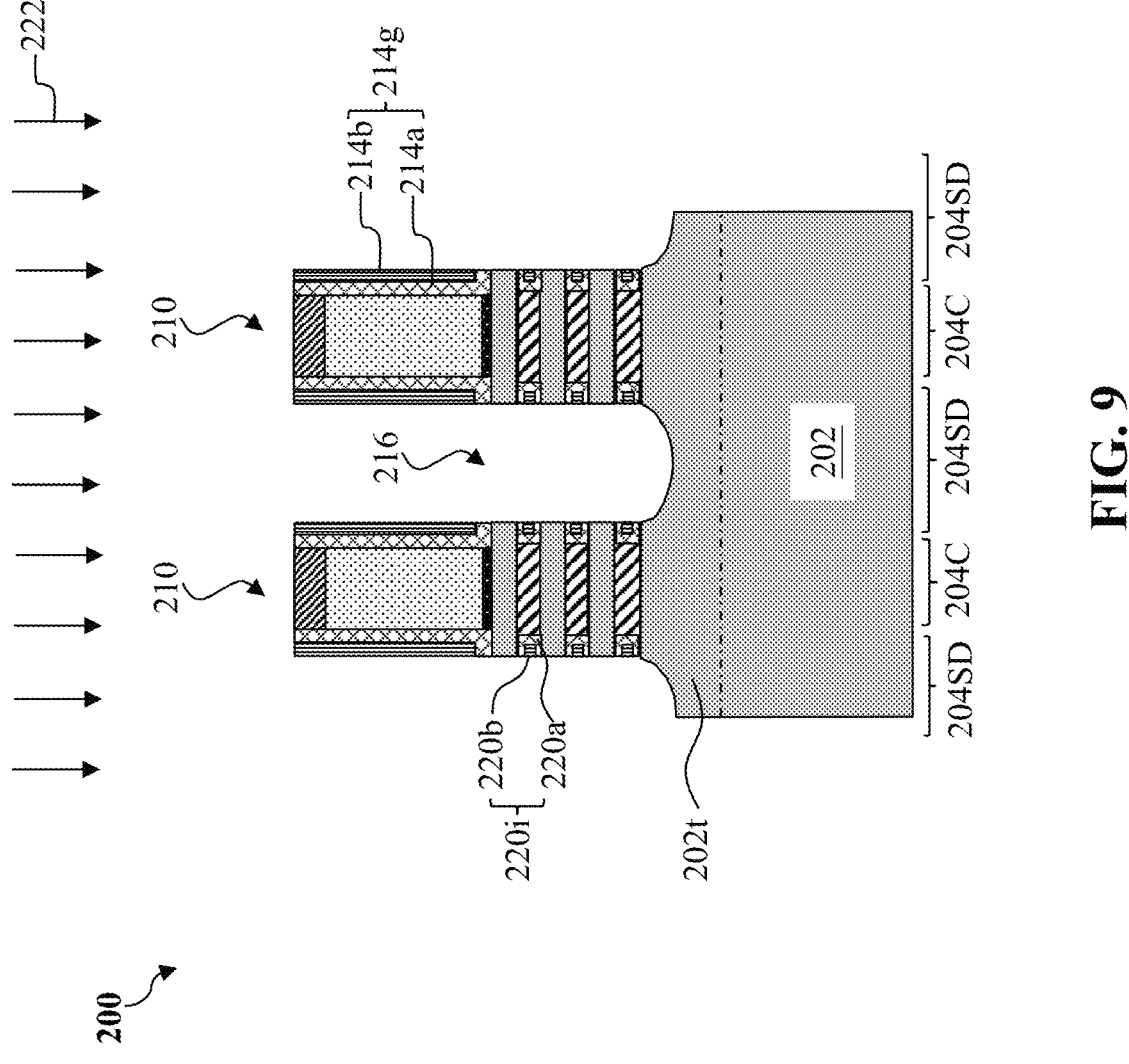

Referring to FIGS. 1 and 8-9, method 100 includes a block 112 where inner spacer features 220i are formed in the inner spacer recesses 218. In the present embodiments, a bilayer dielectric structure 220 (shown in FIG. 8) is conformally formed over the workpiece 200, including in the inner spacer recesses 218, by ALD, CVD, or any other suitable deposition process. The term "conformally" may be used herein for ease of description of a layer having substantially uniform thickness over various regions of the workpiece 200. The bilayer dielectric structure 220 is similar to the bilayer dielectric structure 214. More specifically, the bilayer dielectric structure 220 includes a first dielectric layer 220a and a second dielectric layer 220b formed over the first dielectric layer 220a. The formations and compositions of the first dielectric layer 220a and the second dielectric layer 220b are same to those of the bilayer dielectric structure 214. In an embodiment, the first dielectric layer 220a includes boron nitride, and the second dielectric layer 220b includes in-situ formed silicon nitride. After the formation of the bilayer dielectric structure 220, an etching process is performed to etch back the bilayer dielectric structure 220 to form inner spacer features 220i in the inner spacer recesses 218. Thus, each inner spacer feature 220i includes the first dielectric layer 220a and the second dielectric layer 220b. In some embodiments, a dry etching process may be performed to etch back the bilayer dielectric structure 220. The dry etching process may be in a way similar to the dry etching process used in the formation of the source/drain openings 216. In the present embodiments, the second dielectric layer 220b in the inner spacer feature 220i is spaced apart from the sacrificial layer 206 by the first dielectric layer 220a. Due to similar reasons stated above with reference to FIGS. 4 and 5, providing the inner spacer features 220i formed from the bilayer dielectric structure 220 may advantageously reduce parasitic capacitance of the final structure of the workpiece 200.

Figure 10:
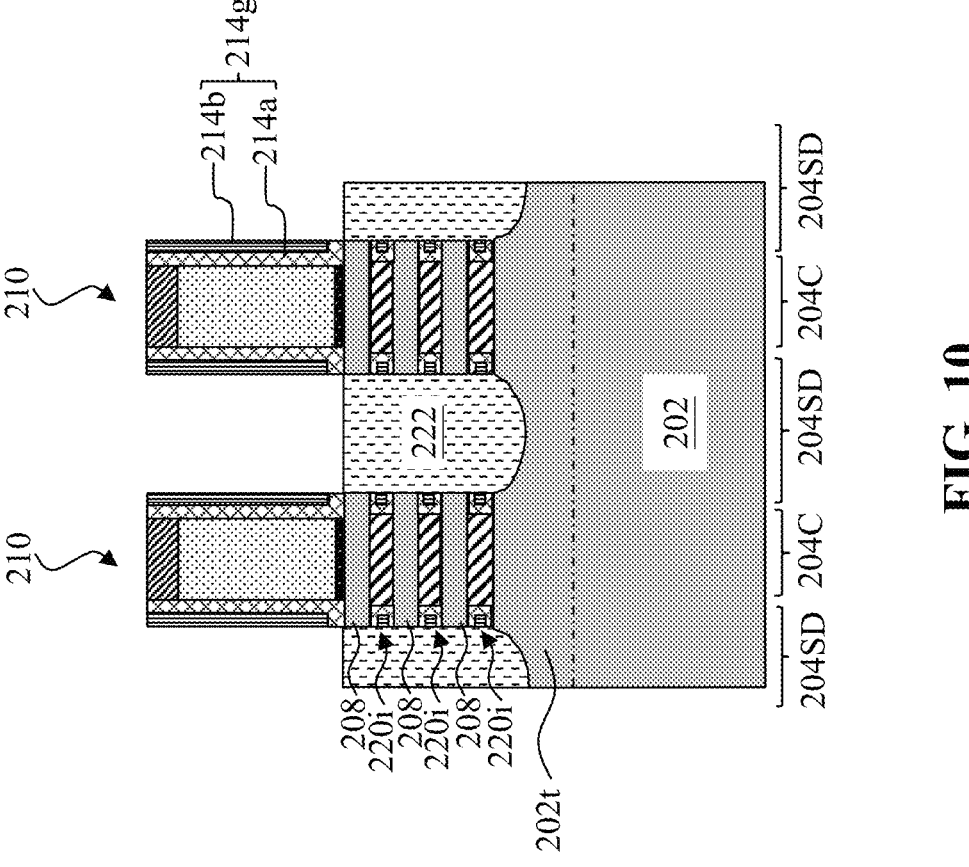

Referring to FIGS. 1 and 10, method 100 includes a block 114 where source/drain features 222 are formed in the source/drain openings 216. Source/drain feature(s) may refer to a source feature or a drain feature, individually or collectively dependent upon the context. Depending on the conductivity type of the to-be-formed transistor, the source/drain features 222 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. Although not separately labeled, the source/drain features 222 may include multiple epitaxial semiconductor layers having different dopant concentrations.

Figure 11:
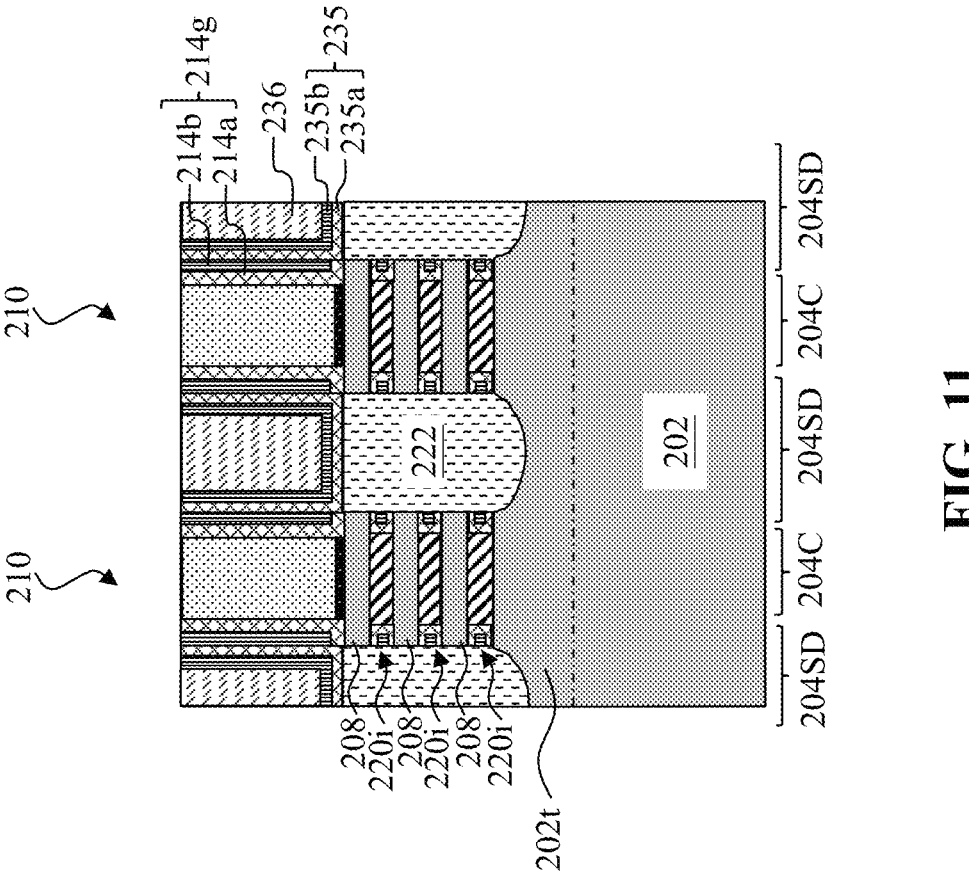
Figure 12:
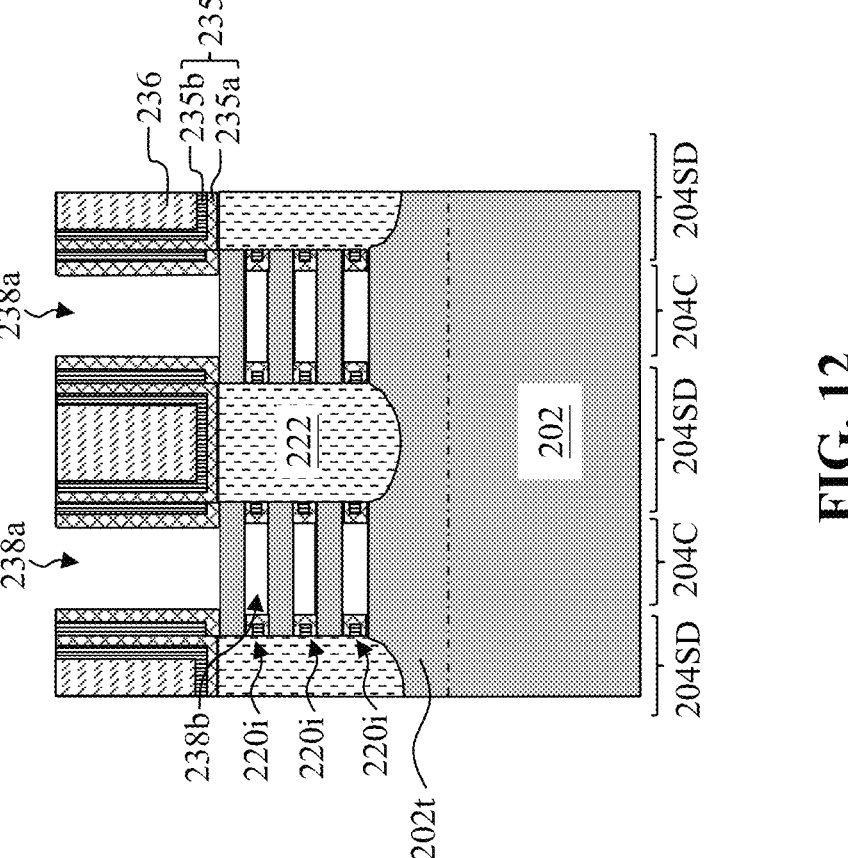

Referring to FIGS. 1 and 11, method 100 includes a block 116 where a contact etch stop layer (CESL) 235 and an interlayer dielectric (ILD) layer 236 are deposited over the workpiece 200. In an embodiment, the CESL 235 is a bi-layer structure and includes a first dielectric layer 235a and a second dielectric layer 235b formed on the first dielectric layer 235a. The formation and composition of the first dielectric layer 235a is similar to those of the first dielectric layer 214a, and the formation and composition of the second dielectric layer 235b is similar to those of the second dielectric layer 214b, and repeated description is omitted for reason of simplicity. In an embodiment, the first dielectric layer 235a includes boron nitride, and the second dielectric layer 235b includes in-situ formed silicon nitride. By providing the CESL 235 formed from the first dielectric layer 235a and the second dielectric layer 235b, parasitic capacitance of the final structure of the workpiece 200 may be advantageously reduced. The ILD layer 236 is deposited by a plasma enhanced chemical vapor deposition (PECVD) process or other suitable deposition technique over the workpiece 200 after the deposition of the CESL 235. The ILD layer 236 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A planarization process, such a chemical mechanical polishing (CMP) process may be performed to the workpiece 200 to remove excess materials and expose top surfaces of the dummy gate electrode layers 212 in the dummy gate stacks 210.

Referring to FIGS. 1 and 12-14, method 100 includes a block 118 where the dummy gate stacks 210 and sacrificial layers 206 are replaced by gate structures 240. With the exposure of the dummy gate electrode layers 212, block 118 proceeds to removal of the dummy gate stacks 210. The removal of the dummy gate stacks 210 may include performing one or more etching process selective to the materials in the dummy gate stacks 210 to form gate trenches 238a. For example, the removal of the dummy gate stacks 210 may be performed using a selective wet etch, a selective dry etch, or a combination thereof. In embodiments represented in FIG. 12, after the removal of the dummy gate stacks 210, the sacrificial layers 206 are selectively removed to release the channel layers 208 as channel members 208 in the channel regions 204C. The removal of the sacrificial layers 206 forms gate openings 238b. The selective removal of the sacrificial layers 206 may be implemented by a selective dry etch, a selective wet etch, or other selective etching process. In some embodiments, the selective wet etching includes an APM etch (e.g., ammonia hydroxide-hydrogen peroxide-water mixture).

Figure 13:
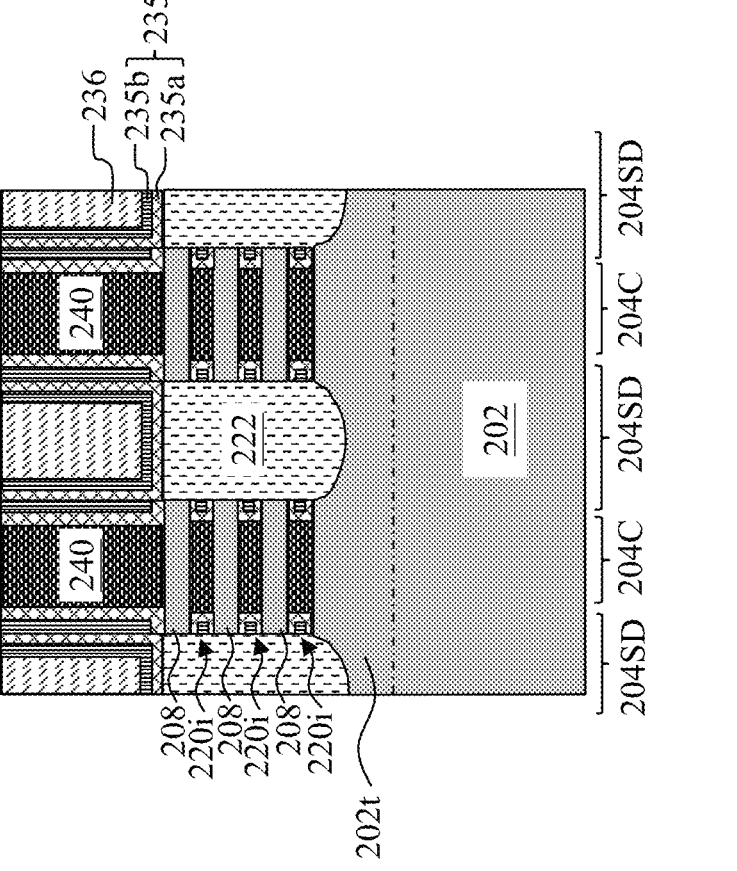
Figure 14:
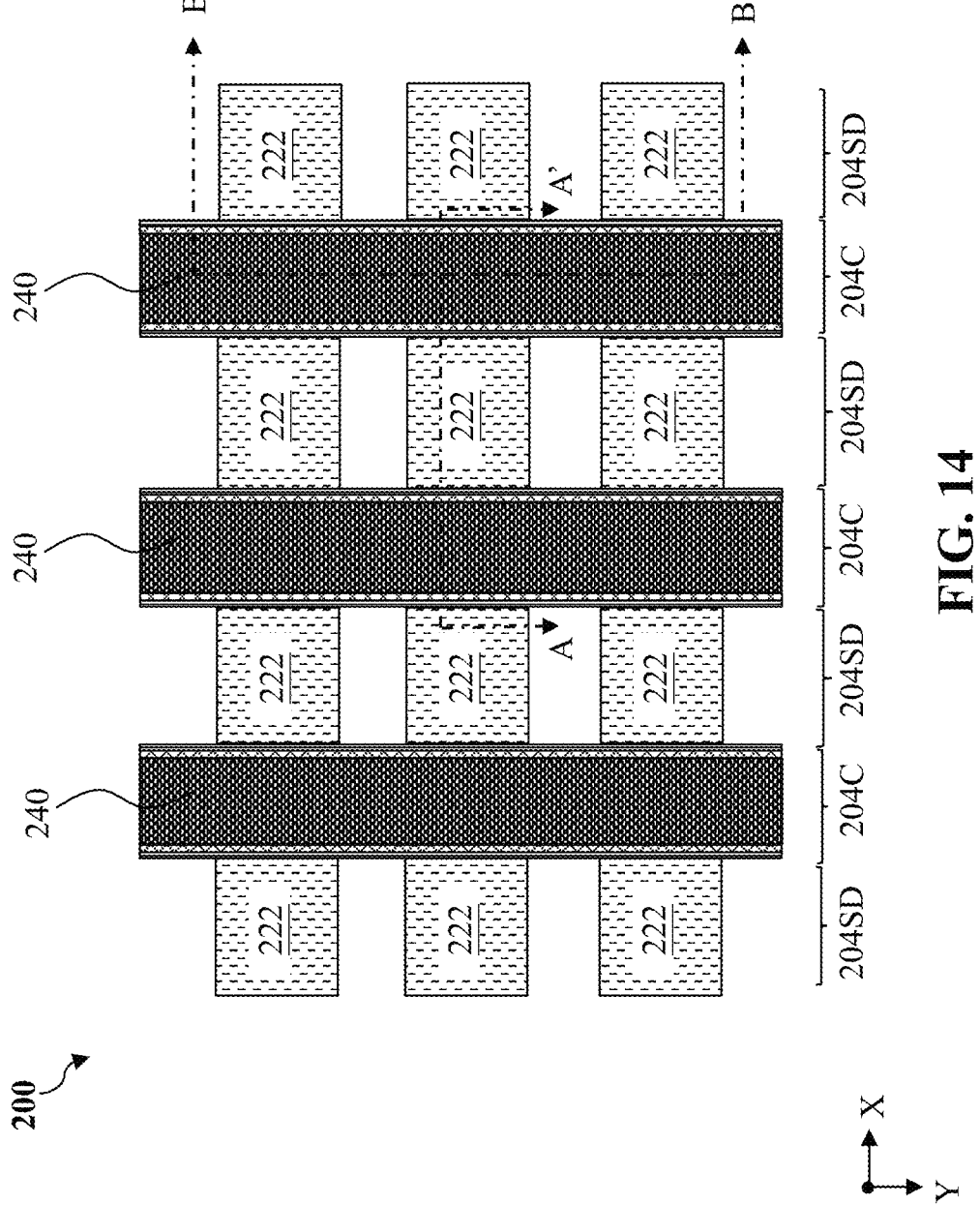
FIG. 14 illustrates a fragmentary top view of the workpiece shown in FIG. 13, according to one or more aspects of the present disclosure.

In embodiments represented in FIG. 13, gate structures 240 are then formed in the gate trenches 238a and gate openings 238b. The gate structures 240 are deposited to wrap around and over the channel members 208. FIG. 14 depicts a fragmentary top view of the workpiece 200 shown in FIG. 13. Although not separately labeled, each of the gate structures 240 may include a gate dielectric layer and a gate electrode layer over the gate dielectric layer. In some embodiments, the gate dielectric layer includes an interfacial layer disposed on the channel members 208 and a high-k dielectric layer over the interfacial layer. Here, a high-k dielectric layer refers to a dielectric material having a dielectric constant greater than that of silicon dioxide, which is about 3.9. In some embodiments, the interfacial layer includes silicon oxide. The high-k dielectric layer is then conformally deposited over the workpiece 200 using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, BaZrO, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

The gate electrode layer is then deposited over the gate dielectric layer using atomic layer deposition (ALD), physical vapor deposition (PVD), chemical vapor deposition (CVD), e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof. Further, where the semiconductor structure 200 includes n-type transistors and p-type transistors, different gate electrode layers may be formed separately for n-type transistors and p-type transistors, which may include different work function metal layers (e.g., for providing different n-type and p-type work function metal layers).

Figure 15:
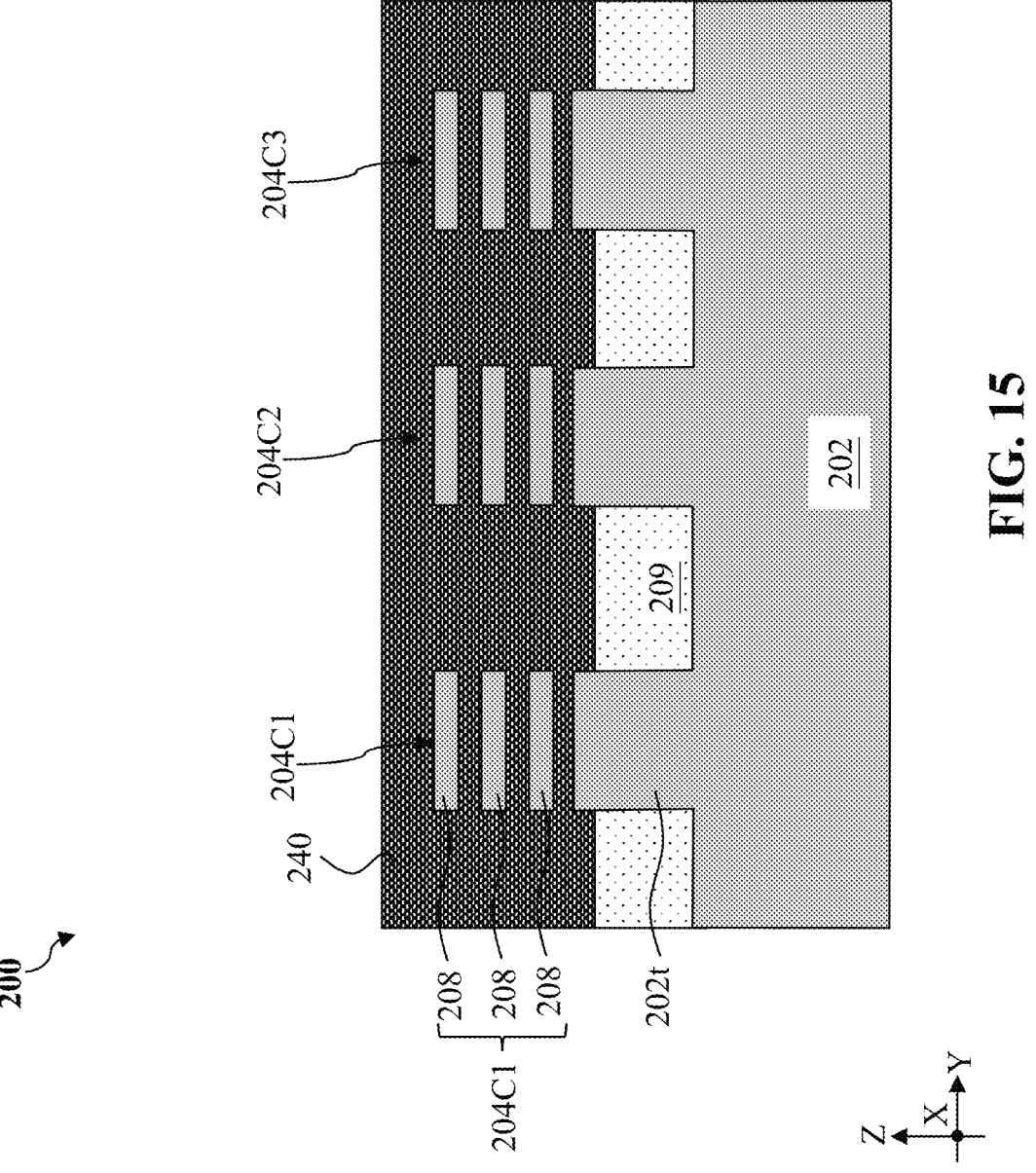
FIGS. 15, 16, and 17 illustrate fragmentary cross-sectional views of the workpiece taken along line B-B' as shown in FIG. 14 during various fabrication stages in the method of FIG. 1, according to one or more aspects of the present disclosure.
Figure 16:
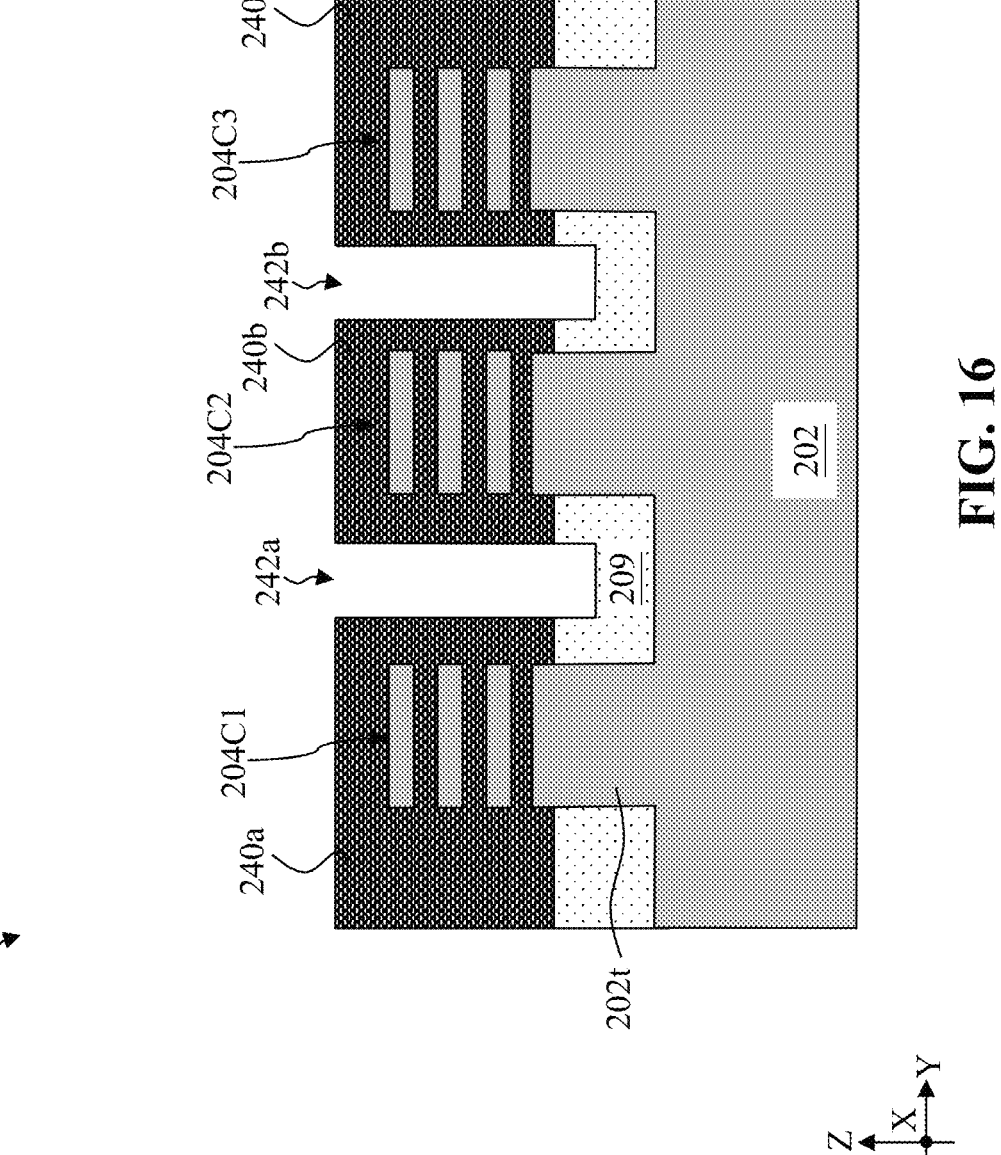

Referring to FIGS. 1 and 15-16, method 100 includes a block 120 where gate isolation trenches are formed to separate the gate structure 240. FIG. 15 depicts a cross-sectional view of the workpiece 200 taken along line B-B' shown in FIG. 14. In embodiments depicted in FIGS. 14 and 15, the gate structure 240 extends longwise along Y direction and wraps around and over three channel regions 204C1, 204C2, and 204C3. Each channel region 204C1/204C2/204C3 includes a vertical stack of channel members 208, and each channel region is spaced apart from an adjacent channel region along the Y direction. It is understood that the workpiece 200 may include any suitable number of channel regions, each channel region may include any suitable number of channel members, and the gate structure 240 may wrap around and over any suitable number of channel regions.

Reference is now made to FIG. 16, where an etching process is performed to form a first gate isolation trench 242*a* and a second gate isolation trench 242*b* to cut the gate structure 240 into pieces. In some embodiments, a patterned mask film (not shown) may be formed on the gate structure 240 to expose a portion of the gate structure 240. While using the patterned mask film as an etch mask, an etching process is performed to the workpiece 200 to form the first gate isolation trench 242*a* and the second gate isolation trench 242*b*. In the present embodiments, the first gate isolation trench 242*a* and the second gate isolation trench 242*b* both extend through the gate structure 240 and extend downward into the isolation feature 209. As depicted in FIG. 16, after the formation of the first gate isolation trench 242*a* and the second gate isolation trench 242*b*, the gate structure 240 includes a first portion 240*a* wrapping around and over the channel regions 204C1, a second portion 240*b* wrapping around and over the channel regions 204C2, and a third portion 240*c* wrapping around and over the channel regions 204C3. The first portion 240*a* of the gate structure 240 is spaced apart from the second portion 240*b* of the gate structure 240 by the first gate isolation trench 242*a*, and the second portion 240*b* of the gate structure 240 is spaced apart from the third portion 240*c* of the gate structure 240 by the second gate isolation trench 242*b*.

Figure 17:
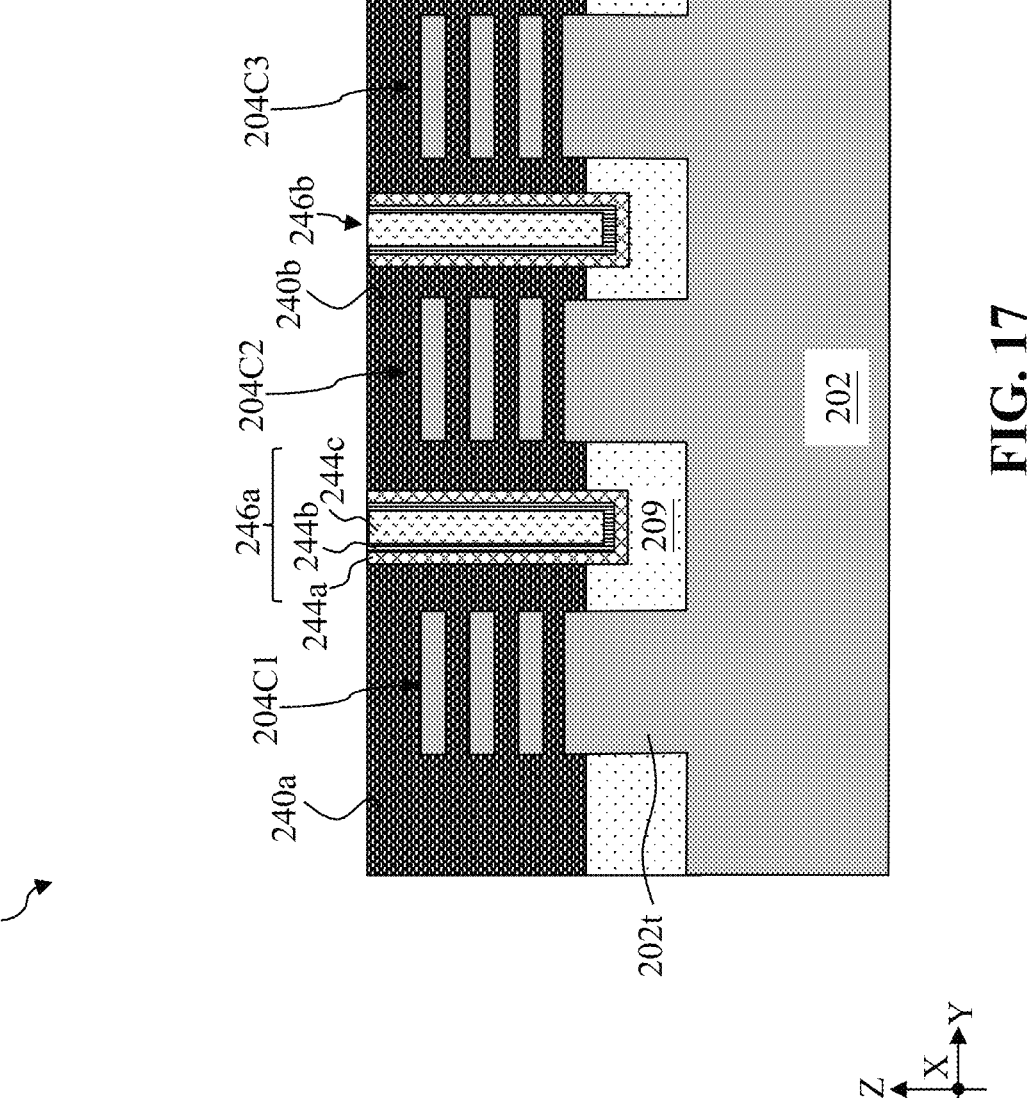
Figure 18:
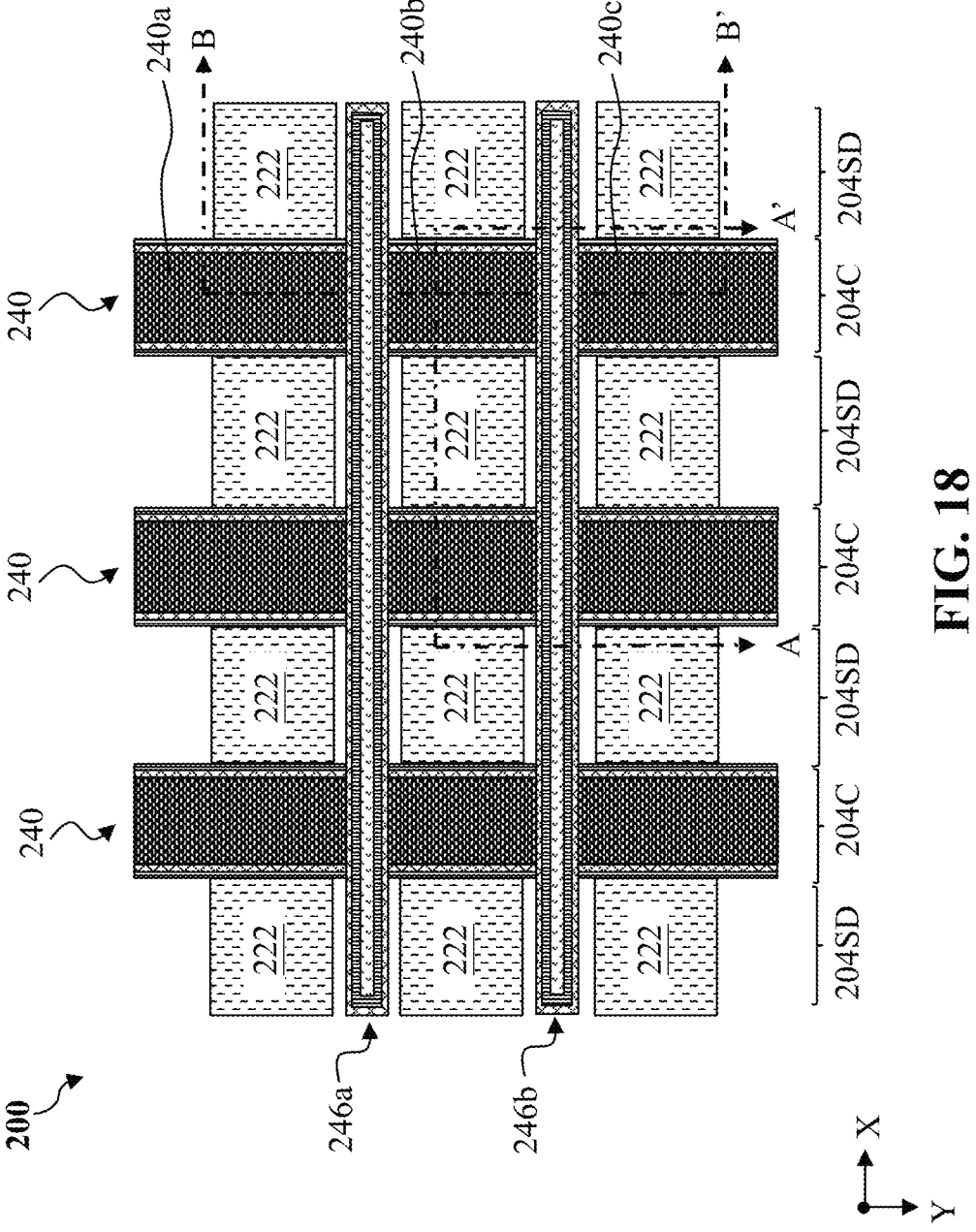
FIG. 18 illustrates a fragmentary top view of the workpiece shown in FIG. 17, according to one or more aspects of the present disclosure.

Referring to FIGS. 1 and 17-18, method 100 includes a block 122 where first and second gate isolation structures 246*a* and 246*b* are formed in the first and second gate isolation trenches 242*a* and 242*b*, respectively to cut the gate structure 240 electrically and physically into pieces (e.g., 240*a*, 240*b*, and 240*c*). In some embodiments, the first and second gate isolation structures 246*a* and 246*b* may be referred to as cut metal gates (CMGs). The first and second gate isolation structures 246*a* and 246*b* may cut and thus be in direct contact with the gate electrode layer of the gate structure 240. In some embodiments, depending on the thickness of the gate dielectric layer, the first and second gate isolation structures 246*a* and 246*b* may further cut and thus be in direct contact with the gate dielectric layer of the gate structure 240. In an embodiment, the first and second gate isolation structures 246*a* and 246*b* extend into the isolation feature 209. The formation of the first gate isolation structure 246*a* and the second gate isolation structure 246*b* may include conformally depositing a first dielectric material over the workpiece 200, conformally depositing a second dielectric material over the first dielectric material, depositing a third dielectric material to fill remaining portions of the first and second gate isolation trenches 242*a* and 242*b*, and performing a planarization process to the workpiece 200 to remove excess portions of the first, second, and third dielectric materials over the gate structure 240 and define final structures of the first gate isolation structure 246*a* and the second gate isolation structure 246*b*. Each of the first gate isolation structure 246*a* and the second gate isolation structure 246*b* includes a first dielectric liner 244*a* formed from the first dielectric material, a second dielectric liner 244*b* formed from the second dielectric material, and a dielectric filler 244*c* formed from the third dielectric material. In the present embodiment, a composition and a fabrication process of the first dielectric material are same to those of the first dielectric layer 214*a*, and a composition and a fabrication process of the second dielectric material are same to those of the second dielectric layer 214*b*. In an embodiment, the first dielectric liner 244*a* includes boron nitride, the second dielectric liner 244*b* includes in-situ formed silicon nitride. The dielectric filler 244*c* may include silicon oxide, silicon nitride, silicon carbide, silicon oxynitride, silicon oxycarbide, silicon carbonitride, a low-k dielectric material, other suitable materials, or combinations thereof, and may be deposited by CVD, PECVD, flowable CVD, PVD, ALD, other suitable methods, or combinations thereof. In an embodiment, the dielectric filler 244*c* includes silicon oxide. In an alternative embodiment, instead of a triple-layer structure, each of the first gate isolation structure 246*a* and the second gate isolation structure 246*b* may be a bi-layer structure and is formed from the first dielectric material and the second dielectric material. For example, each of the first gate isolation structure 246*a* and the second gate isolation structure 246*b* may include a dielectric liner formed from the first dielectric material and a dielectric filler embedded in the dielectric liner and formed from the second dielectric material. By providing the gate isolation structures 246*a* and 246*b* that include the first dielectric material and the second dielectric material, parasitic capacitance of the final structure of the workpiece 200 may be advantageously reduced.

FIG. 18 depicts a fragmentary top view of the workpiece 200 shown in FIG. 17. In embodiments represented in FIG. 18, each of the first gate isolation structure 246*a* and the second gate isolation structure 246*b* extends lengthwise along the X direction (which is substantially perpendicular to the direction of gate structure 240) and divides more than one gate structures 240 into pieces. In the present embodiment, each of the first gate isolation structure 246*a* and the second gate isolation structure 246*b* cuts three gate structures 240. It is understood that each of the first gate isolation structure 246*a* and the second gate isolation structure 246*b* may cut any suitable number of gate structures 240.

Continuous poly on diffusion edge (CPODE) processes have been developed to form isolation structures (may be referred to as CPODE structures or dielectric gates) to divide active regions into segments. CPODE structures and other similar structures are a scaling tool to improve density of devices (e.g., transistors). To achieve desired scaling effect while maintaining the devices' proper functions (e.g., avoiding electrical shorting), the CPODE structures may be formed between boundaries of such devices (i.e., between, for example, source/drain contacts and/or source/drain features), such that the separation distance between adjacent devices may be reduced or minimized without compromising device performance.

Figures 19A, 19B:
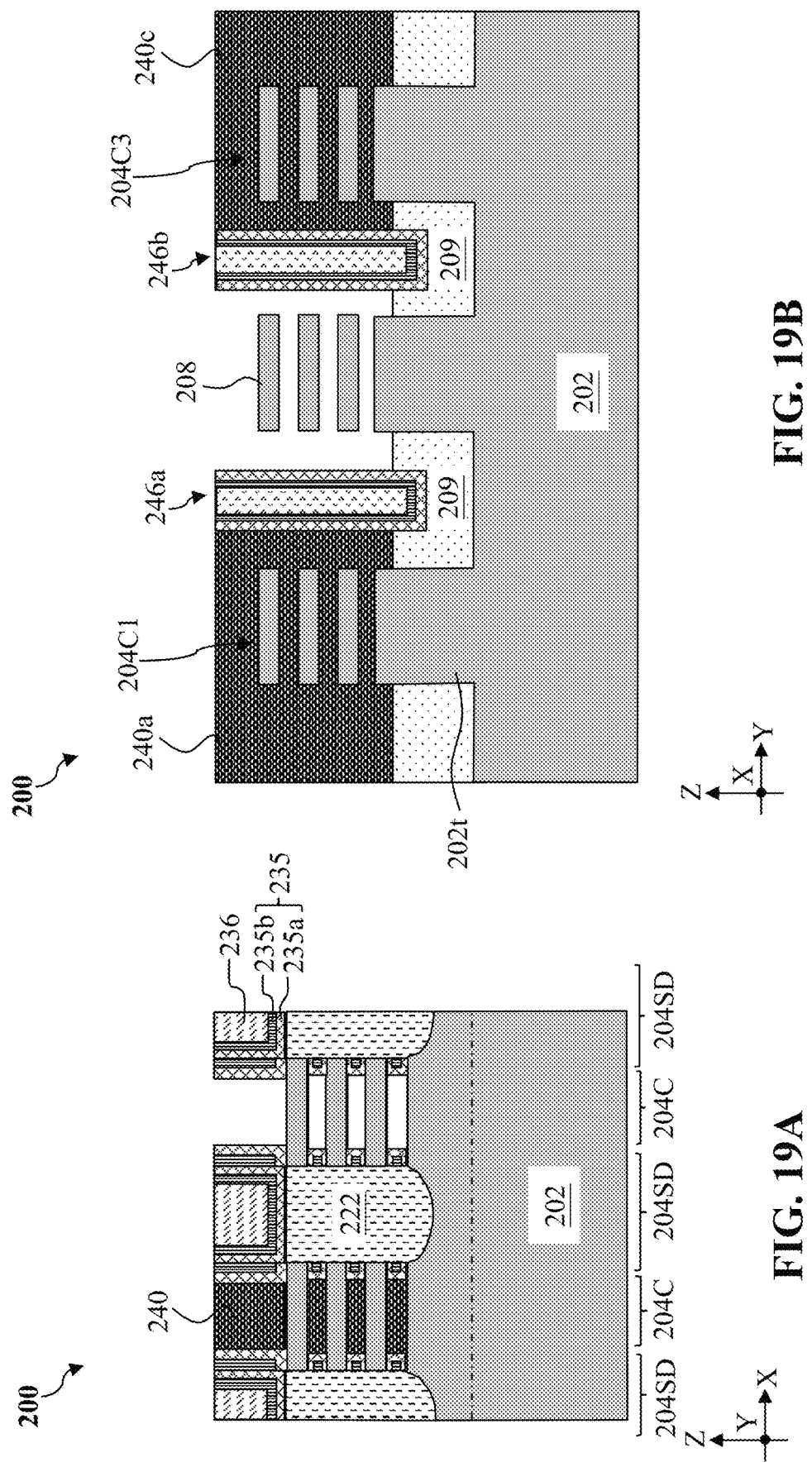
FIGS. 19A, 20A and 21A illustrate fragmentary cross-sectional views of the workpiece taken along line A-A' as shown in FIG. 18 during various fabrication stages in the method of FIG. 1, according to one or more aspects of the present disclosure.
FIGS. 19B, 20B and 21B illustrate fragmentary cross-sectional views of the workpiece taken along line B-B' as shown in FIG. 18 during various fabrication stages in the method of FIG. 1, according to one or more aspects of the present disclosure.
Figures 20A, 20B:
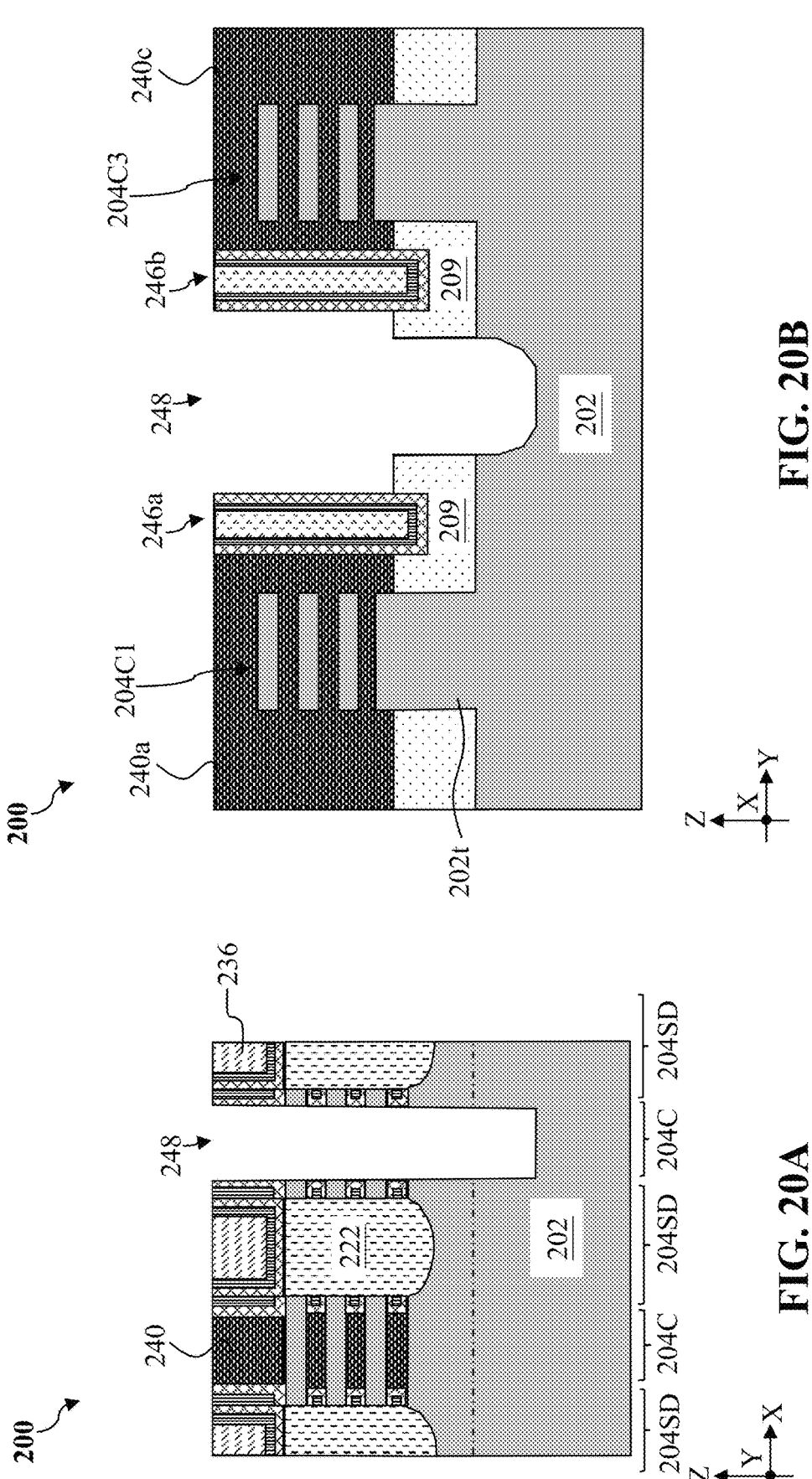
Figures 21A, 21B:
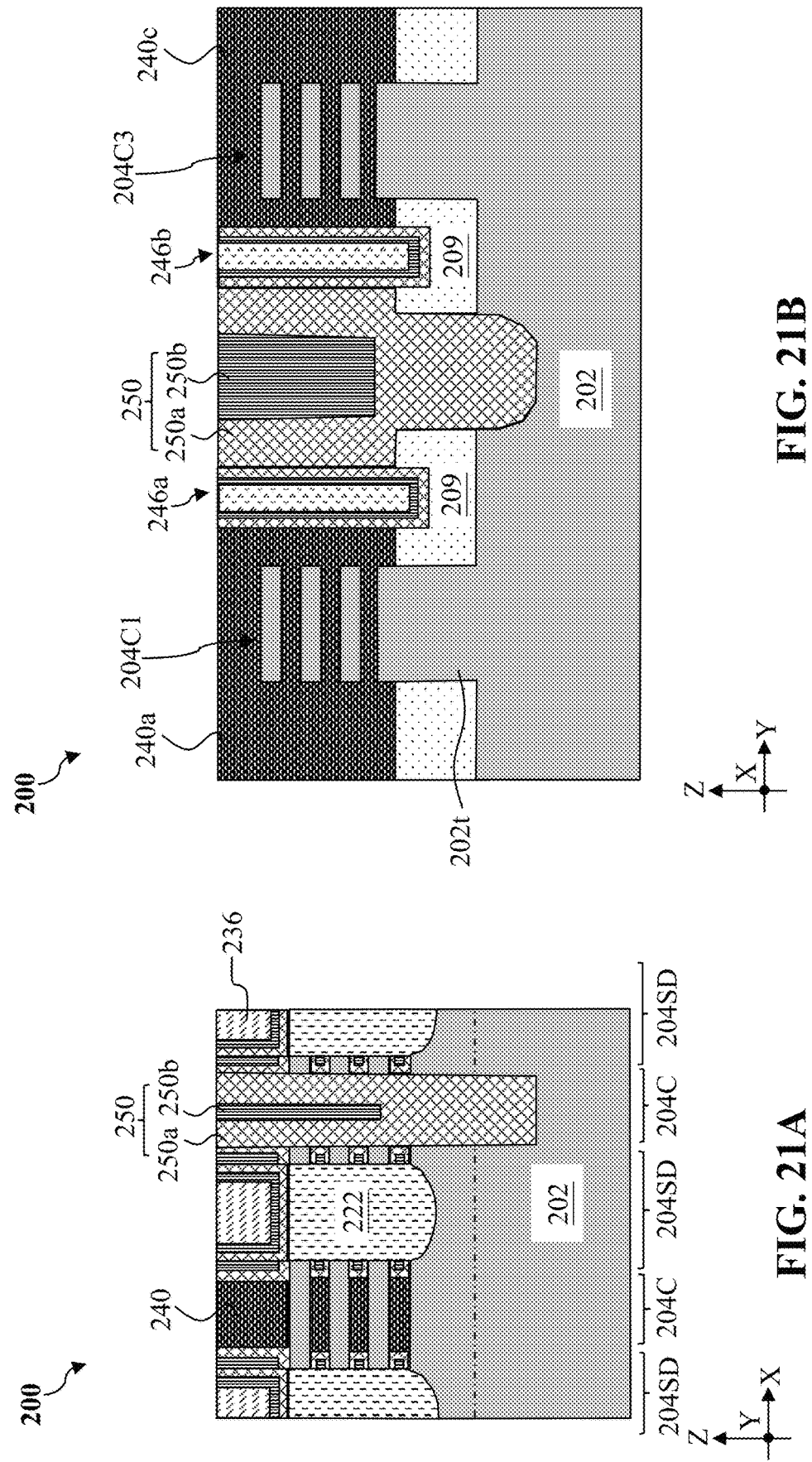
Figure 21C:
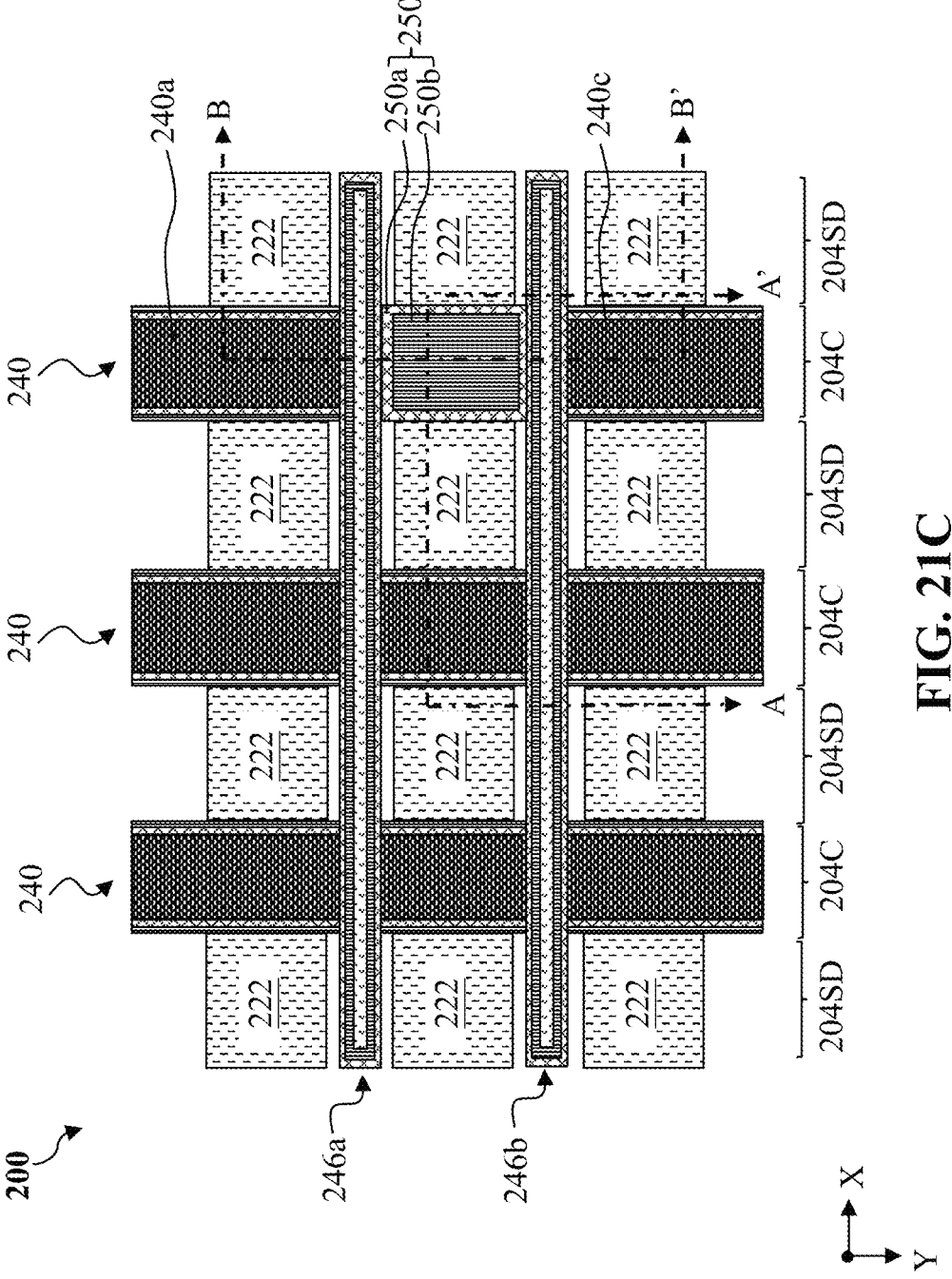
FIG. 21C illustrates a fragmentary view of a workpiece 200, according to various aspects of the present disclosure.
Figures 22A, 22B:
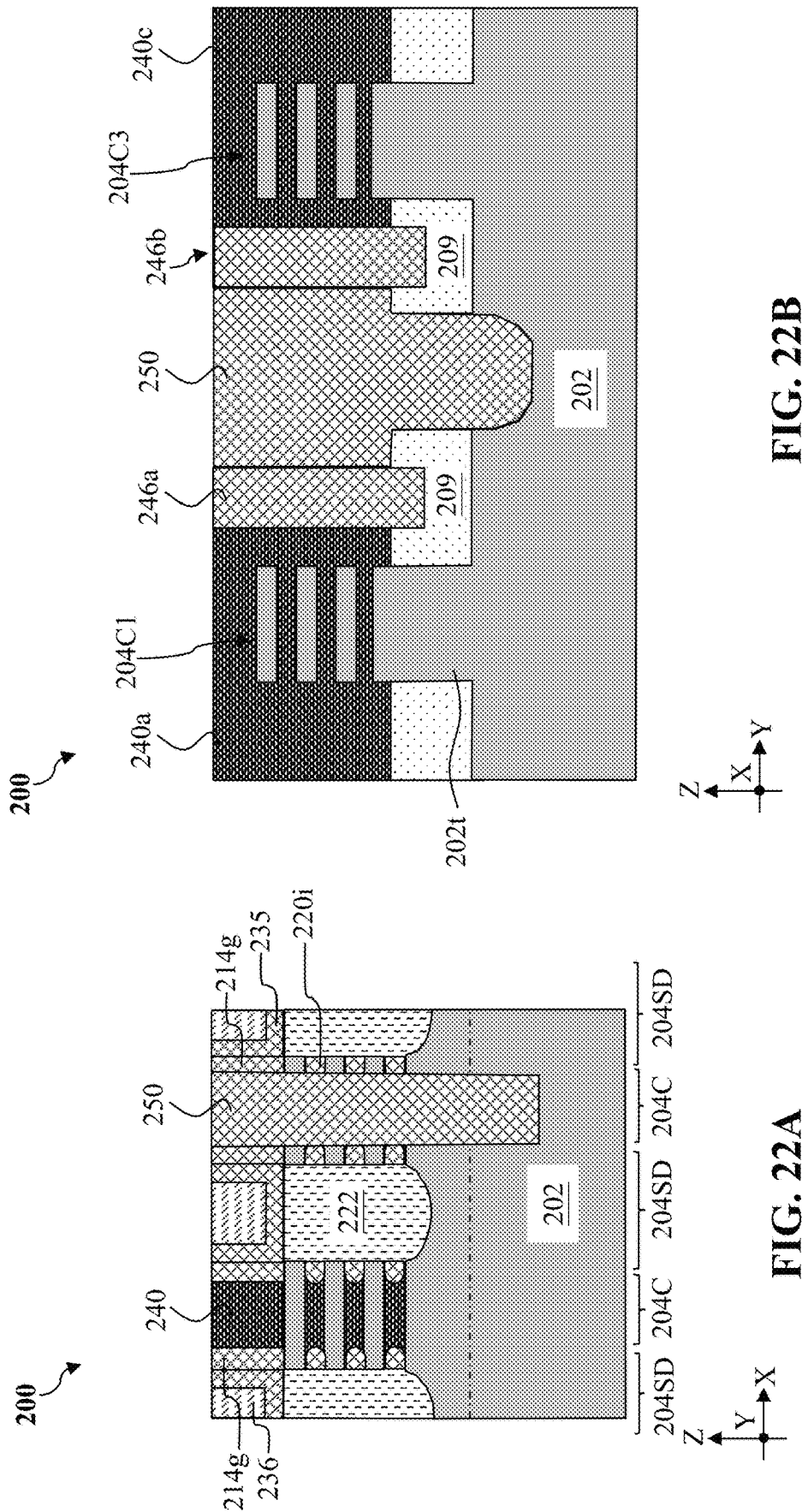
FIGS. 22A and 22B illustrate fragmentary cross-sectional views of an alternative workpiece, according to one or more aspects of the present disclosure.
Figure 22D:
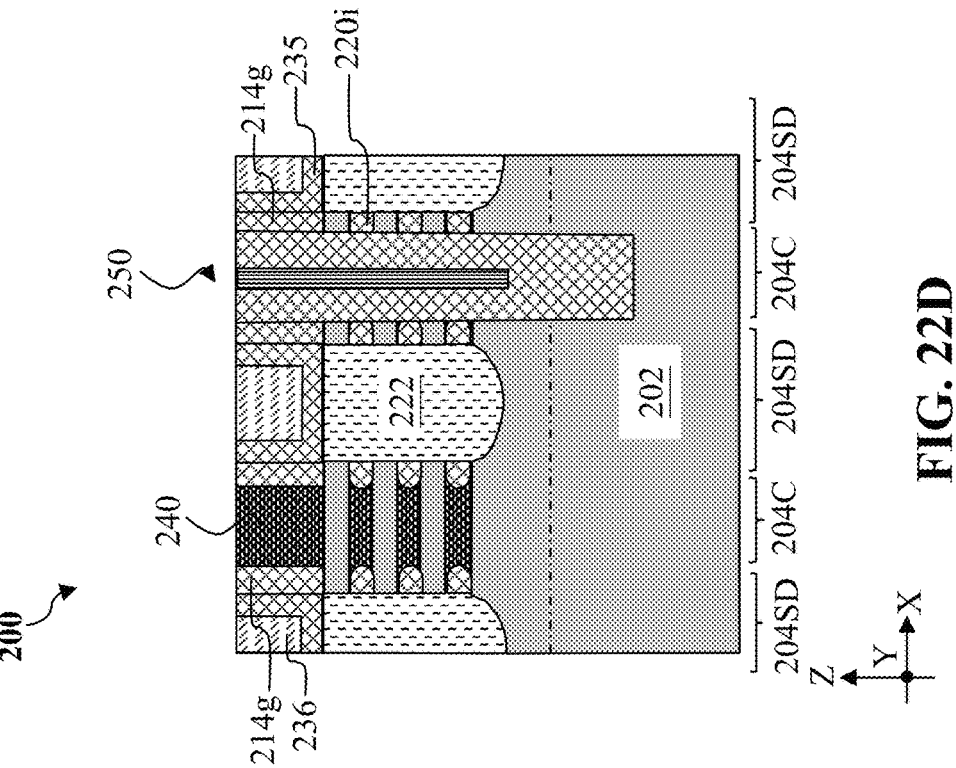
FIGS. 22C and 22D illustrate fragmentary cross-sectional views of alternative workpieces, according to one or more aspects of the present disclosure.
Figure 22C:
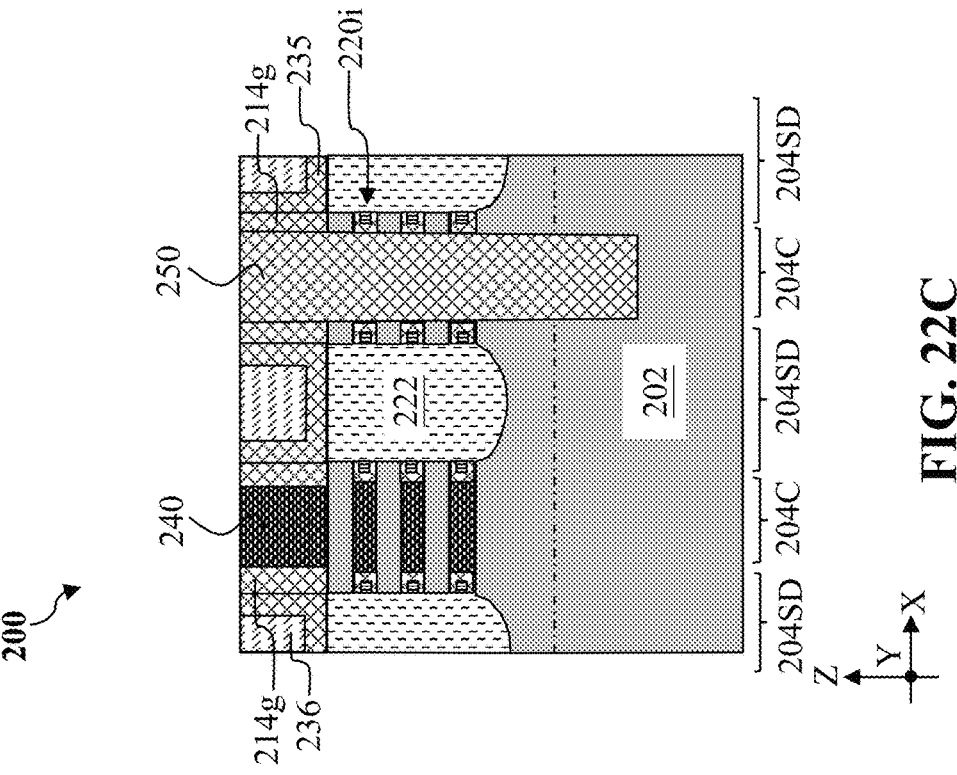

Referring to FIGS. 1, 19A-19B, and 20A-20B, method 100 includes a block 124 where the second portion 240*b* of the gate structure 240 and a portion of channel layers 208 thereunder are removed to form a CPODE trench 248. Reference is first made to FIGS. 19A-19B. After forming the first gate isolation structure 246*a* and the second gate isolation structure 246*b*, a patterned mask film (not shown) may be formed over the gate structure 240 to expose the second portion 240*b* of the gate structure 240. A first etching process may be performed to selectively remove the second portion 240*b* of the gate structure 240. As depicted in FIGS. 19A-19B, after the performing of the etching process, channel layers 208 in the channel region 204C2 that were previously surrounded by the second portion 240*b* of the gate structure 240 are exposed. In an embodiment, the first etching process is a wet etching process. Reference is now made to FIGS. 20A-20B. After the selective removal of the second portion 240*b* of the gate structure 240, a second etching process may be performed to selectively remove the channel layers 208 in the channel region 204C2 without substantially etching the first gate isolation structure 246a, the second gate isolation structure 246b, the inner spacer features 220i, the gate spacers 214g, and the isolation feature 209, thereby forming the CPODE trench 248. In the present embodiment, the duration of the second etching process is controlled such that the CPODE trench 248 extends through the isolation feature 209 and extends into the substrate 202. As depicted in FIG. 20B, after the second etching process, a bottom surface of the CPODE trench 248 is lower than a bottom surface of the isolation feature 209 and bottom surfaces of the first and second gate isolation structures 246a-246b.

Referring to FIGS. 1 and 21A-21C, method 100 includes a block 126 where a CPODE structure 250 is formed in the CPODE trench 248. In the present embodiments, the CPODE structure 250 is a bi-layer structure and includes a first dielectric layer 250a extending along sidewall and bottom surfaces of a second dielectric layer 250b. The formation of the CPODE structure 250 may include conformally depositing a first dielectric material layer over the workpiece 200, depositing a second dielectric material layer over the first dielectric material layer to substantially fill the CPODE trench 248, and performing a planarization process (e.g., CMP) to remove excess portions of the first dielectric material layer and the second dielectric material layer. In an embodiment, the first dielectric material layer includes boron nitride, and the second dielectric material layer includes in-situ formed silicon nitride or in-situ formed silicon carbonitride. Due to similar reasons stated above with reference to FIGS. 4 and 5, providing the bi-layer CPODE structure 250 formed of boron nitride that capped by a material (e.g., SiN, SiCN) that is free of oxygen and less easily to be oxidized than boron nitride may advantageously reduce parasitic capacitance of the final structure of the workpiece 200. In embodiments represented in FIGS. 21B and 21C, the CPODE structure 250 is in direct contact with both the first and second gate isolation structures 246a-246b.

Referring to FIG. 1, method 100 includes a block 128 where further processes are performed to finish the fabrication of the workpiece 200. Such further processes may include forming source/drain contacts electrically coupled to source/drain features. Such further processes may also include forming a multi-layer interconnect (MLI) structure (not depicted) over the workpiece 200. In some embodiments, the MLI structure may include multiple intermetal dielectric (IMD) layers and multiple metal lines or contact vias in each of the IMD layers. In some instances, the IMD layers and the ILD layer 236 may share similar composition. The metal lines and contact vias in each IMD layer may be formed of metal, such as aluminum, tungsten, ruthenium, or copper. In some embodiments, the metal lines and contact vias may be lined by a barrier layer to insulate the metal lines and contact vias from the IMD layers.

In embodiments depicted above, gate spacers 214g, inner spacer features 220i, CESL 235, gate isolation structures 246a-246b, and/or the CPODE structure 250 in the workpiece 200 include a bi-layer structure that is formed of a first material layer capped with a second material layer. The first material layer (e.g., boron nitride) has a low-k dielectric constant and a high density, and the second material layer (e.g., silicon nitride) is oxygen-free and is less easily to be oxidized than the first material layer. In an alternative embodiment, one or more of the dielectric structures (e.g., gate spacers 214g, inner spacer features 220i, CESL 235, gate isolation structures 246a-246b, CPODE structure 250) may be a single-layer structure that includes the first material layer to further reduce the parasitic capacitance of the workpiece 200. For example, in embodiments represented in FIGS. 22A-22B, each of the gate spacers 214g, inner spacer features 220i, CESL 235, gate isolation structures 246a-246b, and the CPODE structure 250 is a single-layer structure and includes boron nitride. In another alternative embodiment, for the dielectric structures (e.g., gate spacers 214g, inner spacer features 220i, CESL 235, gate isolation structures 246a-246b, and/or CPODE structure 250) in the workpiece 200, one or more of the dielectric structures may be a single-layer structure that includes the first material layer to further reduce the parasitic capacitance of the workpiece 200. For example, in a first embodiment represented in FIG. 22C, each of the gate spacers 214g is a single-layer structure, and the inner spacer features 220i are bi-layer structures, and the gate isolation structures 246a-246b, CESL 235, and CPODE structure 250 may be single layer or bi-layer structures. In a second embodiment represented in FIG. 22D, each of the inner spacer features 220i is a single-layer structure, and the gate spacers 214g, the gate isolation structures 246a-246b, CESL 235, and CPODE structure 250 may be single layer or bi-layer structures. In a third embodiment, the CESL 235 is a single-layer structure, and the gate spacers 214g, inner spacer features 220i, gate isolation structures 246a-246b, and CPODE structure 250 may be single layer or bi-layer structures. In a fourth embodiment, the CPODE structure 250 is a single-layer structure, and the gate spacers 214g, CESL 235, inner spacer features 220i, and the gate isolation structures 246a-246b, may be single layer or bi-layer structures. In a fifth embodiment, the gate isolation structures 246a-246b is a single-layer structure, and the gate spacers 214g, CESL 235, inner spacer features 220i, and the CPODE structure 250 may be single layer or bi-layer structures. It is understood that different combinations of the dielectric structures having bi-layer structures or single-layer structures are within the scope of the present disclosure.

In the above embodiments, the bi-layer structure is implemented in the fabrication of GAA transistors. It is understood that the bi-layer structure may be further implemented in the fabrication of planar transistors, FinFETs, CFETs or other suitable devices. FIG. 23 illustrates a flow chart of a method for forming a vertical local interconnect (VLI) structure in a workpiece that includes CFET, according to one or more aspects of the present disclosure.

Figure 24:
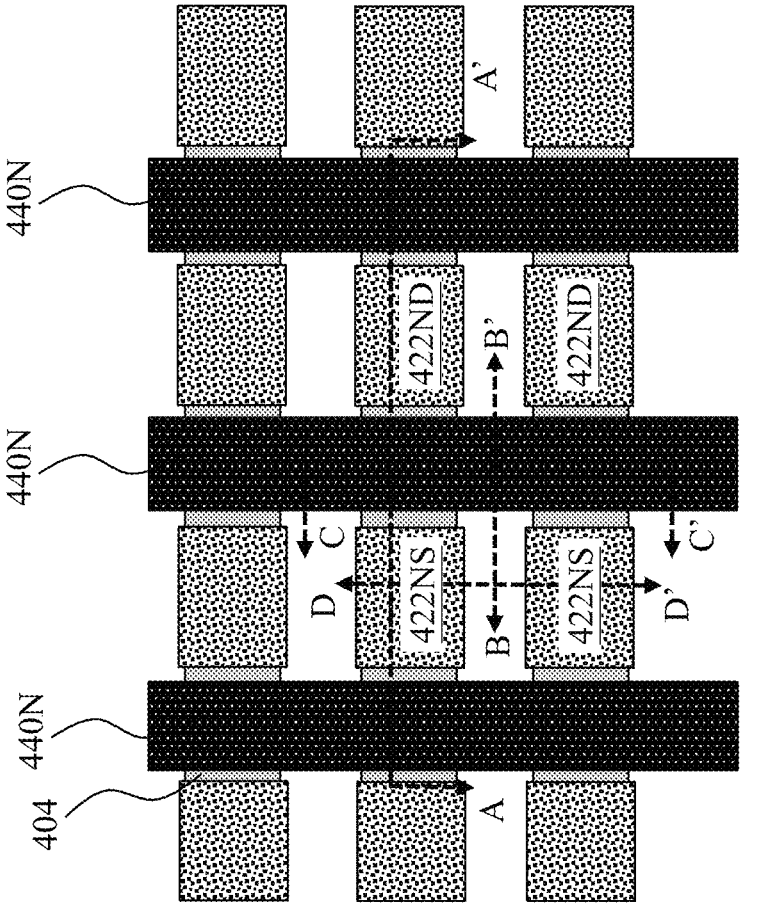
FIG. 24 illustrates a fragmentary top view of an exemplary workpiece to undergo various stages of operations in the method of FIG. 23, according to various aspects of the present disclosure.
Figure 25:
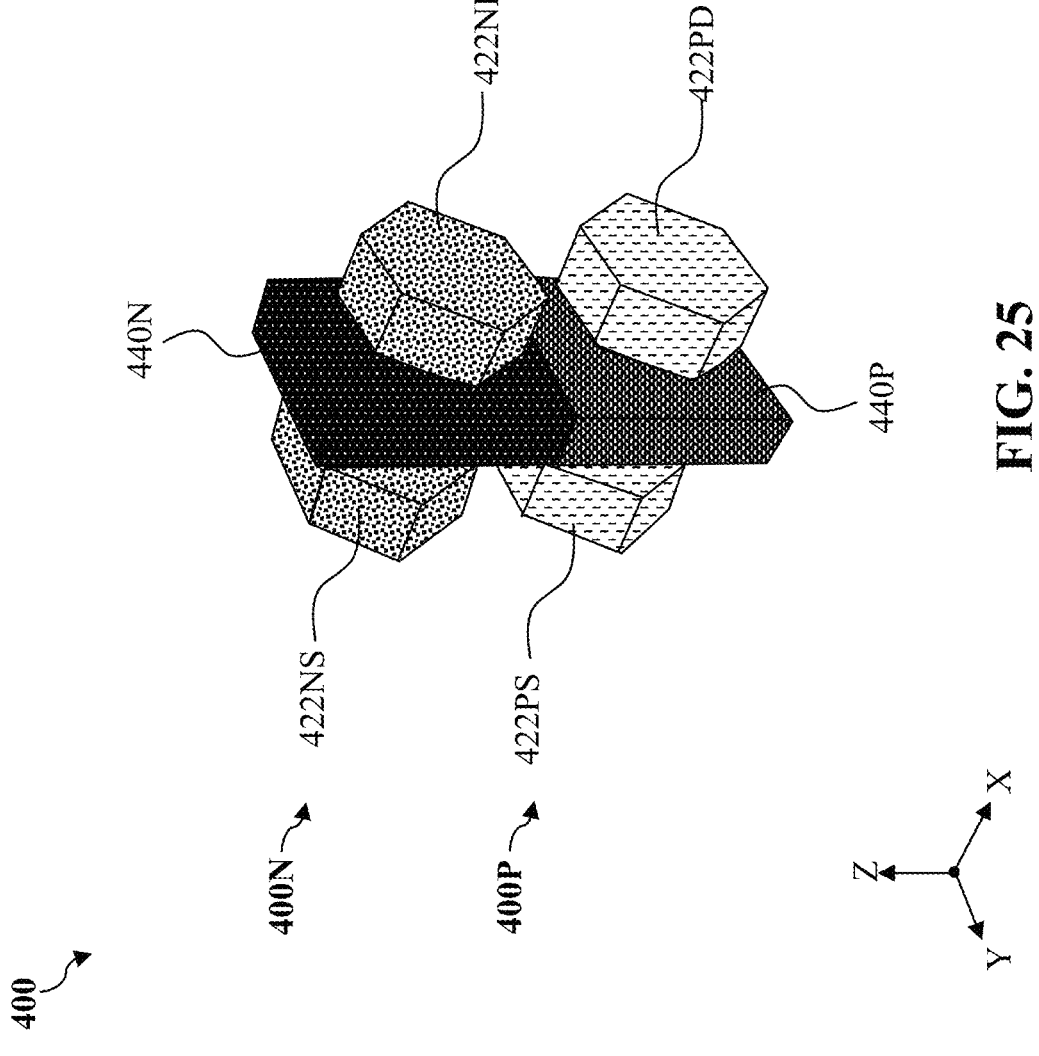
FIG. 25 illustrates a fragmentary perspective view of the exemplary workpiece shown in FIG. 24, according to various aspects of the present disclosure.

Referring to FIGS. 23, 24, 25 and 26A-26D, method 300 includes a block 302 where a workpiece 400 is received. FIG. 24 depicts a fragmentary top view of the workpiece 400 to undergo various stages of operations in the method of FIG. 23, according to various aspects of the present disclosure. FIG. 25 illustrates a simplified fragmentary perspective view of the workpiece 400 shown in FIG. 24, according to various aspects of the present disclosure. FIGS. 26A-26D illustrate fragmentary cross-sectional views of the workpiece 400 taken along line A-A', B-B', C-C' and D-D', respectively, as shown in FIG. 24.

The workpiece 400 is similar to the workpiece 200 described with reference to FIG. 13. One of the differences between the workpiece 400 and the workpiece 200 is that the workpiece 400 includes a CFET that has an n-type GAA transistor 400N formed over a p-type GAA transistor 400P. More specifically, the workpiece 400 includes active regions 404 (shown in FIGS. 24 and 26A) having channel regions and source/drain regions. Two adjacent active regions 404 are separated by an isolation feature (e.g., STI feature) 209 (shown in FIG. 26B). Each of the channel regions of the active regions 404 includes a number of channel members 408. The channel member 408 is similar to the channel member 208 and may include silicon. The n-type GAA transistor 400N includes a gate structure 440N wrapping around and over upper portions of the channel members 408 in the channel regions of the active region 404, a source feature 422NS formed in and over a source/drain region of the active region 404, and a drain feature 422ND formed in and over another source/drain region of the active region 404. In the present embodiment, the gate structure 440N is similar to the gate structure 240 and includes n-type work function metal layer(s). The source feature 422NS and drain feature 422ND may be similar to the source/drain features 222 and include n-type dopant(s).

The p-type GAA transistor 400P includes a gate structure 440P wrapping around lower portions of the channel members 408 in the channel regions of the fin-shaped active regions 404, a source feature 422PS under the source feature 422NS, and a drain feature 422PD under the drain feature 422ND. The gate structure 440P is similar to the gate structure 240 and includes p-type work function metal layer(s). The source feature 422PS and drain feature 422PD may be similar to the source/drain features 222 and include p-type dopant(s). The workpiece 400 also includes fin sidewall spacers 411 (shown in FIG. 26D) formed over the isolation feature 209 and extending along portions of sidewall surfaces of the source feature 422PS and drain feature 422PD. The fin sidewall spacers 411 may be formed along with the gate spacers 214g, and thus a composition of the fin sidewall spacers 411 may be the same as a composition of the gate spacers 214g.

Figures 26A, 26B:
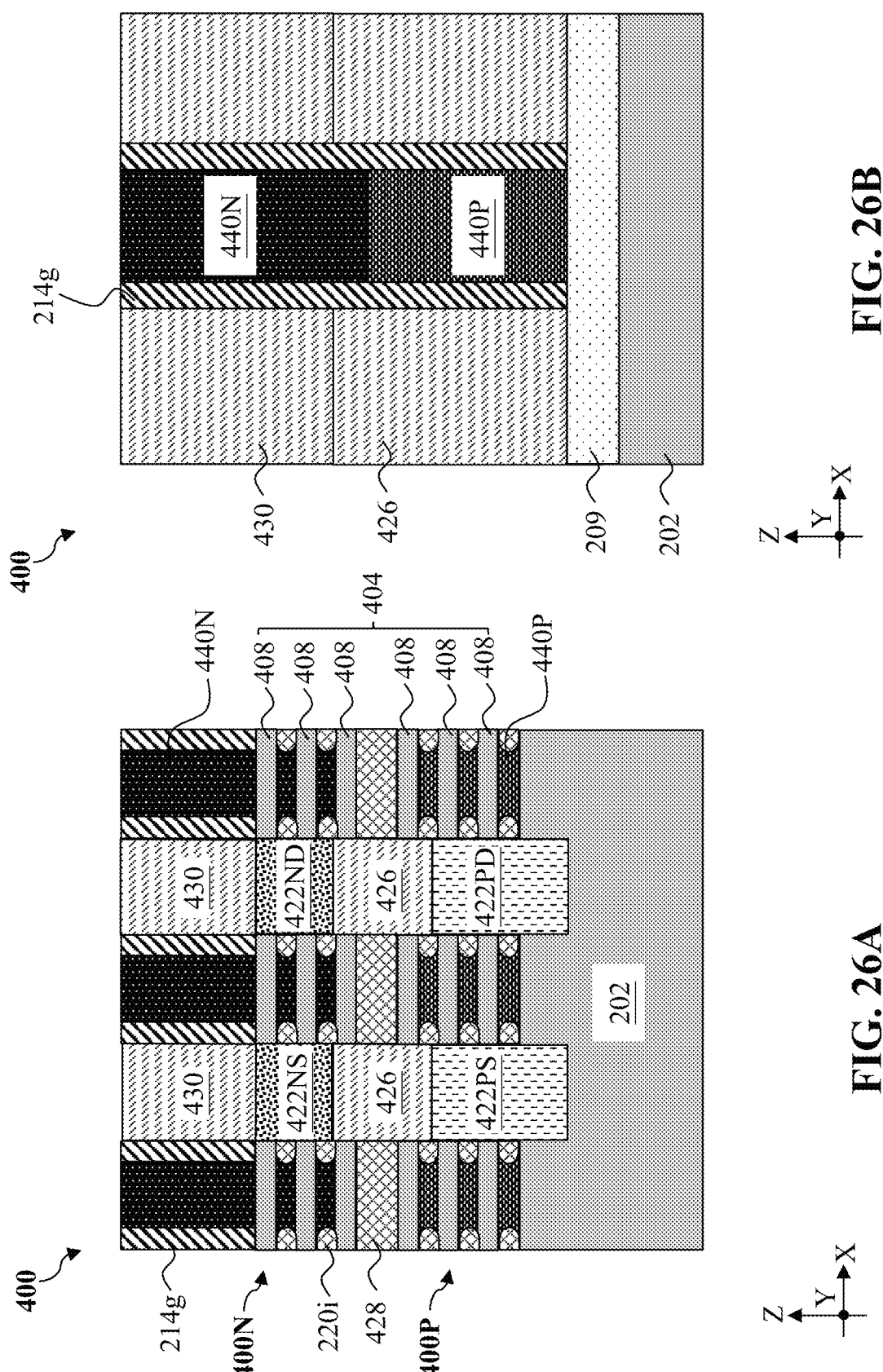
FIGS. 26A, 26B, 26C, and 26D illustrate fragmentary cross-sectional views of the workpiece taken along line A-A', B-B', C-C', and D-D' as shown in FIG. 24, according to various aspects of the present disclosure.
Figures 26C, 26D:
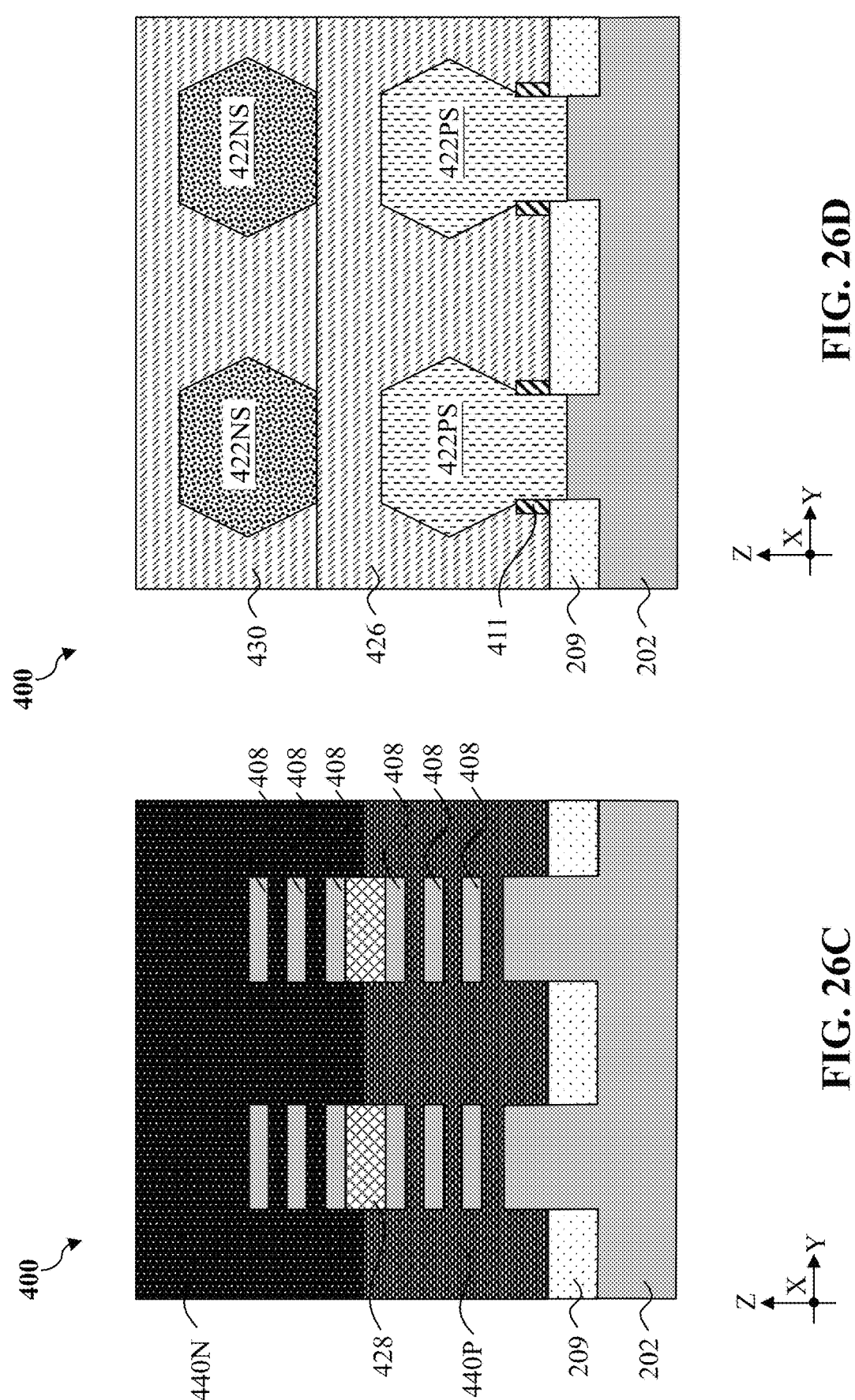
Figures 27A, 27B:
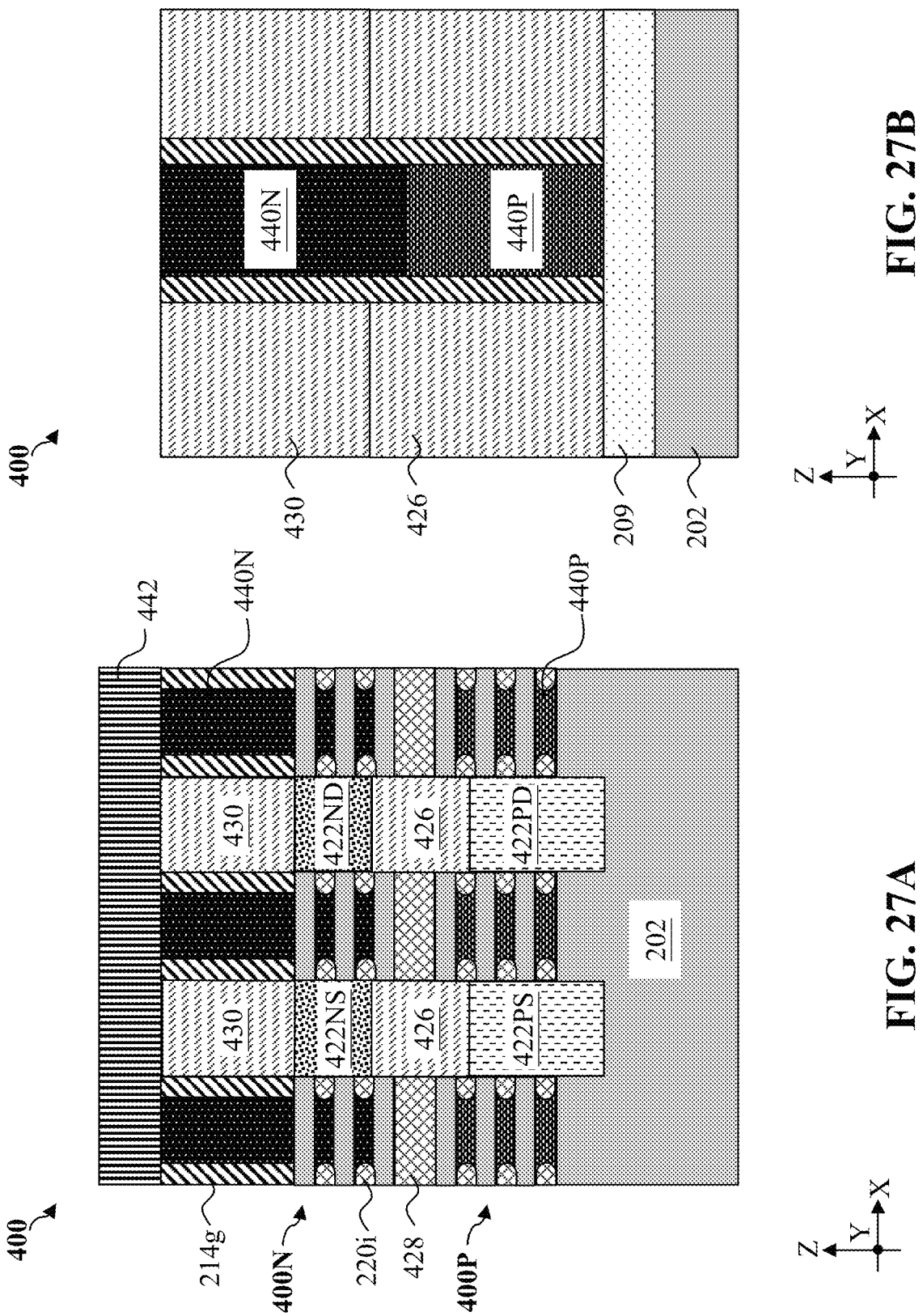
FIGS. 27A, 28A, 29A, 30A, 31A, 32A and 33A illustrate fragmentary cross-sectional views of the workpiece taken along line A-A' as shown in FIG. 24 during various fabrication stages in the method of FIG. 23, according to one or more aspects of the present disclosure.
FIGS. 27B, 28B, 29B, 30B, 31B, 32B and 33B illustrate fragmentary cross-sectional views of the workpiece taken along line B-B' as shown in FIG. 24 during various fabrication stages in the method of FIG. 23, according to one or more aspects of the present disclosure.
Figures 27C, 27D:
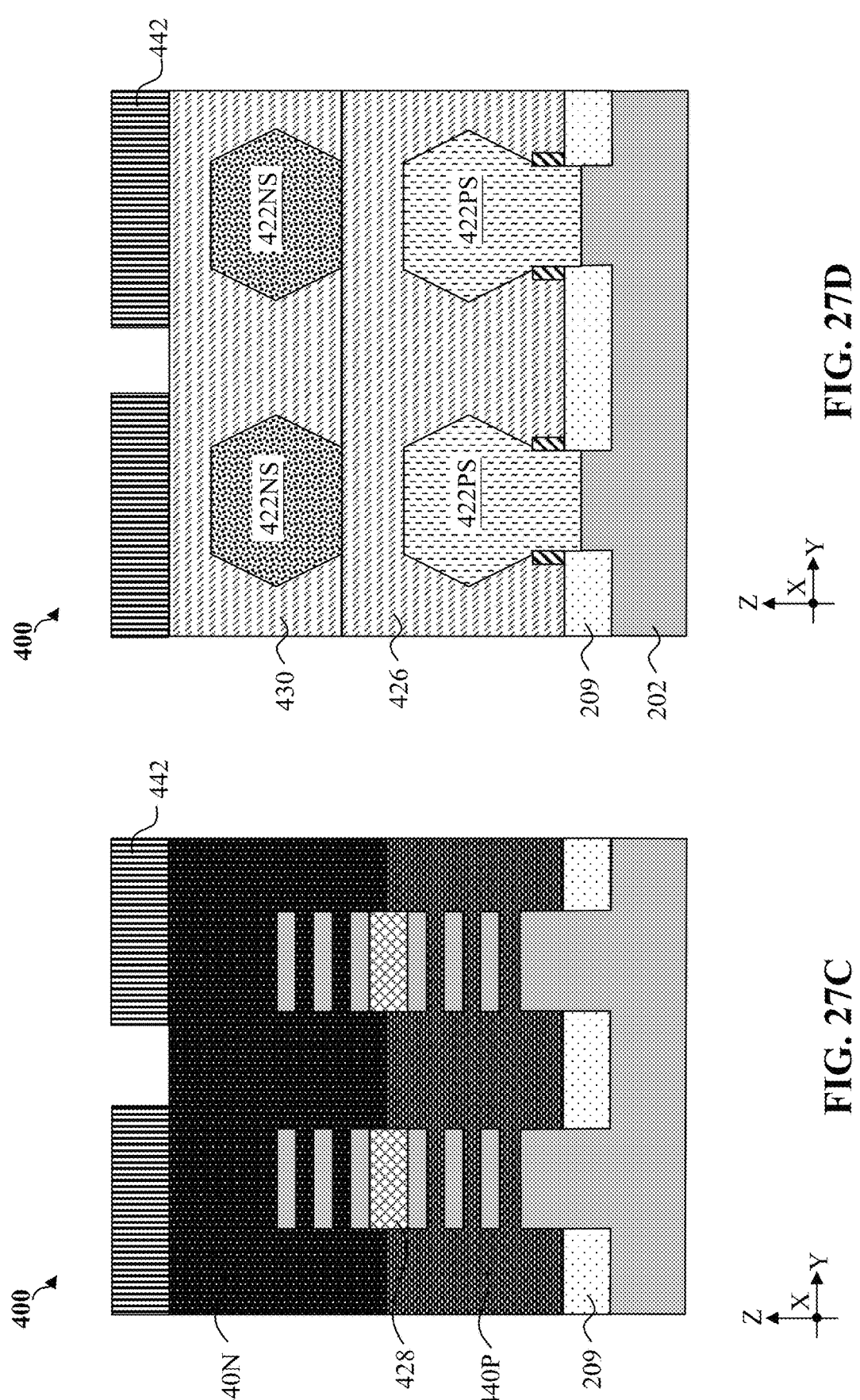
FIGS. 27C, 28C, 29C, 30C, 31C, 32C and 33C illustrate fragmentary cross-sectional views of the workpiece taken along line C-C' as shown in FIG. 24 during various fabrication stages in the method of FIG. 23, according to one or more aspects of the present disclosure.
FIGS. 27D, 28D, 29D, 30D, 31D, 32D and 33D illustrate fragmentary cross-sectional views of the workpiece taken along line D-D' as shown in FIG. 24 during various fabrication stages in the method of FIG. 23, according to one or more aspects of the present disclosure.

In embodiments represented in FIG. 26A, the source feature 422PS and the source feature 422NS are separated by a first dielectric structure 426, the drain feature 422PD and the drain feature 422ND are separated by the first dielectric structure 426. In an embodiment, the first dielectric structure 426 may include a CESL (e.g., similar to the CESL 235 and may include the single-layer structure or the bi-layer structure described above) and an ILD layer (e.g., similar to the ILD layer 236) formed over the CESL. The lower portions of the channel members 408 and the upper portions of the channel members 408 are separated by a dielectric layer 428. In some embodiments, the dielectric layer 428 may be formed along with the inner spacer features 220i or the gate spacers 214g. The workpiece 400 also includes a second dielectric structure 430 formed over the source feature 422NS and the drain feature 422ND. The composition of the second dielectric structure 430 may be similar to the composition of the first dielectric structure 426 and may includes an ILD layer formed over a CESL. In some applications, the source feature 422NS and the drain feature 422PD may be electrically coupled to fulfill some design requirements. To electrically couple the source feature 422NS and the drain feature 422PD, a vertical local interconnect (VLI) structure may be formed.

Figures 28A, 28B:
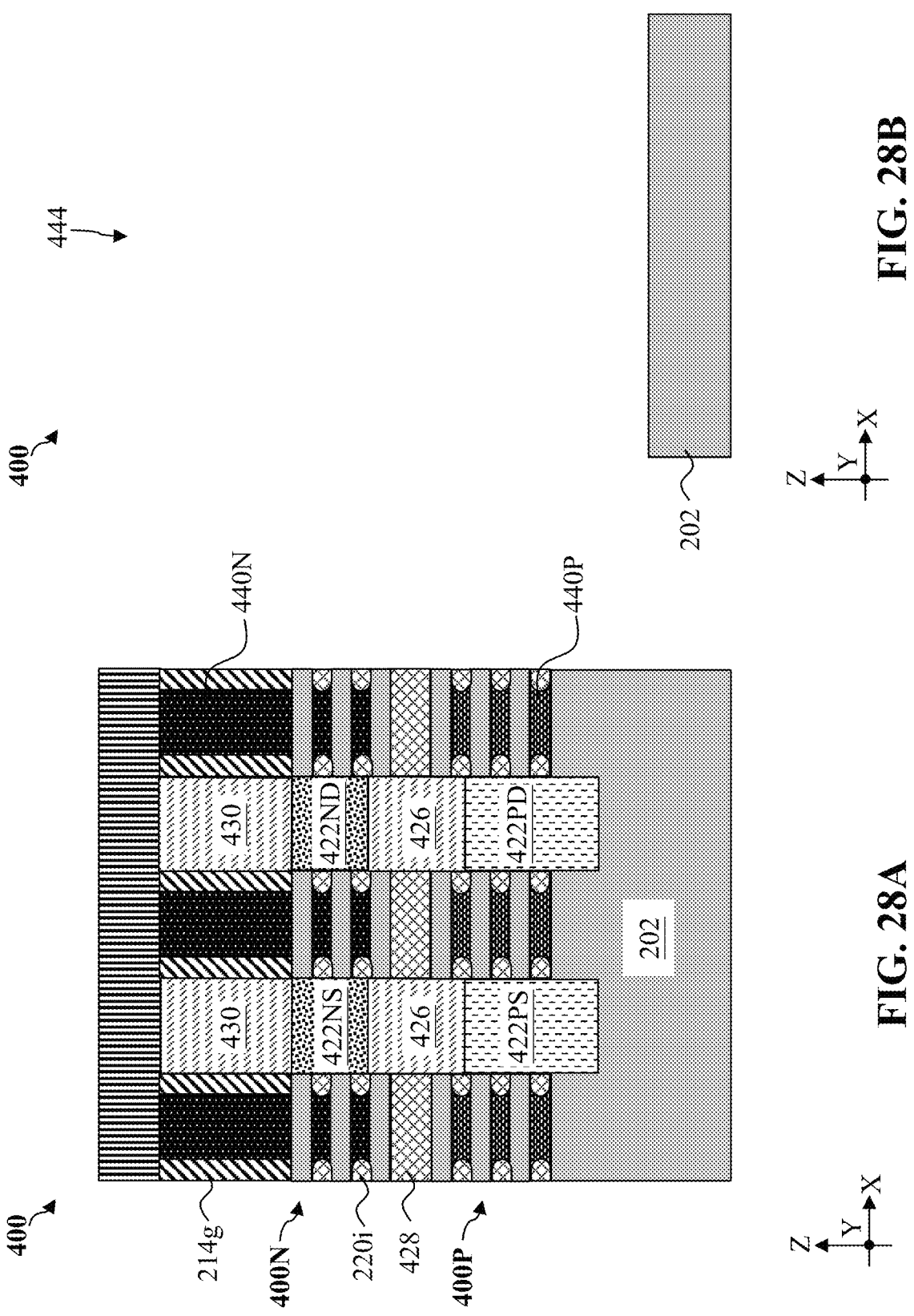
Figure 28D:
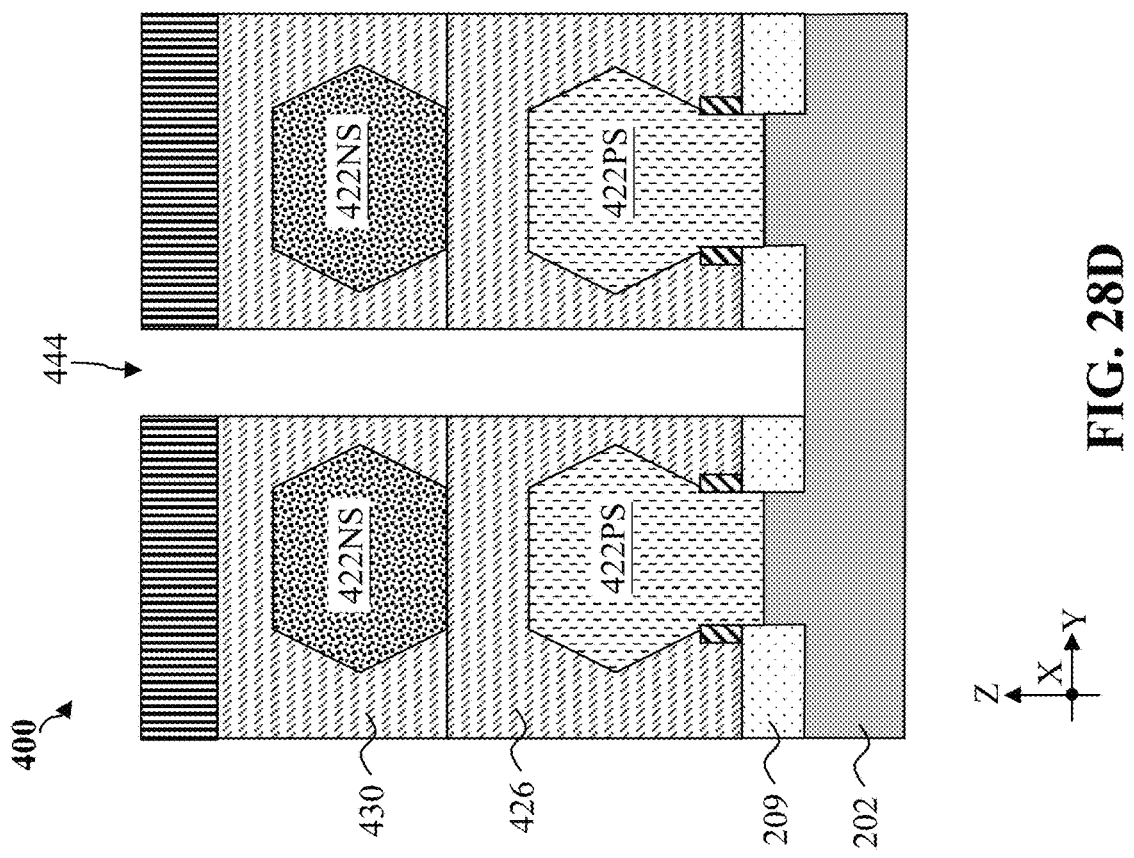
Figure 28C:
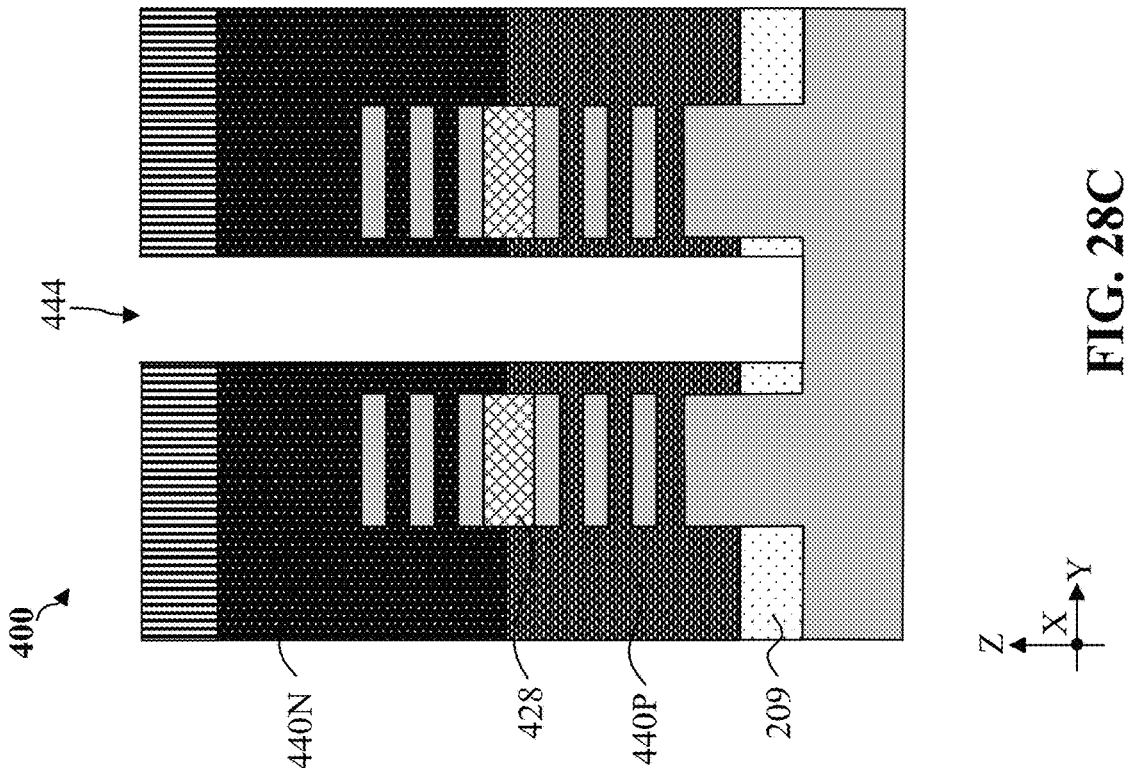
Figures 29A, 29B:
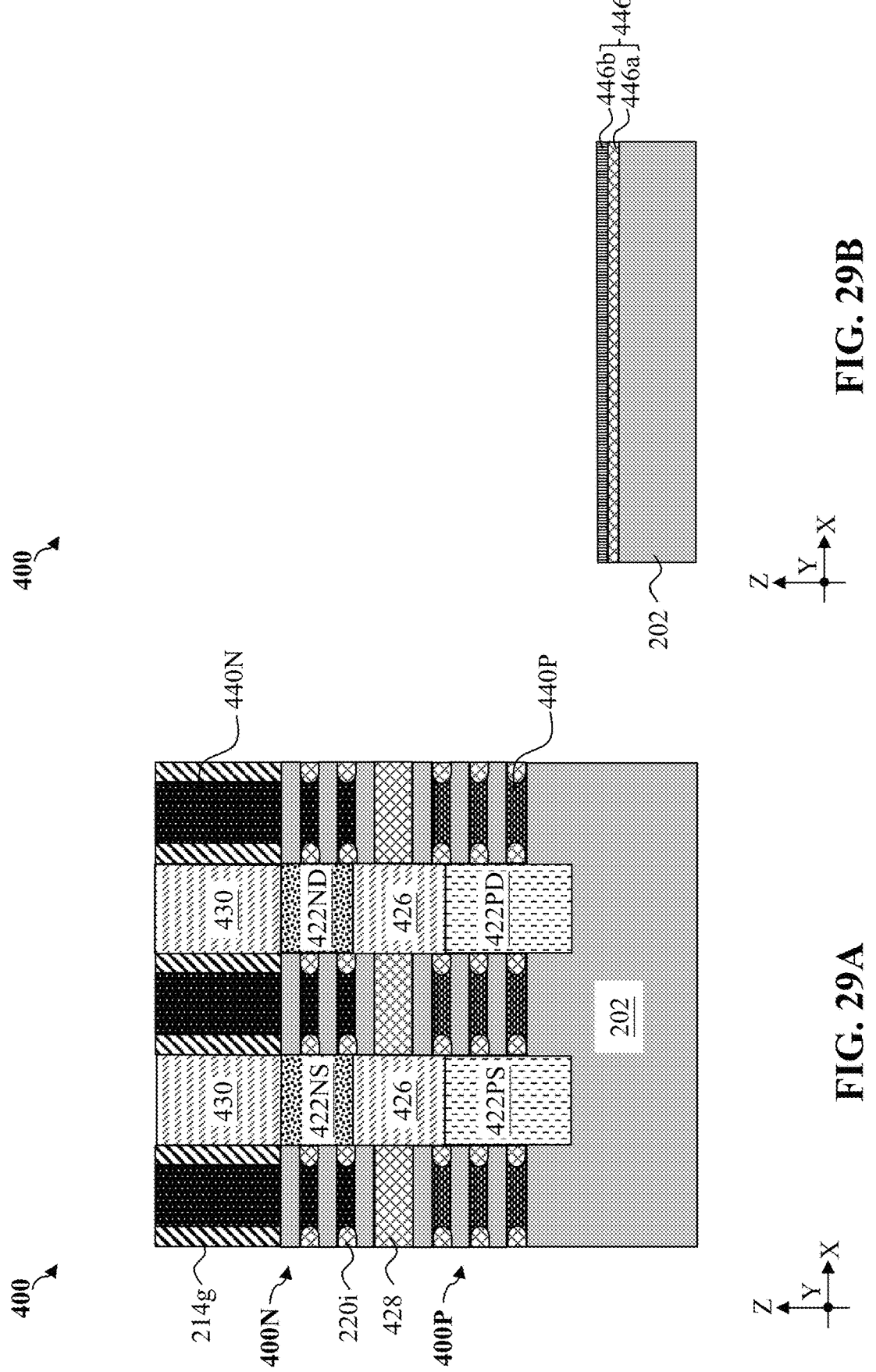
Figure 29D:
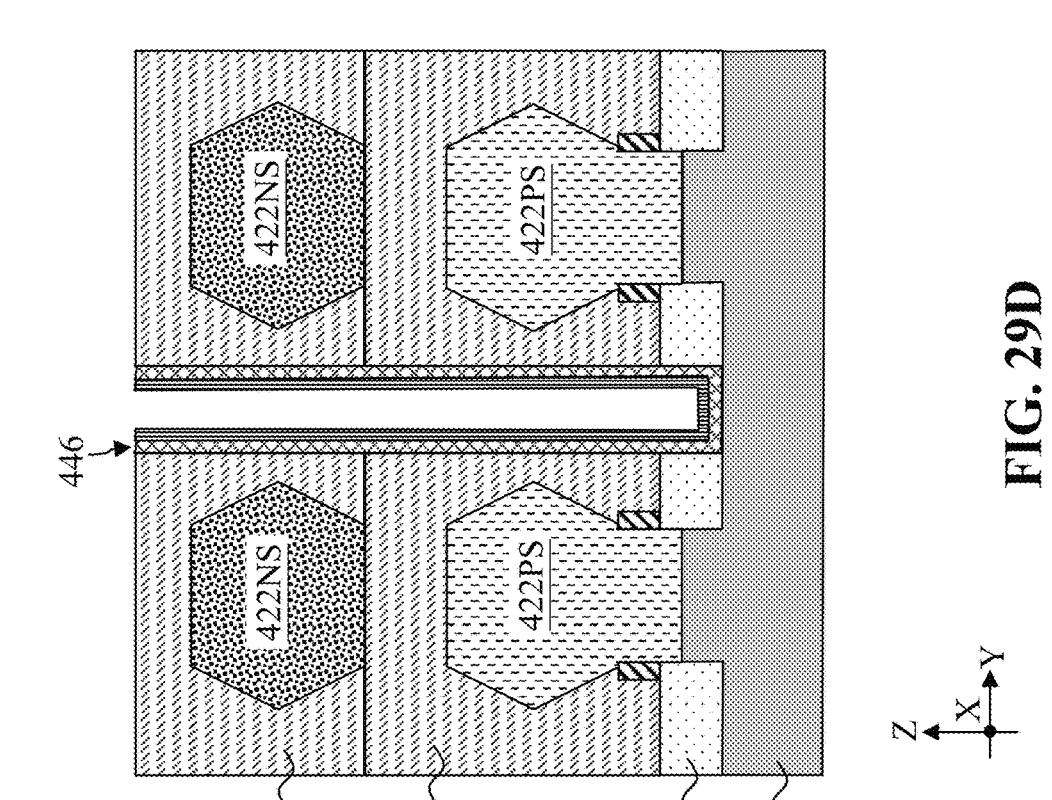
Figure 29C:
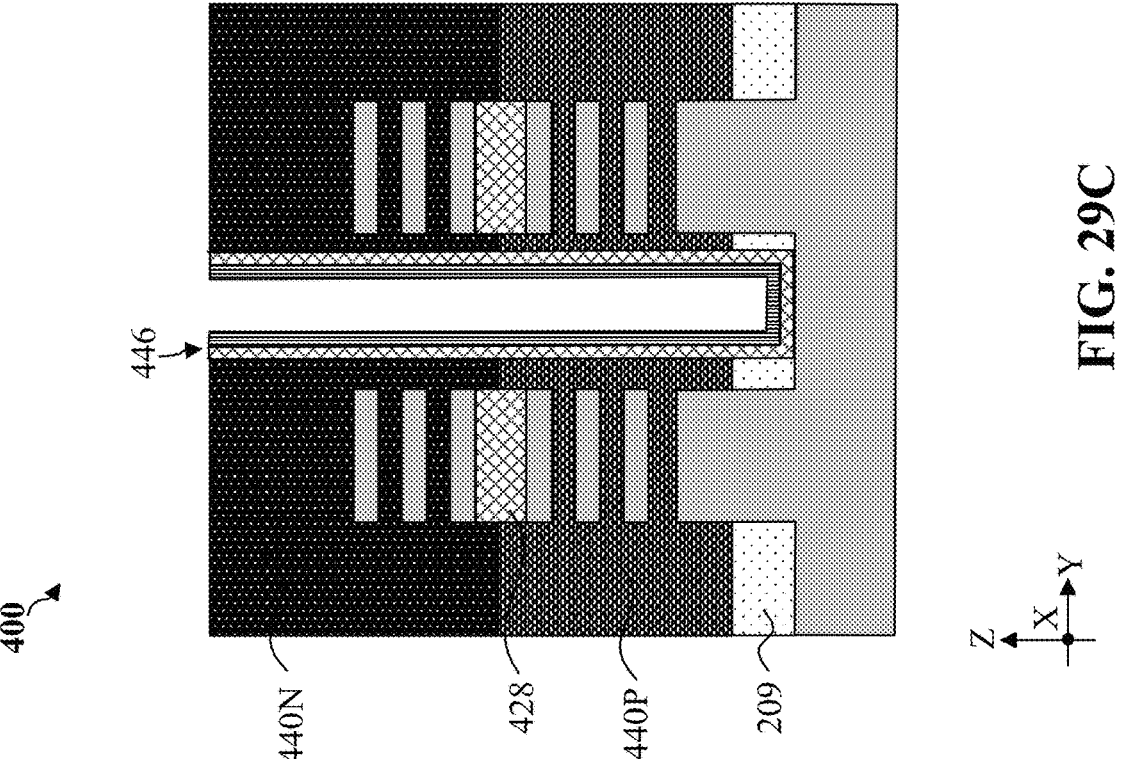
Figures 30A, 30B:
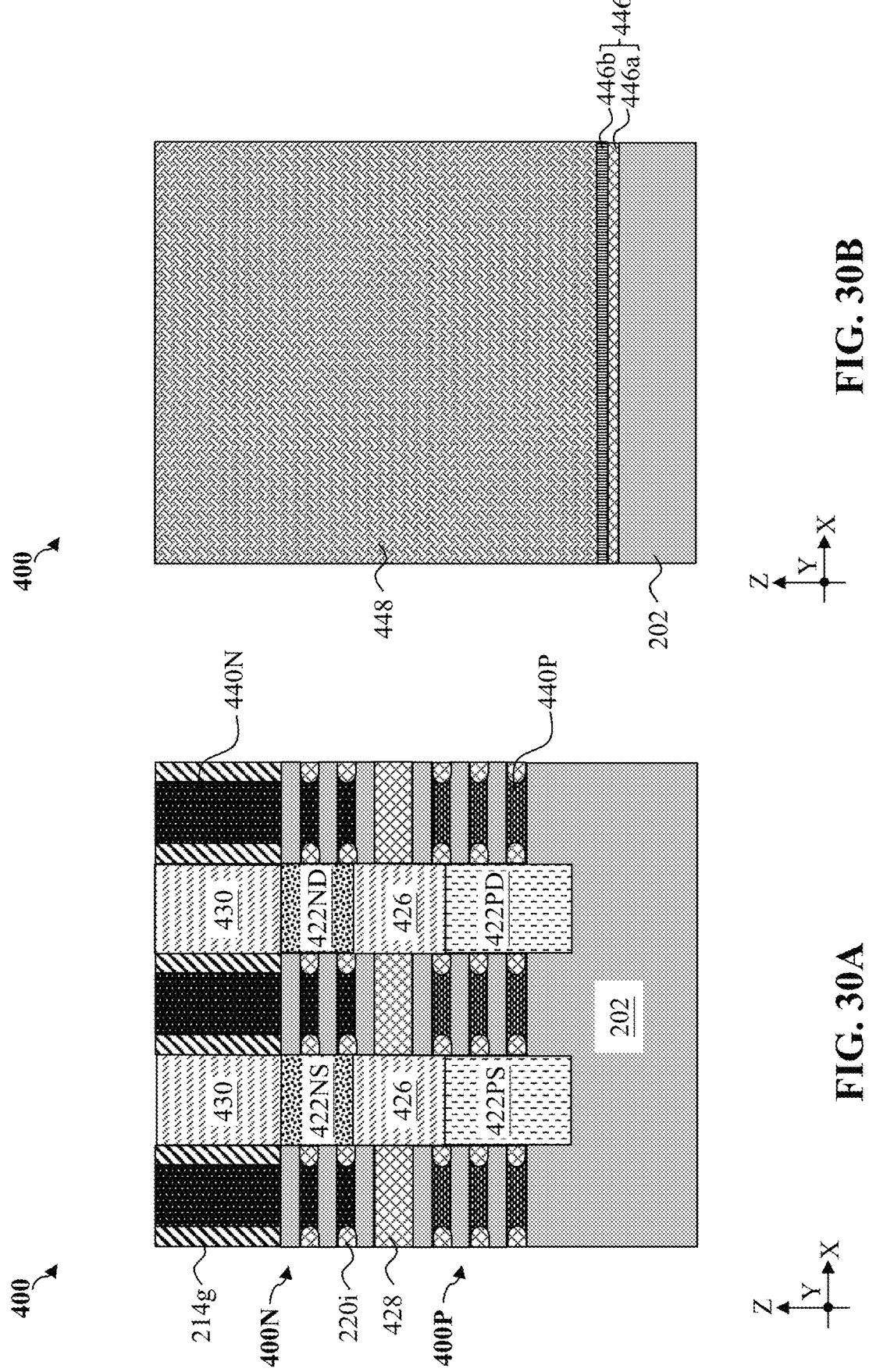
Figure 30D:
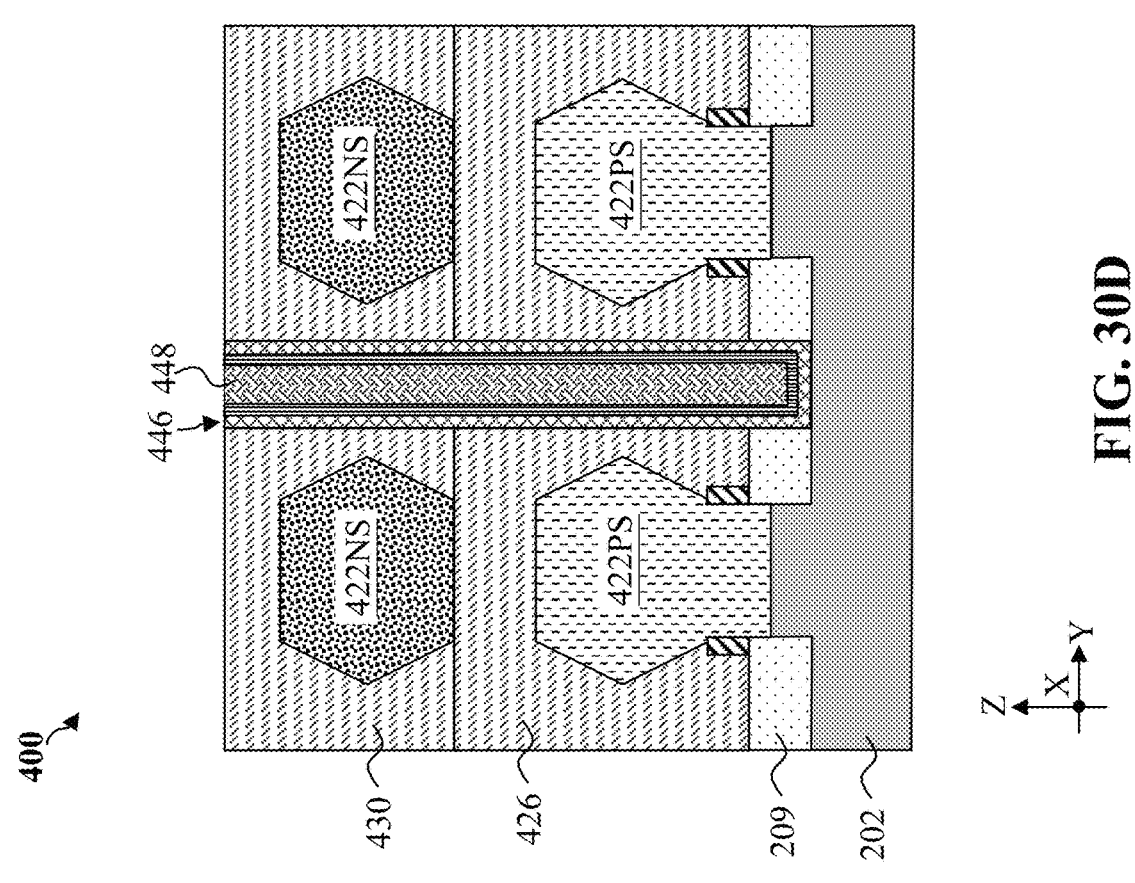
Figure 30C:
Figures 31A, 31B:
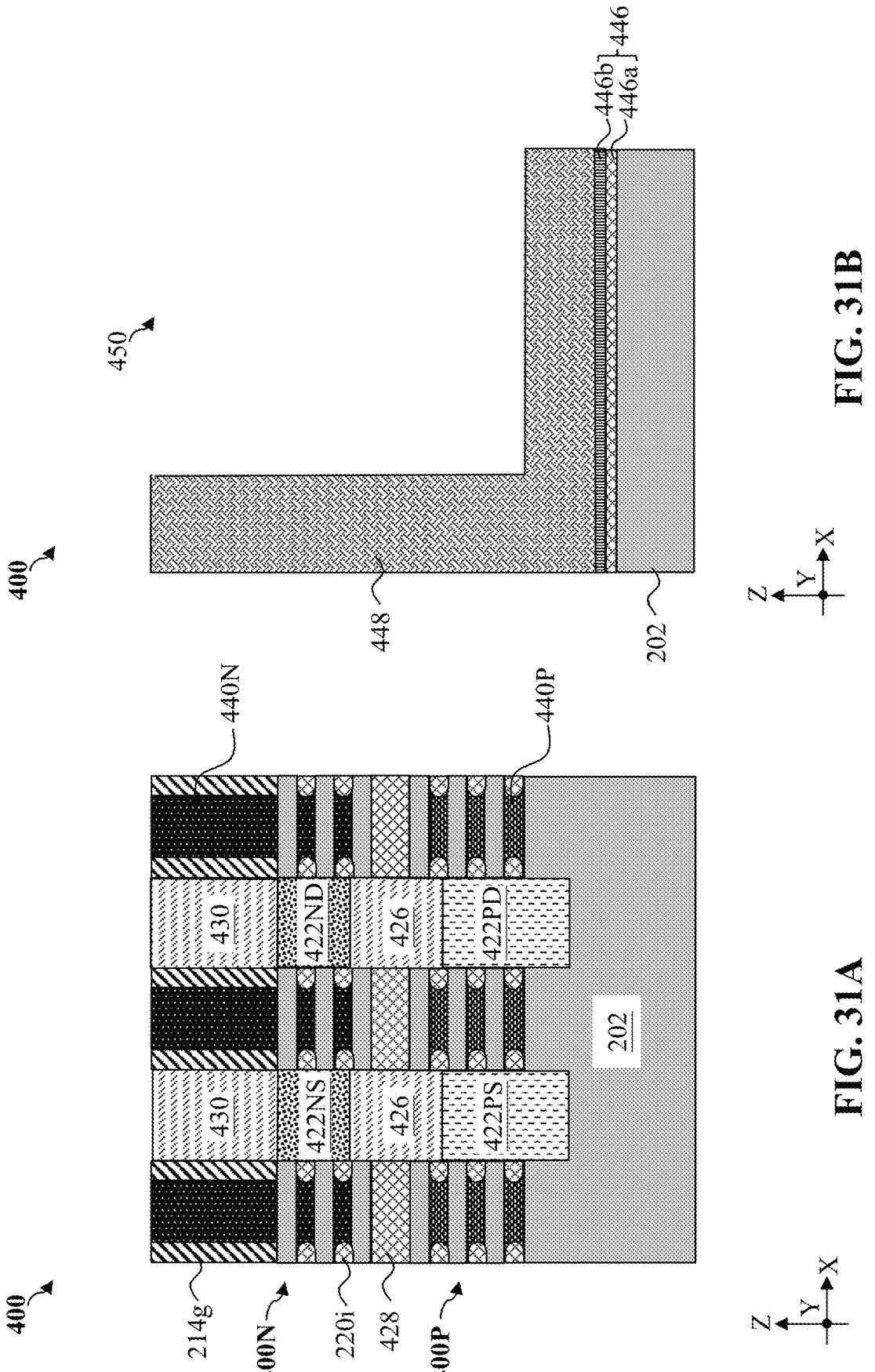
Figure 31D:
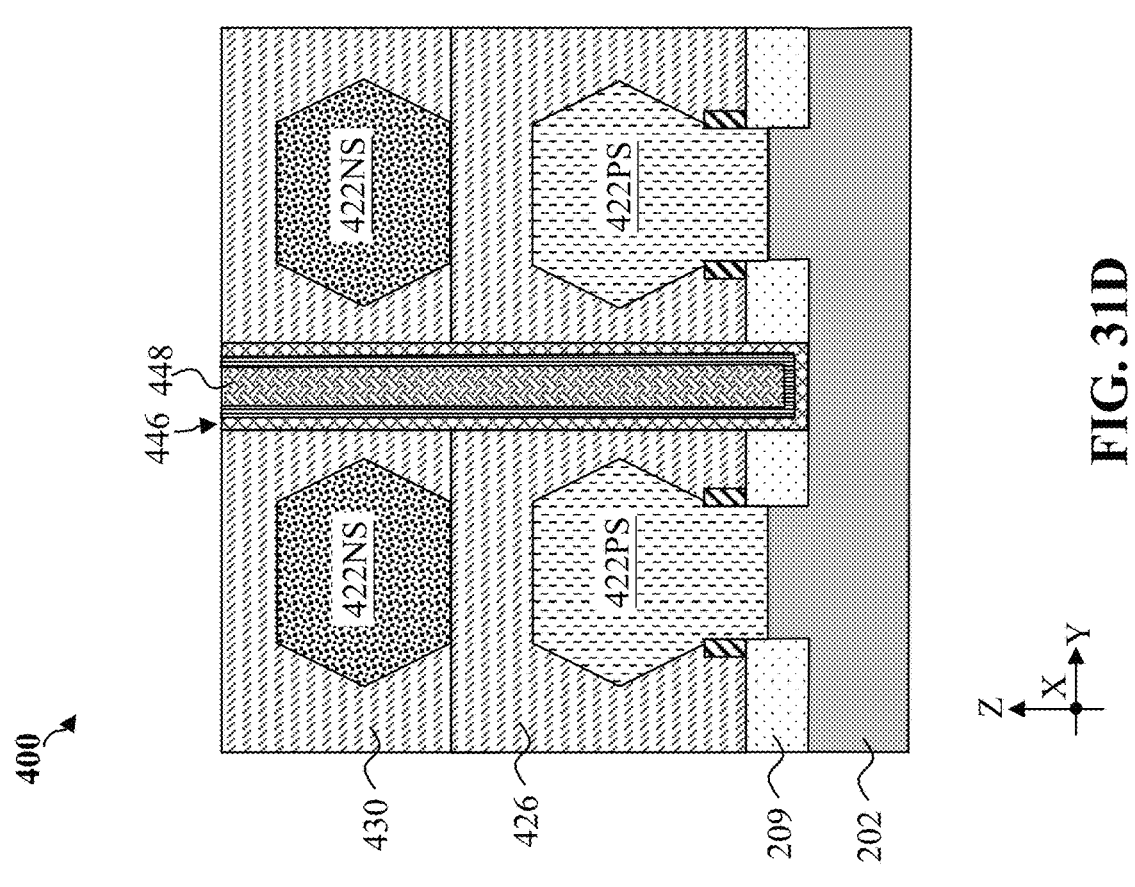
Figure 31C:
Figures 32A, 32B:
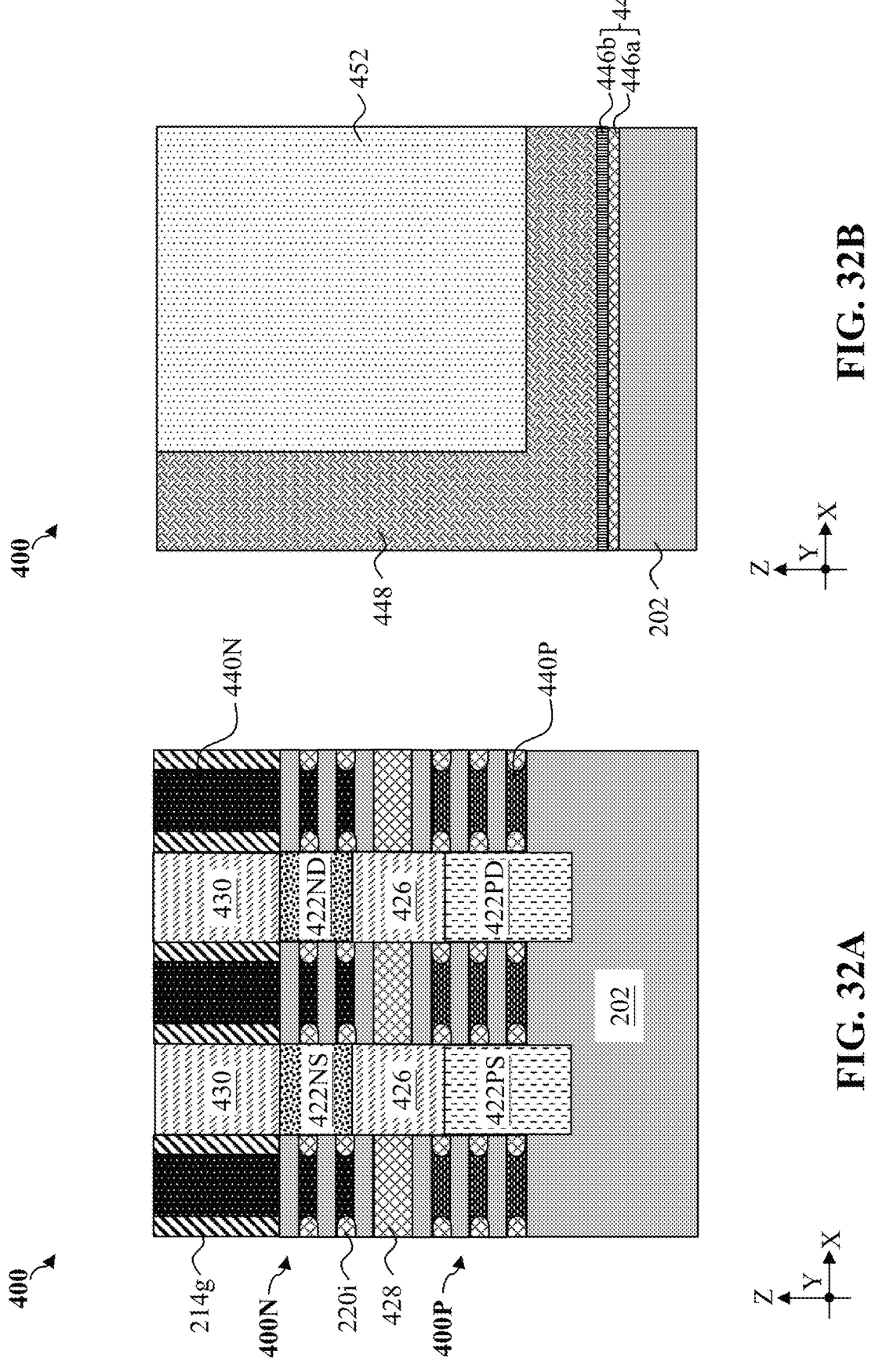
Figure 32D:
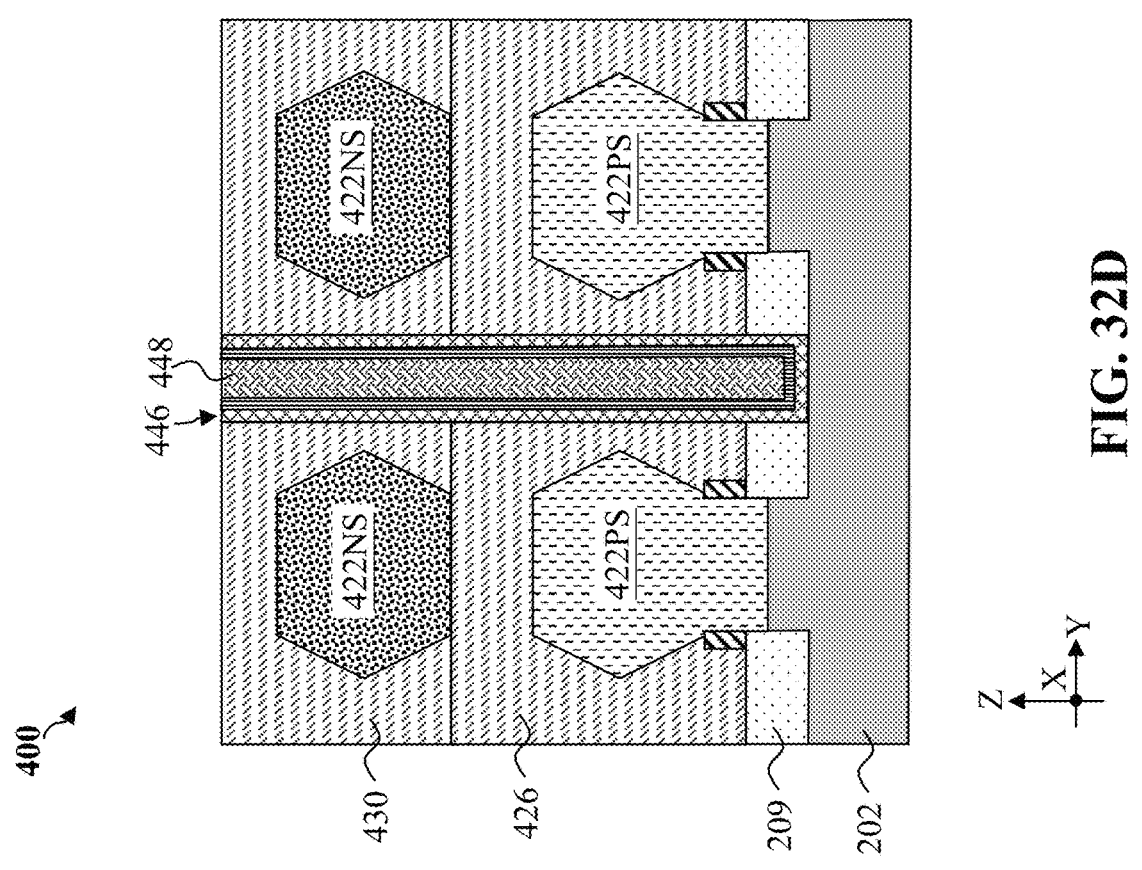
Figure 32C:

Referring to FIGS. 23, 27A-27D and 28A-28D, method 300 includes a block 304 where an etching process is performed to form a VLI trench 444 to separate each of the first and second gate structures of the CFET into pieces. Referring to FIGS. 27A-27D, a patterned mask film 442 is formed over the workpiece 400. The patterned mask film 442 covers the source feature 422NS, the drain feature 422ND, and a portion of the gate structure 440N. Referring to FIGS. 28A-28D, while using the patterned mask film 442 as an etch mask, an etching process is performed to the workpiece 400 to form a VLI trench 444. In embodiments represented in FIG. 28A, the formation of the VLI trench 444 includes removing a portion of the gate structure 440N and a portion of the gate structure 440P that are not formed directly over the channel layers 208. As depicted in FIG. 28C, the VLI trench 444 exposes the gate structure 440N and the gate structure 440P. In embodiments represented in FIG. 28D, the VLI trench 444 also extends through the first dielectric structure 426 and the second dielectric structure 430, and extends into the isolation feature 209. In the present embodiment, the VLI trench 444 extends through the isolation feature 209 and exposes the substrate 202. The patterned mask film 442 may be selectively removed after the formation of the VLI trench 444.

Referring to FIGS. 23 and 29A-29D, method 300 includes a block 306 where a bi-layer dielectric liner 446 is formed in the VLI trench 444. The composition and formation of the bi-layer dielectric liner 446 may be similar to those of the bi-layer dielectric structure 214 described with reference to FIG. 4. For example, a first dielectric layer 446a that is formed of boron nitride (BN) is conformally deposited over the workpiece 400, and a second dielectric layer 446b formed of silicon nitride or silicon carbonitride may be then conformally and in-situ deposited over the first dielectric layer 446a. A planarization process (e.g., CMP) may be performed to remove portions of the bi-layer dielectric liner 446 that are not formed in the VLI trench 444. By forming the bi-layer dielectric liner 446, the to-be-formed conductive layer in the VLI trench 444 will be electrically isolated from the gate structures 440N and 440P. Due to similar reasons stated above with reference to FIGS. 4 and 5, providing the bi-layer dielectric liner 446 formed of boron nitride capped by a material (e.g., SiN, SiCN) that is free of oxygen and less easily to be oxidized may advantageously reduce parasitic capacitance of the final structure of the workpiece 400.

Referring to FIGS. 23 and 30A-30D, method 300 includes a block 308 where a conductive layer 448 is deposited to substantially fill the VLI trench 444. After the formation of the bi-layer dielectric liner 446, a conductive layer 448 is then deposited over the workpiece 400 using ALD, CVD, and/or other suitable methods. The conductive layer 448 may include aluminum, tungsten, nickel, titanium, ruthenium, cobalt, platinum, copper, other refractory metals, other suitable metal materials, or combinations thereof. Excess portions of the conductive layer 448 formed over the second dielectric structure 430 may be removed by a planarization (e.g., CMP) process.

Referring to FIGS. 23 and 31A-31D, method 300 includes a block 310 where an etching process is performed to recess the conductive layer 448 to form an opening 450, leaving a remaining portion of the conductive layer 448 in the VLI trench 444. A patterned mask film (not shown) may be formed over the conductive layer 448 to expose a portion of the conductive layer 448 that is disposed adjacent to the gate structures 440N and 440P and the drain feature 422ND. While using the patterned mask film as an etch mask, an etching process is performed to recess the conductive layer 448. In embodiments represented in FIG. 31B, to electrically couple the source feature 422NS and the drain feature 422PD, a shape of a cross-sectional view of the recessed conductive layer 448 includes an L shape. The patterned mask film may be selectively removed after the formation of the recessed conductive layer 448.

Referring to FIGS. 23 and 32A-32D, method 300 includes a block 312 where a dielectric layer 452 is formed in the opening 450. The dielectric layer 452 may include silicon oxide, silicon nitride, silicon carbide, silicon oxynitride, silicon oxycarbide, silicon carbonitride, a low-k dielectric material, other suitable materials, or combinations thereof, and may be deposited by CVD, PECVD, flowable CVD, PVD, ALD, other suitable methods, or combinations thereof.

In an embodiment, the dielectric layer 452 includes silicon oxide. In some other embodiments, the dielectric layer 452 may include boron nitride. Excess portions of the dielectric layer 452 formed over the gate structure 440N may be removed by a planarization (e.g., CMP) process. The dielectric liner 446, the conductive layer 448 and the dielectric layer 452 may be collectively referred to as a vertical local interconnect (VLI) structure.

Figures 33A, 33B:
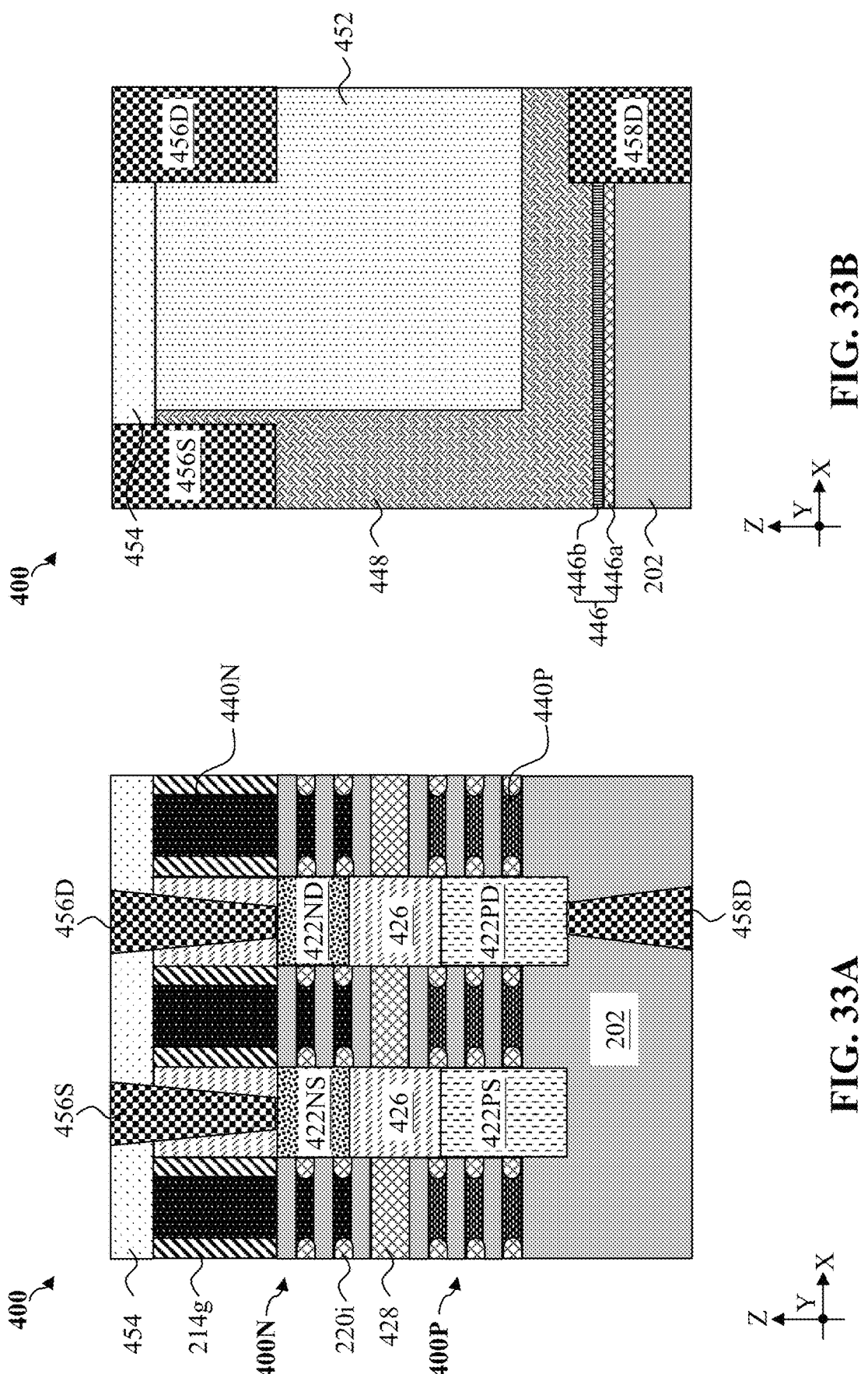
Figure 33D:
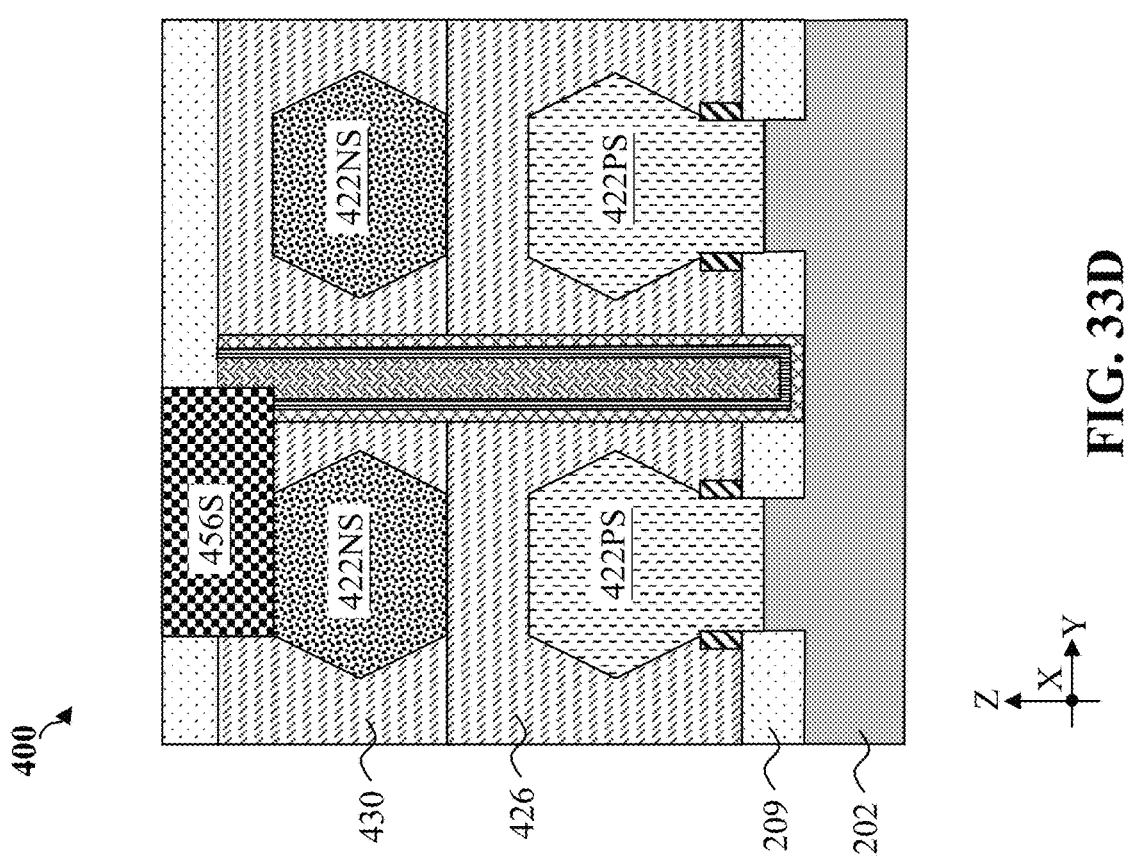
Figure 33C:
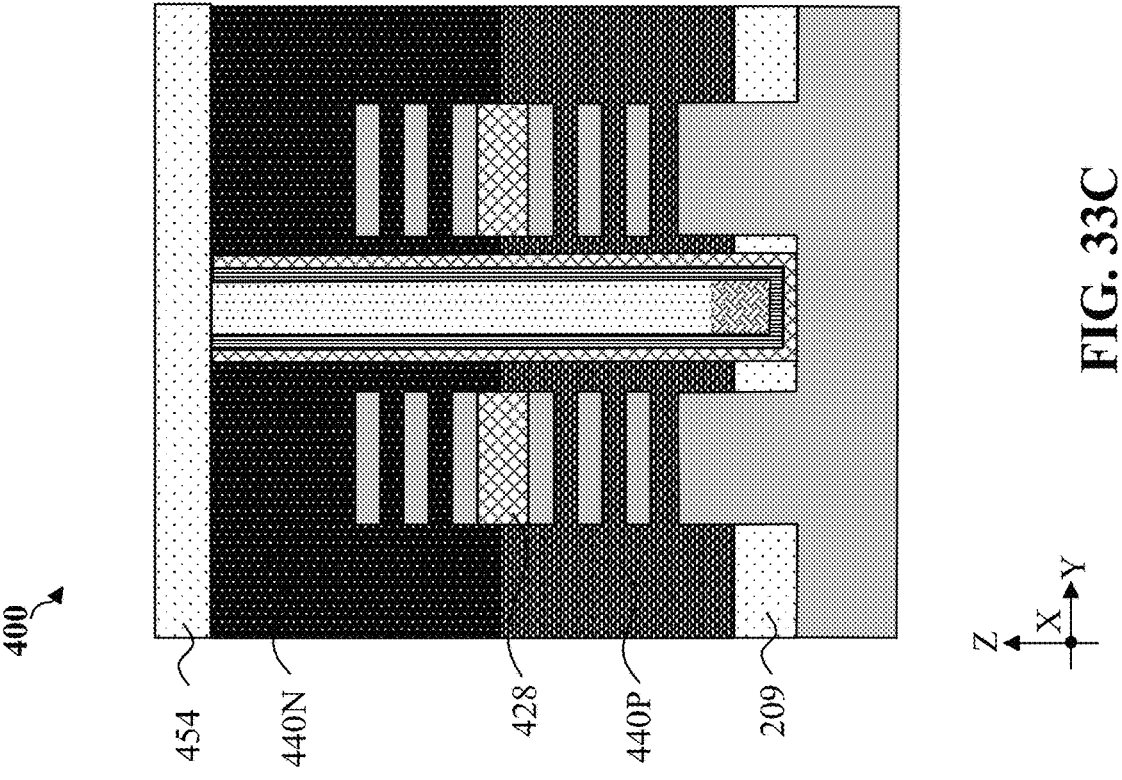
Figure 33E:
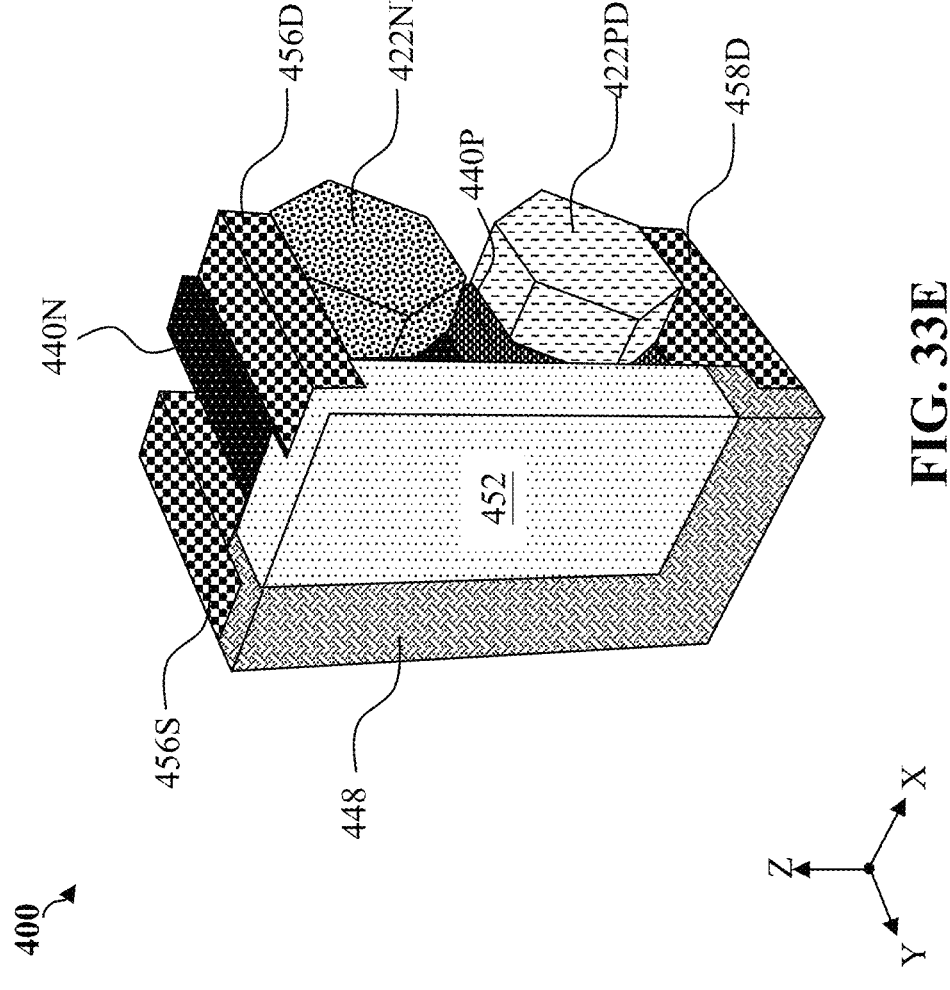
FIG. 33E illustrates a fragmentary perspective view of the exemplary workpiece shown in FIGS. 33A-33D, according to various aspects of the present disclosure.

Referring to FIGS. 23 and 33A-33E, method 300 includes a block 314 and a block 316 where metal contacts 456S, 456D and 458D are formed. FIG. 33E depicts a simplified fragmentary perspective view of the workpiece shown in FIGS. 33A-33D. The bi-layer dielectric liner 446 is omitted in FIG. 33E for reason of simplicity. In the present embodiments, after forming the vertical local interconnect structure in the VLI trench 444, metal contacts 456S and 456D are formed over the source feature 422NS and the drain feature 422ND. In an example process, an interlayer dielectric layer 454 is formed on the gate structure 440N. The composition and fabrication process for forming the interlayer dielectric layer 454 may be similar to those of the ILD layer 236. A patterned mask film (not shown) may be then formed over the interlayer dielectric layer 454 to expose portions of the interlayer dielectric layer 454 that are disposed directly over the source feature 422NS and the drain feature 422ND. An etching process is then followed to remove the interlayer dielectric layer 454 and the second dielectric structure 430 to form metal contact openings (not shown) exposing the source feature 422NS and the drain feature 422ND. A metal contact 456S and a metal contact 456D may be then formed in the metal contact openings, respectively. The metal contact 456S is electrically coupled to the source feature 422NS, and the metal contact 456D is electrically coupled to the drain feature 422ND. In an embodiment, before forming the metal contacts 456S and 456D, silicide layers (e.g., NiSi) are formed in the metal contact openings and on the source feature 422NS and the drain feature 422ND to reduce a parasitic resistance. In some embodiments, the metal contacts 456S and 456D may include ruthenium (Ru), cobalt (Co), tungsten (W), or molybdenum (Mo). Since the metal contacts 456S and 456D are formed over the top surface of the substrate 202, the metal contacts 456S and 456D may be referred to as frontside metal contacts 456S and 456D. As depicted in FIG. 33B, the frontside metal contact 456S also extends into and directly contacts the conductive layer 448 in the VLI structure, and the frontside metal contact 456D extends into the dielectric layer 452 in the VLI structure.

After forming the frontside metal contacts 456D and 456S, multi-layer interconnect (MLI) structure (not depicted) may be formed over the workpiece 400. In some embodiments, the MLI structure may include multiple inter-metal dielectric (IMD) layers and multiple metal lines or contact vias in each of the IMD layers. In some instances, the IMD layers and the ILD layer 236 may share similar composition. The metal lines and contact vias in each IMD layer may be formed of metal, such as aluminum, tungsten, ruthenium, or copper. In some embodiments, the metal lines and contact vias may be lined by a barrier layer to insulate the metal lines and contact vias from the IMD layers.

The workpiece 400 may be then flipped over and a metal contact 458D may be then formed to electrically couple to the drain feature 422PD via a silicide layer (not shown). As depicted in FIG. 33A, the metal contact 458D extends through the substrate 202 and disposed directly under the drain feature 422PD. In some embodiments, the metal contact 458D may be isolated from the substrate 202 by a dielectric liner. Since the metal contact 458D is formed under the bottom surface of the substrate 202, the metal contact 458D may be referred to as a backside metal contacts 458D. As depicted in FIG. 33B, the backside metal contacts 458D also extends into and directly contacts the conductive layer 448 in the VLI structure. Thus, by forming the VLI structure that includes the L-shape conductive layer 448, the drain feature 422PD of the P-type GAA transistor 400P may be electrically coupled to the source feature 422NS of the N-type GAA transistor 400N. By forming the VLI structure having the bi-layer dielectric liner 446, a parasitic capacitance of the workpiece 400 may be advantageously reduced. In an embodiment, the second dielectric layer 446b in the bi-layer dielectric liner 446 may be omitted.

Referring to FIG. 23, method 300 includes a block 318 where further processes are performed. Such further processes may include forming a backside power rail (not depicted) under the substrate 202. While not shown, the backside power rail may be embedded in an insulation layer. The backside power rail may include a barrier layer and a metal fill layer. In some embodiments, the barrier layer in the backside power rail may include titanium nitride, tantalum nitride, cobalt nitride, nickel nitride, or tungsten nitride and the metal fill layer in the backside power rail may include titanium, ruthenium, copper, nickel, cobalt, tungsten, tantalum, or molybdenum. The barrier layer and the metal fill layer may be deposited using PVD, CVD, ALD, or electroless plating. A planarization process, such as a CMP process, may be performed to remove excess materials.

Although not intended to be limiting, one or more embodiments of the present disclosure provide many benefits to semiconductor structures and the formation thereof. In some embodiments, boron nitride that has a low-k dielectric layer and a high density is used during the fabrication of the semiconductor structures. By providing the low dielectric constant and high density, the semiconductor structures may provide a low parasitic capacitance while sustaining potential damages. In addition, instead of using silicon-based dielectric layer such as SiOCN, SiON, the implementation of boron nitride may increase diversity of dielectric materials suitable for fabricating semiconductor structures and thus increase flexibility of fabricating semiconductor structures in terms of etching processes and etching selectivity.

The present disclosure provides for many different embodiments. Semiconductor structures and methods of fabrication thereof are disclosed herein. In one exemplary aspect, the present disclosure is directed to a method. The method includes forming a dummy gate stack engaging a semiconductor fin over a substrate, conformally depositing a first dielectric layer over the substrate, conformally depositing a second dielectric layer over the first dielectric layer, etching back the first dielectric layer and the second dielectric layer to form a gate spacer extending along a sidewall surface of the dummy gate stack, the gate spacer comprising the first dielectric layer and the second dielectric layer, forming source/drain features in and over the semiconductor fin and adjacent the dummy gate stack, and replacing the dummy gate stack with a gate structure, where a dielectric constant of the first dielectric layer is less than a dielectric constant of silicon oxide, and the second dielectric layer is less easily to be oxidized than the first dielectric layer.

In some embodiments, a density of the first dielectric layer may be greater than 1.7 g/cm3. In some embodiments, each of the first dielectric layer and the second dielectric layer may include an oxygen-free dielectric material. In some embodiments, the first dielectric layer may include boron nitride having a hexagonal ring structure. In some embodiments, the method may also include, after the forming of the source/drain features, forming a bi-layer etch stop layer over the substrate, where the forming of the bi-layer etch stop layer may include depositing a first material layer over the substrate, and depositing a second material layer over the first material layer, wherein the first material layer comprises boron nitride, and the second material layer comprises silicon nitride or silicon carbonitride, depositing an interlayer dielectric layer over the bi-layer etch stop layer, and performing a planarization process until a top surface of the interlayer dielectric layer is coplanar with a top surface of a dummy gate electrode layer in the dummy gate stack. In some embodiments, the semiconductor fin is a first semiconductor fin and extends lengthwise along a first direction, the gate structure extends lengthwise along a second direction substantially perpendicular to the first direction and further engages a second semiconductor fin and a third semiconductor fin, where the method may also include forming a first trench and a second trench extending through the gate structure, wherein the first trench is disposed between the first semiconductor fin and the second semiconductor fin, and the second trench is disposed between the second semiconductor fin and the third semiconductor fin, depositing a first dielectric material layer in the first trench and the second trench, depositing a second dielectric material layer over the first dielectric material layer, depositing a third dielectric material layer over the second dielectric material layer to substantially fill remaining portions of the first trench and the second trench, and performing a planarization process to form a first isolation structure in the first trench and a second isolation structure in the second trench, where a dielectric constant of the first dielectric material layer is less than a dielectric constant of the third dielectric material layer, and the dielectric constant of the third dielectric material layer is less than a dielectric constant of the second dielectric material layer. In some embodiments, the first semiconductor fin is spaced apart from the second semiconductor fin by a first isolation feature, and the second semiconductor fin is spaced apart from the third semiconductor fin by a second isolation feature, the first isolation structure extends into the first isolation feature, and the second isolation structure extends into the second isolation feature. In some embodiments, the method may also include, after the forming of the first isolation structure and the second isolation structure, selectively removing a portion of the gate structure engaging the second semiconductor fin to form a third trench, selectively removing a portion of the second semiconductor fin directly under the portion of the gate structure to extend the third trench, and forming a third isolation structure in the third trench. In some embodiments, the forming of the third isolation structure may include performing a first deposition process to conformally deposit a boron nitride layer, and performing a second deposition process to deposit a silicon nitride layer over the boron nitride layer, wherein the first deposition process and the second deposition process are performed in a same process chamber.

In another exemplary aspect, the present disclosure is directed to a method. The method includes receiving a workpiece comprising an active region over a substrate and comprising a plurality of channel layers interleaved by a plurality of sacrificial layers, the active region comprising a channel region and a source/drain region adjacent the channel region, and a dummy gate stack over the channel region, selectively recessing the source/drain region to form a source/drain opening exposing the plurality of sacrificial layers and the plurality of channel layers, selectively recessing the plurality of sacrificial layers to form inner spacer recesses, conformally depositing a first dielectric layer over the workpiece, conformally depositing a second dielectric layer over the first dielectric layer, etching back the first dielectric layer and the second dielectric layer to form inner spacer features in the inner spacer recesses, the inner spacer features comprising the first dielectric layer and the second dielectric layer, forming a source/drain feature in the source/drain opening, selectively removing the dummy gate stack, selectively removing the plurality of sacrificial layers, and forming a gate structure to wrap around each channel layer of the plurality of channel layers, where the first dielectric layer comprises a silicon-free low-k dielectric material, and the second dielectric layer comprises an oxygen-free dielectric material and is less easily to be oxidized than the first dielectric layer.

In some embodiments, a dielectric constant of the first dielectric layer is less than a dielectric constant of silicon oxide, and a dielectric constant of the second dielectric layer is greater than the dielectric constant of silicon oxide. In some embodiments, the first dielectric layer may include boron nitride, and the second dielectric layer comprises in-situ formed silicon nitride or in-situ formed silicon carbonitride. In some embodiments, the method may also include, after the forming of the source/drain feature, conformally depositing a first material layer over the workpiece, conformally depositing a second material layer over the first material layer, and depositing an interlayer dielectric layer over the second material layer, where the first material layer comprises a silicon-free and oxygen-free material, and the second material layer is less easily to be oxidized than the first material layer. In some embodiments, the workpiece may also include a gate spacer extending along a sidewall surface of the dummy gate stack, wherein the gate spacer may include boron nitride. In some embodiments, the method may also include forming a gate isolation structure to cut the gate structure into pieces, where the gate isolation structure may include a boron nitride liner. In some embodiments, the method may also include forming a dielectric gate extending into the substrate, wherein a bottom surface of the dielectric gate is lower than a bottom surface of the channel region, and where the dielectric gate may include boron nitride.

In yet another exemplary aspect, the present disclosure is directed to a semiconductor structure. The semiconductor structure includes a first transistor comprising a first vertical stack of channel members disposed over a substrate, a first gate structure wrapping around each channel member of the first vertical stack of channel members, a first source/drain feature coupled to the first vertical stack of channel members and adjacent the first gate structure, and a plurality of inner spacer features laterally disposed between the first source/drain feature and the first gate structure, where, each inner spacer feature of the plurality of inner spacer features includes a first dielectric layer and a second dielectric layer, the first dielectric layer comprises an oxygen-free low-k dielectric material, and the second dielectric layer is less easily to be oxidized than the first dielectric layer.

In some embodiments, the second dielectric layer may include silicon nitride or silicon carbonitride, the first dielectric layer may include boron nitride. In some embodiments, the semiconductor structure may also include a gate spacer extending along a sidewall surface of the first gate structure and in direct contact with a portion of the first vertical stack of channel members, where a composition of the gate spacer is the same as a composition of each inner spacer feature. In some embodiments, the semiconductor structure may also include a second transistor stacked over the first transistor and comprising a second source/drain feature, and in a perspective view, the second source/drain feature is electrically coupled to the first source/drain feature via an L-shape conductive feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a dummy gate stack engaging a semiconductor fin over a substrate;

conformally depositing a first dielectric layer over the substrate;

conformally depositing a second dielectric layer over the first dielectric layer;

etching back the first dielectric layer and the second dielectric layer to form a gate spacer extending along a sidewall surface of the dummy gate stack, the gate spacer comprising the first dielectric layer and the second dielectric layer;

forming source/drain features in and over the semiconductor fin and adjacent the dummy gate stack; and replacing the dummy gate stack with a gate structure, wherein a dielectric constant of the first dielectric layer is less than a dielectric constant of silicon oxide, and the second dielectric layer is less easily to be oxidized than the first dielectric layer.

2. The method of claim 1, wherein a density of the first dielectric layer is greater than 1.7 g/cm³.

3. The method of claim 1, wherein each of the first dielectric layer and the second dielectric layer comprises an oxygen-free dielectric material.

4. The method of claim 1, wherein the first dielectric layer comprises boron nitride having a hexagonal ring structure.

5. The method of claim 1, further comprising:

after the forming of the source/drain features, forming a bi-layer etch stop layer over the substrate, wherein the forming of the bi-layer etch stop layer comprises:

depositing a first material layer over the substrate, and depositing a second material layer over the first material layer, wherein the first material layer comprises boron nitride, and the second material layer comprises silicon nitride or silicon carbonitride, depositing an interlayer dielectric layer over the bi-layer etch stop layer; and performing a planarization process until a top surface of the interlayer dielectric layer is coplanar with a top surface of a dummy gate electrode layer in the dummy gate stack.

6. The method of claim 1, wherein the semiconductor fin is a first semiconductor fin and extends lengthwise along a first direction, the gate structure extends lengthwise along a second direction substantially perpendicular to the first direction and further engages a second semiconductor fin and a third semiconductor fin, wherein the method further comprises:

forming a first trench and a second trench extending through the gate structure, wherein the first trench is disposed between the first semiconductor fin and the second semiconductor fin, and the second trench is disposed between the second semiconductor fin and the third semiconductor fin;

depositing a first dielectric material layer in the first trench and the second trench;

depositing a second dielectric material layer over the first dielectric material layer;

depositing a third dielectric material layer over the second dielectric material layer to substantially fill remaining portions of the first trench and the second trench; and performing a planarization process to form a first isolation structure in the first trench and a second isolation structure in the second trench, wherein a dielectric constant of the first dielectric material layer is less than a dielectric constant of the third dielectric material layer, and the dielectric constant of the third dielectric material layer is less than a dielectric constant of the second dielectric material layer.

7. The method of claim 6, wherein the first semiconductor fin is spaced apart from the second semiconductor fin by a first isolation feature, and the second semiconductor fin is spaced apart from the third semiconductor fin by a second isolation feature, the first isolation structure extends into the first isolation feature, and the second isolation structure extends into the second isolation feature.

8. The method of claim 6, further comprising:

after the forming of the first isolation structure and the second isolation structure, selectively removing a portion of the gate structure engaging the second semiconductor fin to form a third trench;

selectively removing a portion of the second semiconductor fin directly under the portion of the gate structure to extend the third trench; and forming a third isolation structure in the third trench.

9. The method of claim 8, wherein the forming of the third isolation structure comprises:

performing a first deposition process to conformally deposit a boron nitride layer; and performing a second deposition process to deposit a silicon nitride layer over the boron nitride layer, wherein the first deposition process and the second deposition process are performed in a same process chamber.

10. A method, comprising:

receiving a workpiece comprising:

an active region over a substrate and comprising a plurality of channel layers interleaved by a plurality of sacrificial layers, the active region comprising a channel region and a source/drain region adjacent the channel region, and a dummy gate stack over the channel region;

selectively recessing the source/drain region to form a source/drain opening exposing the plurality of sacrificial layers and the plurality of channel layers;

selectively recessing the plurality of sacrificial layers to form inner spacer recesses;

conformally depositing a first dielectric layer over the workpiece;

conformally depositing a second dielectric layer over the first dielectric layer;

etching back the first dielectric layer and the second dielectric layer to form inner spacer features in the inner spacer recesses, the inner spacer features comprising the first dielectric layer and the second dielectric layer;

forming a source/drain feature in the source/drain opening;

selectively removing the dummy gate stack;

selectively removing the plurality of sacrificial layers; and forming a gate structure to wrap around each channel layer of the plurality of channel layers, wherein the first dielectric layer comprises a silicon-free low-k dielectric material, and the second dielectric layer comprises an oxygen-free dielectric material and is less easily to be oxidized than the first dielectric layer.

11. The method of claim 10, wherein a dielectric constant of the first dielectric layer is less than a dielectric constant of silicon oxide, and a dielectric constant of the second dielectric layer is greater than the dielectric constant of silicon oxide.

12. The method of claim 10, wherein the first dielectric layer comprises boron nitride, and the second dielectric layer comprises in-situ formed silicon nitride or in-situ formed silicon carbonitride.

13. The method of claim 10, further comprising:

after the forming of the source/drain feature, conformally depositing a first material layer over the workpiece;

conformally depositing a second material layer over the first material layer; and depositing an interlayer dielectric layer over the second material layer, wherein the first material layer comprises a silicon-free and oxygen-free material, and the second material layer is less easily to be oxidized than the first material layer.

14. The method of claim 10, wherein the workpiece further comprises a gate spacer extending along a sidewall surface of the dummy gate stack, wherein the gate spacer comprises boron nitride.

15. The method of claim 10, further comprising: forming a gate isolation structure to cut the gate structure into pieces, wherein the gate isolation structure comprises a boron nitride liner.

16. The method of claim 10, further comprising: forming a dielectric gate extending into the substrate, wherein a bottom surface of the dielectric gate is lower than a bottom surface of the channel region, and wherein the dielectric gate comprises boron nitride.

17. A semiconductor structure, comprising:

a first transistor comprising:

a first vertical stack of channel members disposed over a substrate;

a first gate structure wrapping around the first vertical stack of channel members;

a first source/drain feature coupled to the first vertical stack of channel members and adjacent the first gate structure;

a plurality of inner spacer features laterally disposed between the first source/drain feature and the first gate structure; and a gate spacer extending along a sidewall surface of the first gate structure and over the first vertical stack of channel members, wherein, each inner spacer feature of the plurality of inner spacer features comprises a first dielectric layer and a second dielectric layer, the first dielectric layer comprises boron nitride, and the second dielectric layer is less easily to be oxidized than the first dielectric layer.

18. The semiconductor structure of claim 17, wherein the second dielectric layer comprises silicon nitride or silicon carbonitride.

19. The semiconductor structure of claim 17, further comprising:

a second transistor stacked over the first transistor and comprising a second source/drain feature, wherein, in a perspective view, the second source/drain feature is electrically coupled to the first source/drain feature via an L-shape conductive feature.

20. The semiconductor structure of claim 17, further comprising:

a contact etch stop layer over the first source/drain feature and extending along the gate spacer; and an interlayer dielectric layer on the contact etch stop layer, wherein a composition of the contact etch stop layer is the same as a composition of the gate spacer.

* * * * *